US010326448B2

(12) United States Patent
Vassiliev

(10) Patent No.: US 10,326,448 B2
(45) Date of Patent: Jun. 18, 2019

(54) CODE PARTITIONING FOR THE ARRAY OF DEVICES

(71) Applicant: Scientific Concepts International Corporation, Plano, TX (US)

(72) Inventor: Andrei V. Vassiliev, Plano, TX (US)

(73) Assignee: Scientific Concepts International Corporation, Plano, TX (US)

( * ) Notice: Subject to any disclaimer, the term of this patent is extended or adjusted under 35 U.S.C. 154(b) by 0 days.

(21) Appl. No.: 15/608,764

(22) Filed: May 30, 2017

(65) Prior Publication Data

US 2017/0262567 A1 Sep. 14, 2017

Related U.S. Application Data

(63) Continuation-in-part of application No. 15/019,837, filed on Feb. 9, 2016, now Pat. No. 9,698,791, which
(Continued)

(51) Int. Cl.
*H03K 19/0175* (2006.01)
*H03K 19/177* (2006.01)
(Continued)

(52) U.S. Cl.
CPC ..... *H03K 19/0175* (2013.01); *G06F 17/5054* (2013.01); *H03K 19/1776* (2013.01);
(Continued)

(58) Field of Classification Search
None
See application file for complete search history.

(56) References Cited

U.S. PATENT DOCUMENTS 5,892,962 A 4/1999 Cloutier
6,292,939 B1 9/2001 Itou et al.
(Continued)

FOREIGN PATENT DOCUMENTS

CN 101989192 3/2011
JP H0573332 3/1993

OTHER PUBLICATIONS

Vivek Sarkar, Compile-time Partitioning and Scheduling of Parallel Programs, Article, SIGPLAN '86 Proceedings of the 1986 SIGPLAN symposium on Compiler Construction, Jul. 1986, pp. 17-26, vol. 21 Issue 7, New York, NY.
(Continued)

*Primary Examiner* — Jany Richardson
(74) *Attorney, Agent, or Firm* — Maschoff Brennan

(57) ABSTRACT

According to an aspect of an embodiment, a method of array source code partitioning and topology determination may include determining an optimum topology of an array of field programmable gate array (FPGA) devices based on a processing specification. The method may include automatically performing the best-effort partitioning on a default topology of the array of FPGA devices. The method may include partitioning parallel and serial source code among the FPGA devices mapped into optimum topology or the default topology. The method may include mapping a virtual topology onto a fixed physical topology of the array of FPGA devices. The method may include presenting computing resources of the array of FPGA devices to a host or to an entire application as a larger FPGA or as software-defined computing resources.

12 Claims, 27 Drawing Sheets

Related U.S. Application Data is a continuation-in-part of application No. 14/541,511, filed on Nov. 14, 2014, now Pat. No. 9,294,097.

(60) Provisional application No. 61/904,672, filed on Nov. 15, 2013, provisional application No. 61/925,030, filed on Jan. 8, 2014.

(51) Int. Cl.
*G06F 17/50* (2006.01)
*H04L 12/801* (2013.01)

(52) U.S. Cl.
CPC . *H03K 19/17704* (2013.01); *H03K 19/17736* (2013.01); *H04L 47/10* (2013.01)

(56) References Cited

U.S. PATENT DOCUMENTS

| | | | |
|---|---|---|---|
| 7,080,365 | B2 | 7/2006 | Broughton et al. |
| 7,568,085 | B2 | 7/2009 | Ramesh |
| 7,587,699 | B2 | 9/2009 | McCubbrey |
| 7,689,980 | B2 | 3/2010 | Du et al. |
| 7,757,222 | B2 | 7/2010 | Liao et al. |
| 8,296,746 | B2 | 10/2012 | Takayama et al. |
| 8,543,993 | B2 | 9/2013 | Yamashita |
| 8,595,712 | B2 | 11/2013 | Komatsu et al. |
| 8,612,732 | B2 | 12/2013 | Grover et al. |
| 8,799,880 | B2 | 8/2014 | Martinez Canedo et al. |
| 2006/0184350 | A1 | 8/2006 | Huang |
| 2011/0231616 | A1 | 9/2011 | Lin |
| 2014/0068581 | A1 | 3/2014 | Chen et al. |
| 2015/0180782 | A1* | 6/2015 | Rimmer ............... H04L 69/22 370/236 |
| 2016/0127267 | A1* | 5/2016 | Kumar ............... H04L 49/252 370/400 |

OTHER PUBLICATIONS

J.B. Peterson, Scheduling and Partitioning ANSI-C Programs Onto Multi-FPGA CCM Architectures, FPGAs for Custom Computing Machines, Apr. 17, 1996, pp. 178-187, IEEE, Napa Valley, CA.

Mark Hachman, Microsoft, Baidu find speedier search results through specialized chips, PCWorld, Aug. 12, 2014, http://www.pcworld.com/article/2464260/microsoft-baidu-find-speedier-search-results-through-specialized-chips.html.

* cited by examiner

US 10,326,448 B2

CODE PARTITIONING FOR THE ARRAY OF DEVICES

CROSS REFERENCE TO RELATED PATENT APPLICATIONS

This patent application claims priority to and the benefit of U.S. patent application Ser. No. 15/019,837, which claim priority and the benefit of Ser. No. 14/541,511, now U.S. Pat. No. 9,294,097, which claims priority to U.S. Provisional Applications Nos. 61/904,672 and 61/925,030. The disclosures in these applications are incorporated herein by reference in their entireties.

FIELD

The embodiments discussed herein are generally related to device array topology configuration and source code partitioning for the device arrays. In particular, some embodiments related to array topology configuration for arrays of field programmable gate array (FPGA) devices and source code partitioning for arrays of FPGA devices.

BACKGROUND

Heterogeneous computing and parallel code acceleration has been advancing for general purpose processors (GPPs), graphical processing units (GPUs), digital signal processors (DSPs), and field programmable gate array (FPGA) devices. These advances in heterogeneous computing and parallel code acceleration have led to development in parallel software languages such as OpenCL and CUDA. Some of the parallel software languages (e.g., OpenCL) are portable across one or more acceleration platforms while other (e.g., CUDA) are proprietary a type of GPUs. In addition, high level synthesis (HLS) for FPGA devices has advanced to enable creation of accelerated computing systems from C/C++ code. However, heterogeneous computing and parallel code acceleration is limited by hardware implementation in which such computing is performed.

The subject matter claimed herein is not limited to embodiments that solve any disadvantages or that operate only in environments such as those described above. Rather, this background is only provided to illustrate one example technology area where some embodiments described herein may be practiced.

SUMMARY

According to an aspect of an embodiment, a method of array source code partitioning and topology determination may include determining an optimum topology of an array of field programmable gate array (FPGA) devices based on a processing specification. The method may include automatically performing the best-effort partitioning on a default topology of the array of FPGA devices. The method may include partitioning parallel and serial source code among the FPGA devices mapped into optimum topology or the default topology. The method may include mapping a virtual topology onto a fixed physical topology of the array of FPGA devices. The method may include presenting computing resources of the array of FPGA devices to a host or to an entire application as a larger FPGA or as software-defined computing resources.

The object and advantages of the embodiments will be realized and achieved at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which.

DESCRIPTION OF EMBODIMENTS

Figure 1:
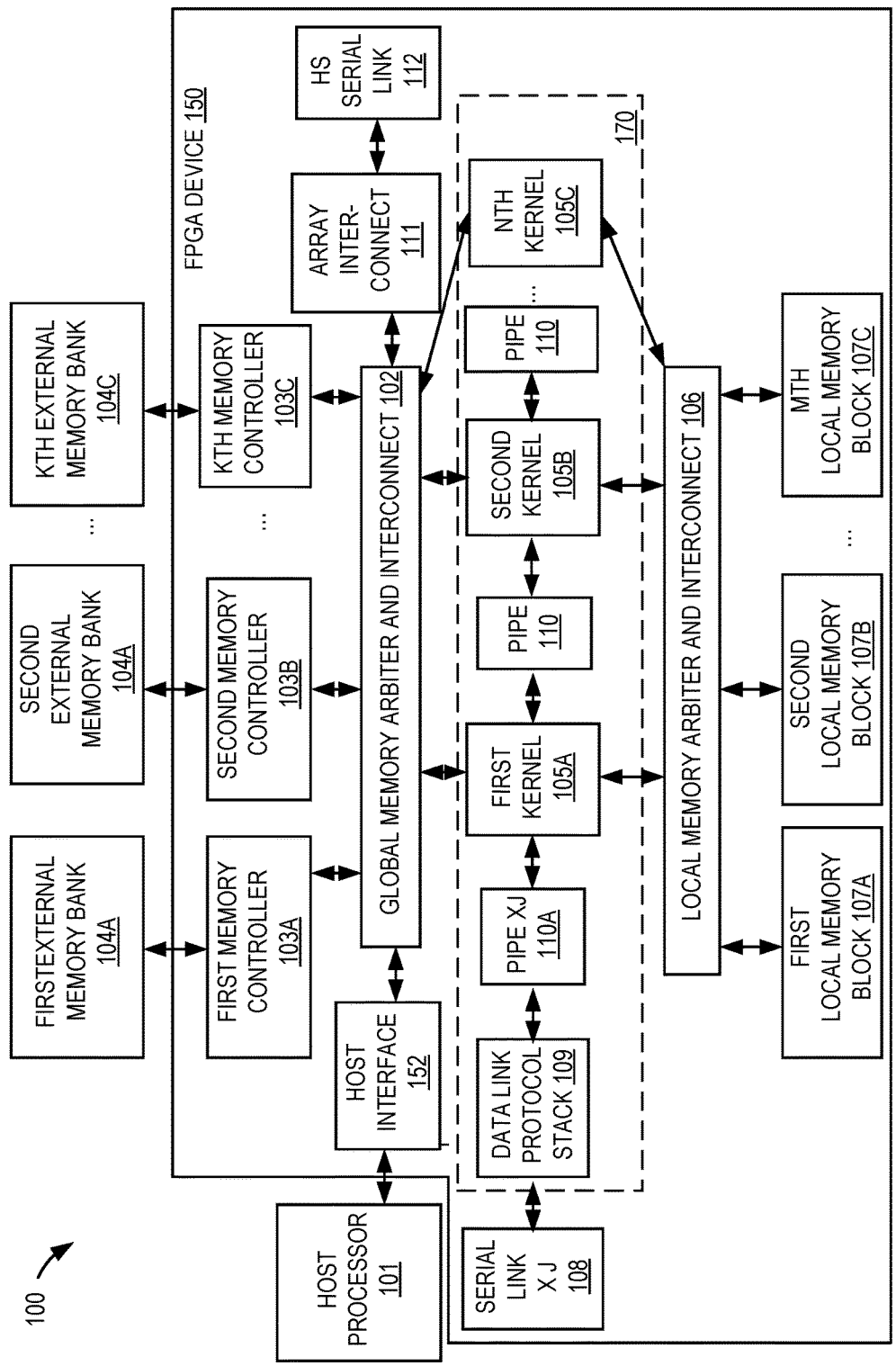
FIG. 1 illustrates an example field programmable gate array (FPGA) device that may be implemented in heterogeneous computing system (system)

Heterogeneous systems are generally limited to a single field programmable gate array (FPGA) device. Although multiple parallel programs or kernels may be executing inside the FPGA device, which may provide significant acceleration comparable to a graphical processing unit (GPU), the performance of the heterogeneous system may be limited by a size of programmable logic fabric and finite dedicated resources of the single FPGA device. The limited performance of the single FPGA device may be undesirable for development of solutions to parallel tasks and applications that involve larger memory and faster parallel execution. Programmable logic devices such as FPGA devices are inherently free from the size limitations that may be present in semiconductor devices.

A GPU-based system can include several GPU units. However, these GPU units are generally connected by a proprietary scalable link interface (SLI) or a CrossFire interconnect. These GPU-based systems may be also limited by a maximum number of GPUs as determined by a vendor. The maximum number of GPUs may not be increased.

Accordingly, some embodiments described herein include multiple programmable logic devices such as FPGA devices (hereinafter "member devices" or "FPGA devices") implemented in heterogeneous computing systems. The heterogeneous computing systems may include, for instance, arrays of the devices. The arrays may include two-dimensional, three-dimensional, n-dimensional, or other array topologies such as cluster topologies. The arrays may include additional logic and an interconnect between the devices. The additional logic and the interconnect may expand global memory of each of the devices and maintain a unified address memory space or a unified kernel global memory address space for the array. The arrays may be configured according to a parallel programming task.

In some embodiments, the global memory address space may be expanded for a host processor that interfaces with the array. Accordingly, the array may operate with a shared virtual memory that includes external memory banks and/or local memory blocks of one or more the FPGA devices in the array.

A source code may be partitioned for parallel execution by the array. In some embodiments, a topology determining and source code partitioning module (topology/partitioning module) is implemented to partition the source code. The topology/partitioning module may include a code-in code-out type module that may be configured to convert a single code segment or original kernel code into a multiple code segments or segmented kernels to be executed by the individual member devices of the array. One or more of the code segments or the segmented kernels may then be compiled into a hardware circuit by a single device flow. In some embodiments, compiling the code segments or the segmented kernels may be accomplished as described in Desh Singh et al, Tutorial: Harnessing the Power of FPGA Using Altera's OpenCL Compiler, Altera, 2013 and Altera SDK for OpenCL Programming Guide, OCL002-13.1.0, 2013.11.04.

Some embodiments disclosed herein related to a tool that enables design of the arrays described above. The array may be designed based on one or more processing specifications and an optimal partitioning of a source code among member devices that may be included in the array.

In some embodiments, the topology/partitioning module may optimize a number of work items and a number of compute units for a particular source code. Using the optimized number of work items and/or compute units, an array configuration may be formulated. Specifically, the number of work items and a number of compute units may be optimized to maximize resource utilization of each device of the array. The topology/partitioning module may include an autonomous mode and an interactive mode with graphical user interface (GUI). These and other embodiments are described with reference to the appended drawings.

FIG. 1 illustrates an example FPGA device 150 that may be implemented in a heterogeneous computing system (system) 100. The system 100 generally includes the FPGA device 150, along with a host processor 101 and external memory banks 104A-104C (generally, external memory bank 104 or external memory banks 104). The FPGA device 150 may include a global memory arbiter and interconnect (global interconnect) 102. The global interconnect 102 may connect to a host interface 152, memory controllers 103A-103C (generally, memory controller 103 or memory controllers 103), and the array interconnect 111. Additionally, the FPGA device 150 may include a local memory arbiter and interconnect (local interconnect) 106. The local interconnect 106 may connect to local memory blocks 107A-107C (generally, local memory block 107 or local memory blocks 107).

The external memory banks 104 may be utilized during processes performed by or initiated by the host processor 101. Accordingly, the global interconnect 102 may enable the host processor 101 to access the external memory banks 104 via the host interface 152 and one or more memory controllers 103. Examples of the external memory banks 104 may include double data rate (DDR) memory banks, quad data rate (QDR) memory banks, or any other suitable memory bank.

The system 100 may execute a parallel portion of a source code, a portion of which is generally indicated by item number 170 and referred to as source code 170. Execution of the source code 170 may be performed by executing one or more kernels or groups of kernels 105A-105C (generally, kernel 105 or kernels 105) and/or one or more pipes 110A-110C (generally, pipe 110 or pipes 110). The kernels 105 may load data and store data to and from the external memory banks 104. Additionally, the kernels 105 may load data and store data to and from local memory blocks 107 via the local interconnect 106. The pipes 110 may be used to communicate data between the kernels 105. Additionally, the global interconnect 102 and the local interconnect 106 may have an arbitration logic that resolves the contentions during simultaneous access requests by the host processor 101, the kernels 105, and the array interconnect 111.

The array interconnect 111 and/or the high speed serial link 112 (in FIG. 1, HS serial links 112), enable access to external memory banks 104 and local memory blocks 107 of other FPGA devices and processes implemented by remote host processors. For example, in some embodiments, without the array interconnect 111 or high speed serial link 112, the FPGA device 150 may be limited to the local memory blocks 107 of the FPGA device 150. Additionally, the FPGA device 150 may be limited to processes implemented by or controlled by the host processor 101. The array interconnect 111 and/or the high speed serial link 112 may be configured to connect or communicative couple the FPGA device 150 to one or more other FPGA devices.

For example, the array interconnect 111 and/or the high speed serial link 112 may include one or more ports. The ports may connect the FPGA device 150 to one or more other FPGA devices or to cards with FPGA devices to form arrays, which may be capable of executing the source code 170. In some embodiments, the source code 170 may be segmented into the kernels 105. A portion of the kernels 105 segmented from the source code 170 including a first kernel 105A and a second kernel 105B may be implemented by the FPGA device 150, while other of the kernels 105 may be implemented by other FPGA devices in the array. Processing the kernels 105 in the FPGA device 150 may be performed using the local interconnect 106, the local memory blocks 107, the global interconnect 102, the external memory banks 104, or some combination thereof. Moreover, the first and second kernels 105A and 105B may be implemented using input data communicated from another member device in the array and/or may communicate output data resulting from execution of the first and second kernels 105 to the other member devices of the array.

The array interconnect 111 can be implemented using a global memory address expansion protocol. The global memory address expansion protocol may extend the physical global memory address of the FPGA device 150 into virtual or physical addresses of the entire array. This address translation may enable a unified address memory space for the array. In some embodiments, the array interconnect 111 can be implemented per specification of one or more standards, for example, Infiniband or a custom interconnect protocol.

The ports in the array interconnect 111 and/or the high speed serial link 112 may utilize electrical or optical serial connection. The optical serial connection may be useful for extending an array beyond a physical size of a card cage, equipment rack, data room, or beyond a single geographical location. The array interconnect 111 may have a broadcast capability to replicate the data from the host processor 101 or any individual FPGA device to some or all of the FPGA devices of the array. This capability may reduce latency of data exchange during initialization and normal operation.

In the depicted embodiment, the FPGA device 150 includes memory logic that further includes a first external memory bank 104A, a second external memory bank 104B, and a Kth external memory bank 104C. Similarly, the memory logic of the FPGA device 150 includes a first memory controller 103A, a second memory controller 103B, and a Kth memory controller 103C. Similarly still, the memory logic includes a first local memory block 107A, a second local memory block 107B, and an Mth local memory block 107C. Inclusion of the Kth and Mth component along with the ellipses is meant to indicate that the memory logic may include more than three external memory banks 104, more than three memory controllers 103, more than three local memory blocks 107, or some combination thereof. Additionally, in the depicted embodiment, the FPGA device 150 includes the array interconnect 111, the high-speed serial link 112, the global interconnect 102, the memory controllers 103, and the local interconnect 106 as separate components. In some embodiments, one or more of these components and/or functions attributed to these components may be combined into few components or may be separated into more individual components.

Figure 2:
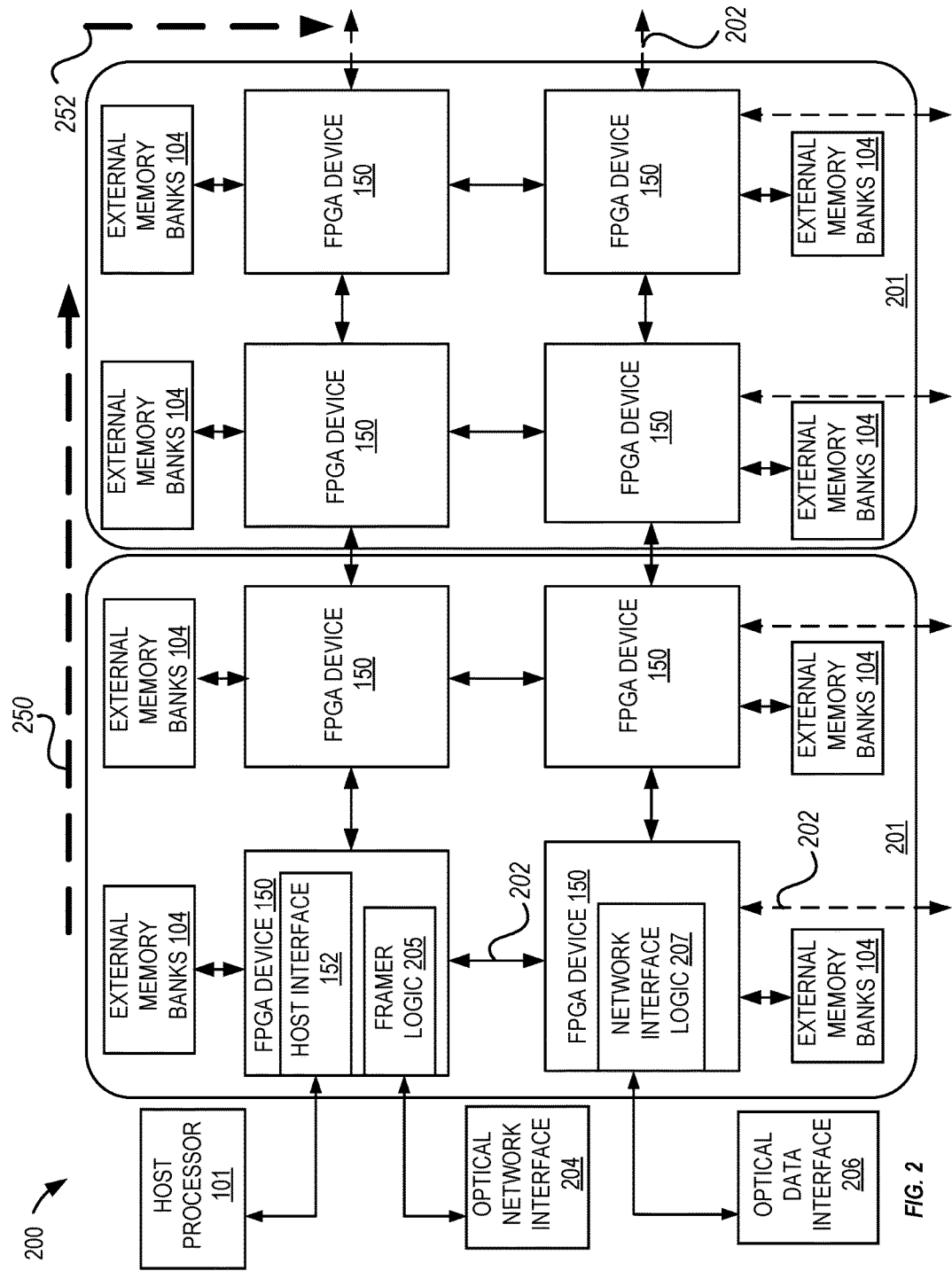
FIG. 2 illustrates an example array that includes one or more of the FPGA devices of FIG. 1.

FIG. 2 illustrates an example array 200 that may include one or more of the FPGA devices 150 of FIG. 1. The array 200 includes eight of the FPGA devices 150 discussed with reference to FIG. 1. The FPGA devices 150 are interconnected into a two-dimensional array include two rows and four columns. As used herein the convention [number row× number of columns] is used to describe two dimensional arrays. For example, the array 200 is a [2×4] array. The array 200 resides on two cards 201. Each of the cards 201 includes a [2×2] array of FPGA devices 150. The FPGA devices 150 may include ports 202. The ports 202 may be configured to expand global memory of each of the FPGA devices 150. Additionally, the ports 202 may be utilized to expand the array 200 by adding additional cards (e.g., card 201) having one or more FPGA devices.

In some embodiments, the array 200 may include more than eight or fewer than eight FPGA devices 150, which may be determined based on the data rates of computing elements of the source code, computational performance of the FPGA devices 150, the input/output (I/O) bandwidth of the FPGA devices 150. The array 200 may take other topologies and dimensions. Some details of these arrays are discussed with reference to FIGS. 7-10.

One or more of the FPGA devices 150 may include the host interface 152 to interface with the host processor 101. An example of the host interface 152 may include a peripheral component interconnect express (PCIe) endpoint logic or another suitable logic. In addition, one or more of the FPGA devices 150 may include framer logic 205. The framer logic 205 may be configured to interface with an optical transport network and/or an optical transport network interface 204 (in FIG. 2, "optical network interface 204"). An example of the framer logic 205 may include an optical transport network (OTN) framer and an associated Generic Framing Procedure (GFP) of a client signal such as user datagram protocol/transmission control protocol (UDP/TCP) stack for 1GE-100GE Ethernet. Additionally still, one or more of the FPGA devices 150 may include network interface logic 207 to interface with an optical data network interface 206 and associated forwarding data plane and control plane protocol such as OpenFlow. Other telecomm, data, storage interfaces such as Fiber Channel and custom communication protocols can have connections to the array 200 and/or one or more of the FPGA devices 150 included therein.

One or more of the FPGA devices 150 may be coupled to one or more of the external memory banks 104 as described with reference to FIG. 1. The external memory banks 104 may be allocated entirely or partially to a global memory, which may be addressable by a unified address memory space of the array 200. Having global memory interconnect reduces interface of the host processor 101 to the array 200. Accordingly, in some embodiments, only one of the FPGA devices 150 is connected to the host processor 101. In other embodiments more than one of the FPGA devices 150 may be connected to the host processor 101. In embodiments having multiple FPGA devices 150 connected to the host processor 101, multiple types of connections may be implemented between the FPGA devices 150 and the host processor 101 (e.g., PCIe and the like). Similarly, embodiments of the array 200 may include one or more of the FPGA devices 150 that may be connected to the optical network interface 204 and/or the optical data network interface 206 via multiple types of the connections.

In the array 200, one or more processes may occur sequentially. In addition the processes may occur in parallel. For example, in the example array 200 depicted in FIG. 2, a dataflow direction 250 may be a direction in which processes occur sequentially. In addition, one or more of the processes may occur in one or more parallel process directions 252. In the embodiment if FIG. 2, there is only one parallel process direction 252. However, arrays including larger dimensions may include multiple parallel process directions 252.

In some embodiments, the dataflow direction 250 is orthogonal to the parallel process direction 252. Such processing may have a dominant dataflow direction 250 in the array 200. Accordingly, partitioning of source code among the FPGA devices 150 may include multiple instructions among kernels, parallel execution by multiple kernels, kernel vectorization, generic loop unrolling with indexing, or some combination thereof in the dataflow direction 250 and/or the parallel process direction 252. In some embodiments, the vectorization of the source code may be performed in the dataflow direction 250. In the parallel process direction 252, generic loop unrolling with indexing may be performed during the partitioning. The indexing may correspond to individual packets, frames or to a simple kernel replication, for example.

Some examples of the processing with dominant data direction may include deep packet inspection, data search and information filtering algorithms at line rate. The data search algorithm may be executed by the FPGA device 150 on a real-time network traffic. The data search algorithm may be replicated by broadcasting it to one or more parallel kernels in the array 200. One or more data search patterns may be preloaded into the local or global memory (e.g., 107 and 104, respectively). Thus, a data search algorithm performed by the array 200 may be conducted substantially simultaneously for one or more data patterns. Such data search algorithm may be performed in parallel or sequential fashion on the live traffic as well as on recorded data collected from the live traffic at prior time.

Figure 3:
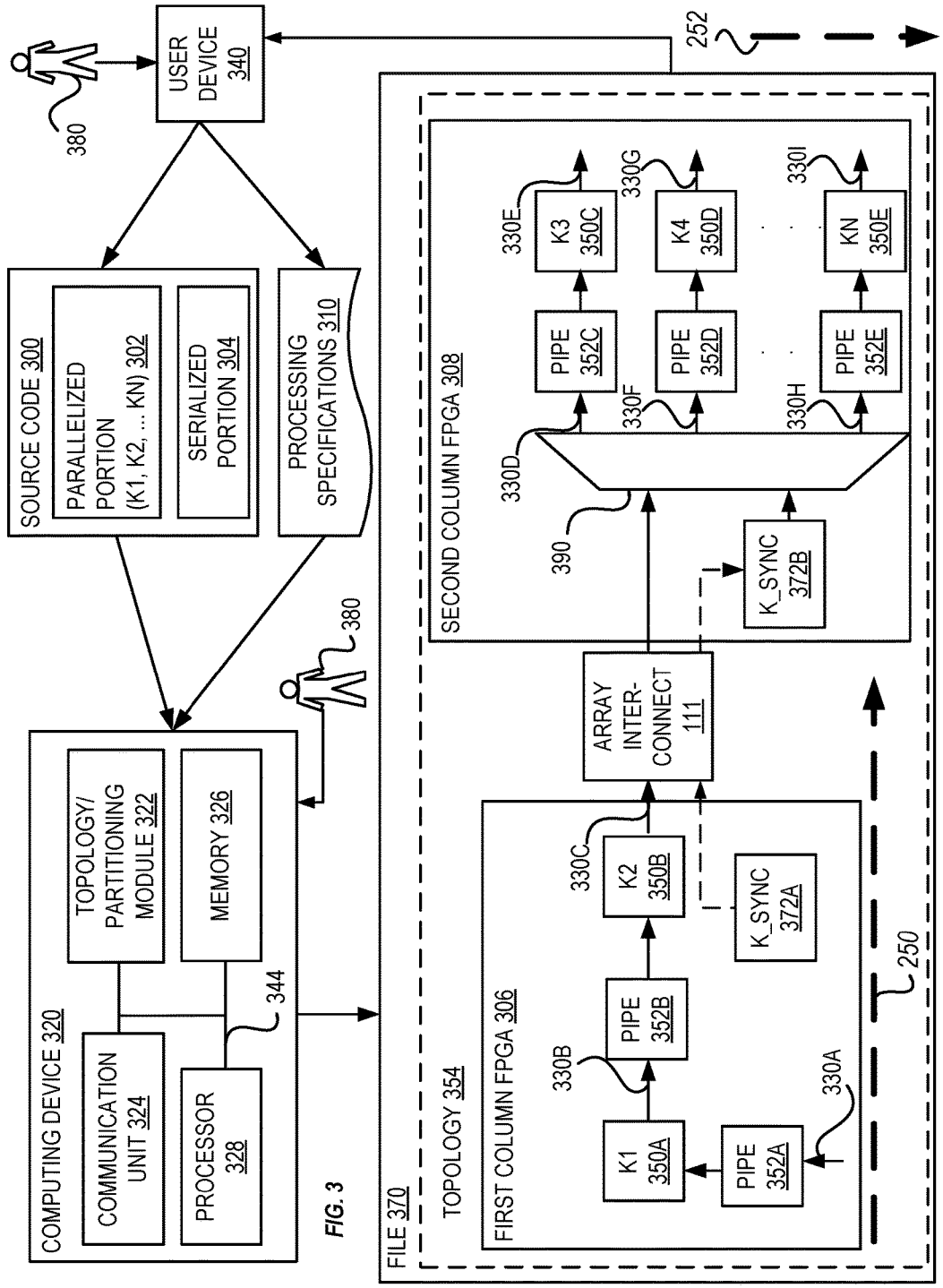
FIG. 3 is a block diagram of an example partitioning of a source code that may be implemented by a computing device.

FIG. 3 is a block diagram of an example partitioning of a source code 300 that may be implemented by a computing device 320. Partitioning the source code 300 may include a process by which parallelized portions 302 of the source code 300 are allocated to one or more FPGA devices 306 and 308 in an array topology 354 ("topology 354" in FIG. 3). For example, in the example shown in FIG. 3, the array topology 354 includes a first column FPGA device 306 and a second column FPGA device 308. The first column FPGA device 306 and the second column FPGA device 308 are collectively referred to as FPGA device 306/308. The FPGA devices 306/308 may be substantially similar to the FPGA device 150 discussed elsewhere herein. As depicted in FIG. 3, the first column FPGA device 306 may be coupled to the second column FPGA device 308 via the array interconnect 111. The coupling between the first column FPGA device 306 and the second column FPGA device 308 may enable data and memory transfers between the first column FPGA device 306 and the second column FPGA device 308 via the array interconnect 111. The first column FPGA device 306, the second column FPGA device 308, and the array interconnect 111 may be included in the array topology 354.

A topology/partitioning module 322 may receive as input the source code 300 and one or more processing specifications 310. The topology/partitioning module 322 may partition the source code 300 based on the processing specification 310. Additionally, the topology/partitioning module 322 may be configured to determine the array topology 354 that is configured to execute the source code 300 according to the partitioning and the processing specifications 310. Some examples of the processing specifications 310 may include a number of packets or frames per second arriving at a network node, a number of packets or frames leaving a network node, a number of parallel data storage interfaces that are concurrently active, an instantaneous bit-rate of a storage data stream, an aggregate amount of data per second at an input to the array and at the output of the array, and a speed at which an answer is required to be derived.

Additionally, the topology/partitioning module 322 may be configured to segment or re-segment the parallelized portion 302 of the source code 300. The segmenting the parallelized portion 302 may generate a computing element such as kernels 350A-350E (generally, kernel 350 or kernels 350, in FIG. 3, K1, K2, K3, K4 and KN). The kernels 350 may then may be executed by the FPGA devices 306/308. The topology/partitioning module 322 may also be configured to determine whether to include additional code between the kernels 350. For example, as depicted in FIG. 3, pipes 352A-352E (generally, a storage element such as FIFO or a register or a pipe 352 or pipes 352) may be added to provide communication of intermediate results between the kernels 350.

For example, the topology/partitioning module 322 may partition the kernels 350 among the FPGA device 306/308 in the array topology 354. However, in some circumstances, the array topology 354 cannot meet one or more processing specification. In these circumstances, the topology/partitioning module 322 may modify the array topology 354 by adding one or more FPGA devices 306/308, adding a row of FPGA devices 306/308, adding a column of FPGA devices 306/308, or otherwise modification to the array topology 354 such that the processing specification can be met. Additionally or alternatively, the topology/partitioning module 322 may segment the parallelized portion 302 into more kernels 350, which may help meet the processing specifications 310. Additionally or alternatively, the topology/partitioning module 322 may include one or more storage elements such as first in, first out (FIFOs) or pipes 352, which may help meet the processing specifications 310. Although only pipes 352 are depicted in FIG. 3, one or more of the pipes 352 may be substituted for or include one or more FIFOs.

The topology/partitioning module 322 may be configured to partition the source code 300 and determine the array topology 354 according to a maximum speedup factor. The maximum speedup factor may be based on optimization among data rates 330A-330H (generally, data rate 330 or data rates 330), computational capabilities of the FPGA devices 306/308, and I/O pipe bandwidth (330A and 330C but not 330B) in the FPGA devices 306/308. In FIG. 3, the data rates 330 are represented in by item numbers pointing to arrows connecting to pipes 352 and the kernels 350 that represent a dataflow direction.

The topology/partitioning module 322 may analyze the source code 300 to determine the data rates 330 as executed by the array topology 354 while taking into consideration computational performance and/or I/O pipe bandwidth of the FPGA devices 306/308. Based on the data rates 330, the computational performance of the FPGA devices 306/308, the I/O pipe bandwidth of the FPGA devices 306/308, or some combination thereof, the topology/partitioning module 322 may derive optimal utilization of the FPGA devices 306/308, whether to include the pipes 352, and whether to modify the array topology 354.

FIG. 3 depicts a partitioning of the source code 300. The source code 300 may include a computation sequence such as those found in the communication signal chains. The source code 300 may include the parallelized portion 302 and a serialized portion 304. The serialized portion 304 may be performed by a host processor such as the host processor 101 of FIG. 1. The topology/partitioning module 322 may segment the parallelized portion 302 into the kernels 350, which may be partitioned by the topology/partitioning module 322 to be executed by the FPGA devices 306/308.

The pipes 352 may be configured to control or decouple the data rate 330 between the kernels 350. In general, execution of the source code 300 and accordingly execution of one or more kernels 350 may involve exchange of input/output data samples or intermediate results from one kernel 350 to one or more subsequent kernels 350 and/or between the FPGA devices 306/308. The data rates 330 between the kernels 350 may vary. For example, a first kernel 350A may include a multiplication computation of two one-byte numbers. An intermediate result of the first kernel 350A may be a two-byte number, which may be input to a second kernel 350B. The second kernel 350B may include a same sampling frequency as the first kernel 350A, however the second kernel 350B may be receiving a number that is twice the length. Accordingly, a first pipe 352A and/or a second pipe 352B may be included to synchronize and/or buffer the data rates 330A and/or 330B of the first and second kernels 350A and 350B.

Storage element may be added between the kernels 350. For example, the storage element can be a memory location in a first in, first out (FIFO) or a digital flip-flop. In the depicted embodiment, the pipe 352 may be implemented as a FIFO, and may accordingly include multiple storage elements. In some embodiments, the storage elements may include similar components implemented between the kernels 350.

In the array topology 354, the pipes 352 are included prior to each of the kernels 350. The topology/partitioning module 322 may determine whether to include the pipes 352 based on the data rates 330, the computational performance of the FPGA devices 306/308, the I/O pipe bandwidth of the FPGA devices 306/308, or some combination thereof. Accordingly, in some embodiments, one or more kernels 350 may not be preceded by one of the pipes 350

The exchange of samples, data or intermediate results of computations between the FPGA devices 306/308 may be performed by the array interconnect 111. The array interconnect 111 may include a low latency and high-speed interconnect as well as dedicated dataflow interconnect. The array interconnect 111 may also be utilized by a global memory. In some embodiments, samples and intermediate results may have to have higher priority over global memory accesses. However, global memory access rate and expected dataflow rate are evaluated by topology/partitioning module 322 to make the decision whether to permit sharing of the interconnect 111 or to direct dataflow to the dedicated interconnect. The array interconnect 111 may be configured to have small footprint. Some additional details of an example array interconnect 111 are provided elsewhere herein.

One or more synchronization kernels (in FIG. 3, "K_sync") 372A and 372B (generally, synchronization kernel 372 or synchronization kernels 372) may be included in the array topology 354. In some embodiments, each of the first column FPGA device 306 and the second column FPGA device 308 may include one of the synchronization kernels 372A or 372B. One of the synchronization kernels 372A or 372B may include a slave synchronization kernel that may be configured to synchronize intermediate results between two or more of the kernels 350. Additionally, one of the synchronization kernels 372A or 372B may include a master synchronization kernel configured with synchronization information pertaining to the slave synchronization kernel and to further synchronize the slave synchronization kernel with the kernels 350 in the array topology 354.

For example, in the depicted embodiment, a first synchronization kernel 372A may be a master synchronization kernels and a second synchronization kernel 372B may be a slave synchronization kernels. Accordingly, the first synchronization kernel 372A may synchronize the second synchronization kernel 372B with the kernels 350.

The second synchronization kernel 372B may be configured to synchronize a multiplexer 390. For example, the second synchronization kernel 372B may synchronize the multiplexer 390 to coordinate received intermediate results from the second kernel 350B and/or the array interconnect 111 and control the data rates 330D, 330F, and 330H to a third kernel 350C through a Nth kernel 350E. The second synchronization kernel 372B may be aware of the changes to the upstream data rates (e.g., 330A-330C) and/or downstream data rates (e.g., 330D-330I) and may adjust the data rates 330D, 330F, and 330H accordingly.

The third through the Nth kernels 350C-350E may operate at one or more input data rates 330D, 330F, and 330H which may be slower than the input data rate. In some embodiments, one or more of the data rates 330D, 330F, and 330H may be substantially similar. For example, the data rates 330D, 330F, and 330H may be the data rate 330C divided by a number of kernels 350 downstream of the multiplexer 390 (e.g., in FIG. 3, 330C/n−2) and output one or more results at the data rates 330E, 330G and 330I that may be proportional to an input and an output with possible data format width increase (e.g. increase in precision).

In some embodiments, the data rates 330D, 330F, and 330H may be individualized for one or more of the kernels 350 downstream of the multiplexer 390. The third kernel 350C through the Nth kernel 350E may output a result of the parallelized portion 302 of the source code 300. Accordingly, the array topology 354 may have a predominant dataflow direction.

Throughout the array topology 354, various data rates 330 may exist. The data rates 330 may be based on the kernels 350 segmented from the parallelized portion 302. Thus, a total data rate of the source code 300 in the array topology 354 may be determined. If the total data rate is below a processing specification 310 indicating a particular processing specification 310, then the array topology 354 may be modified. For example a row of FPGA devices may be added or the FPGA devices 306/308 may be substituted for FPGA devices with higher I/O bandwidths.

Additionally, performance of the kernels 305 can be achieved by optimization of pipelining as well as utilizing local memory. Generally, having the kernels 350 operating in the FPGA devices 306/308 may reduce memory bottlenecks in proportion to an increase in available local memory of each of the FPGA devices 306/308.

In some circumstances, a maximum speedup factor of a fastest kernel may be limited by the computation capacity FPGA devices 306/308 and a maximum data rate 330 as partitioned in the array topology 354. When the maximum data rate 330 (not necessarily I/O data rate) exceeds maximum I/O pipe data rate, the results of these computations may not be exposed to the external I/O and instead utilize the wide internal data width of FPGA fabric.

In the depicted embodiment, the first column FPGA device 306 executes the first kernel 350A and the second kernel 350B. Additionally, the second column FPGA device 308 executes the remaining kernels 350C-350N. This partitioning is an example of straight forward spatial partitioning. Depending on the source code 300, the straight forward spatial partitioning may not be optimum. Accordingly, the topology/partitioning module 322 may be configured to explore if an additional speedup factor can be achieved if one or more of the kernels 350 (e.g. the second kernel 350B) can be segmented into additional kernels 350, which may be executed by the FPGA devices 306/308.

In some embodiments, the topology/partitioning module 322 may be configured to partition the source code 300 in larger array topologies. In these and other embodiments, partitioning the source code 300 may include the estimation of the data rates to derive optimum utilization of FPGA devices in the array per each application. Provided that partitioning is done effectively and interconnect bandwidth does not impose additional limits, the speedup factor of FPGA array can increase in proportion to the computation capacity of the entire FPGA array.

In FIG. 3, the computing device 320 may be controlled by a user 380. Additionally or alternatively, the user 380 may input the source code 300 and/or the processing specifications 310 to the computing device 320 via a user device 340. The array topology 354 and/or the partitioning based thereon may be presented to the user 380. For example, the array topology 354 and/or the partitioning based thereon may be presented on a display or via a user interface. In response the user 380 may modify the processing specifications 310 on which the array topology 354 is based or accept modifications to the array topologies 354 suggested by the topology/partitioning module 322 to achieve the processing specifications 310. In these embodiments, the topology/partitioning module 322 may operate as a tool that determines array topologies 354 specific for the source code 300 and the processing specifications 310. In these and other embodiments, the user 380 may periodically be presented with updates and/or provided with opportunities to override the array topology 354 suggested by the topology/partitioning module 322.

The user device 340 and/or the computing device 320 may include any computing device that includes a processor 328, memory 326, and network communication capabilities, which may include a communication unit 324. The processor 328, the memory 326, the communication unit 324 are only depicted in the computing device 320. In some embodiments, the processor 328, the memory 326, the communication unit 324 are included in the user device 340.

Some examples of the user device 340 and/or the computing device 320 may include a laptop computer, a desktop computer, and a tablet computer. Additionally or alternatively, in some embodiments the user device 340 and/or the computing device 320 may include a hardware server or portion thereof. In the user device 340 and/or the computing device 320 the topology/partitioning module 322, the processor 328, the memory 326, and the communication unit 324 may be communicatively coupled by a bus 344.

The processor 328 may include an arithmetic logic unit (ALU), a microprocessor, a general-purpose controller, or some other processor array to perform partition of the source code 300 and/or determination of the array topology 354. The processor 328 may be coupled to the bus 344 for communication with the other components (e.g., 322, 326, and 324). The processor 328 generally processes data signals and may include various computing architectures including a complex instruction set computer (CISC) architecture, a reduced instruction set computer (RISC) architecture, or an architecture implementing a combination of instruction sets. Multiple processors may be included in the computing device 320 and/or the user device 340. Other processors, operating systems, and physical configurations may be possible.

The memory 326 may be configured to store instructions and/or data that may be executed by the processor 328. The memory 326 may be coupled to the bus 344 for communication with the other components. The instructions and/or data may include code for performing the techniques or methods described herein. The memory 326 may include a DRAM device, an SRAM device, flash memory, or some other memory device. In some embodiments, the memory 326 also includes a non-volatile memory or similar permanent storage device and media including a hard disk drive, a floppy disk drive, a CD-ROM device, a DVD-ROM device, a DVD-RAM device, a DVD-RW device, a flash memory device, or some other mass storage device for storing information on a more permanent basis.

The communication unit 324 may be configured to transmit and receive data. The communication unit 324 may be coupled to the bus 344. In some embodiments, the communication unit 324 includes a port for direct physical connection to a communication network (e.g., the Intranet, a wide area network (WAN), a local area network (LAN), etc.) or to another communication channel. For example, the communication unit 324 may include a USB, CAT-5, or similar port for wired communication. In some embodiments, the communication unit 324 includes a wireless transceiver for exchanging data via communication channels using one or more wireless communication methods, including IEEE 802.11, IEEE 802.16, BLUETOOTH®, or another suitable wireless communication method. In some embodiments, the communication unit 324 includes a wired port and a wireless transceiver.

In some embodiments, to determine the array topology 354 an iterative process may be performed by the topology/partitioning module 322. For example, the topology/partitioning module 322 may determine a proposed topology (e.g., topology 354). The proposed topology may be based on a processing specification, the source code 300, an estimated dataflow rate, or some combination thereof.

The estimated dataflow rate may be based on a processing specification that may be input from a user. Additionally or alternatively, the estimated dataflow rate may be estimated by an input and output rate for a set of source code applications. The estimation of the dataflow rate (or maximum internal data rate) may continue through an entire chain of computations executed by FPGA devices.

For example, some source code applications such as computed tomography (CT) for medical imaging may include a specified data rate per second, which may not be deviated from. For instance, an examination of a patient in a doctor's office may involve processing of a real-time image pixels and a display of an image at twenty nine frames per second. This source code application may not back off from this dataflow rate for any reason. Accordingly, the proposed topology may be based on this dataflow rate.

Other source code applications may not include a strict dataflow rate. In these source code applications, a goal may be to complete the task or tasks as fast as possible, but there may not be a restriction as to how long the task may take. For example, such a source code application may include post processing of acquired or recorded CT images off-line with more detailed criteria than those processed during patient examination at the office. A goal may be to complete the thorough comparison and evaluation of the CT images to a reference disease database, but there is no restriction for how long the post processing and evaluation might take. For these applications a peak data rate may be optimized during the partitioning iterations to maximize usage of FPGA device computational resources, while having limits on the maximum input/output data rates determined by the specific FPGA devices, but not the user specification as in the case with real-time applications.

The topology/partitioning module 322 may then partition the source code 300 among the FPGA devices 306/308. The topology/partitioning module 322 may determine whether each of the FPGA devices 306/308 is capable of achieving the processing specification 310.

If not, the topology/partitioning module 322 may determine whether a neighboring FPGA device 306 or 308 has sufficient processing capability to accommodate a difference between the processing specification and a deficiency of the FPGA devices 306 or 308. If so, the topology/partitioning module 322 may perform load balancing the kernels 350 assigned to the FPGA devices 306/308 and determine whether the proposed topology achieves the processing specification following the load balancing.

In response to a determination that the FPGA devices 306/308 are capable of achieving the processing specification 310 and in response to a determination that the proposed topology achieves the processing specification 310, the topology/partitioning module 322 may present the proposed topology to the user 380. In response to a determination that the neighboring FPGA devices 306 or 308 have insufficient processing capability and/or in response to a determination that the proposed topology does not achieve the processing specification 310, the topology/partitioning module 322 may modify the proposed topology.

In some embodiments, after the array topology 354 is presented to the user 380, the topology/partitioning module 322 may receive user input sufficient to modify the processing specification 310. In response, the topology/partitioning module 322 may modify the array topology 354 based thereon and re-partition the source code 300 among FPGA devices 306/308 as arranged according to the modified array topology 354.

In some embodiments, to determine the array topology 354 the topology/partitioning module 322 may determine whether to include additional code such as the pipes 352, the synchronous kernels 372, and multiplexers 380 between the FPGA devices 306/308 and/or the kernels 350. If so, the topology/partitioning module 322 may generate additional code including the pipes 352, the synchronous kernels 372, and multiplexers 380.

As mentioned in reference to FIG. 2, the array topology 354 may include FPGA devices 306/308 arranged in the dataflow direction 250 in which data is processed and in the parallel process direction 252, which may be orthogonal to the dataflow direction 250. In these embodiments, to partition the source code 300, the topology/partitioning module 322 may read the source code 300 line-by-line and/or a processing specification. The topology/partitioning module 322 may define device logic applicable to the FPGA devices 306/308. The device logic may include one or more of a PCIe endpoint, an optical transport network (OTN) framer, a traffic manager, a user datagram protocol (UDP) stack, a transmission control protocol (TCP) stack, a packet forwarding protocol, and a frame forwarding protocol.

The topology/partitioning module 322 may partition the source code 300 in accordance with the array topology 354 as analyzed in the parallel process direction 252. The partitioning source code 300 as analyzed in the parallel process direction 252 may include parsing the source code 300 to identify iteration loops. Iteration loops may include "while" and "for" statements, for instance. The topology/partitioning module 322 may unroll the identified iteration loops. In response to there not being any iteration loops, a maximum number of parallel kernels (e.g., the third kernel 350C through the Nth kernel 350E) may be chosen based on a number of FPGA devices 306/308 in the parallel process direction 252 and a size of an address space of a memory expansion protocol implemented in the proposed topology 354. The partitioning parallel source code in accordance as analyzed in the parallel process direction 252 may further include replicating kernel hardware. For example, if computing units of the third through the Nth kernels 350C-350E have similar structures with different taps and coefficients at the same sampling rate, then the hardware reuse may be exploited via zero samples fill and coefficient overload techniques. Otherwise one or more of the third kernel 350C to the Nth kernel 350E may operate independently.

The topology/partitioning module 322 may vectorize one or more of the kernels 350. By vectorizing the one or more kernels 350 an optimal FPGA arrangement of the array topology 354 in the dataflow direction 252 based on a utilization of the resources of the FPGA devices 306/308. The vectorizing may include iterating a number of work items and iterating a number of compute units. In some embodiments, iterating the number of work items may include iterating a number "N" in a work item attribute: _attribute_((num_simd_work_itmes(N))), in which N represents a number that includes a value 1, 2, 4, 8, or 16. In some embodiments, iterating the number of compute units may include iterating a number M in a compute unit attribute: _attribute_((num_compute_units(M))), in which M represents an integer.

The topology/partitioning module 322 may determine whether resources of one or more of the FPGA devices 306/308 of the proposed topology 354 are utilized. The topology/partitioning module 322 may take into consideration already defined device logic in making such determination. If not, the topology/partitioning module 322 may reiterate (e.g., iterate again) the number of work items and/or the number of compute units. If so, the topology/partitioning module 322 may determine whether one or more of the kernels 350 are too large to be executed by one or more of the FPGA devices 306/308.

In response to the one or more of the FPGA devices 306/308 having a capability to process the kernel 350, the number of work items and/or the number of compute units for the kernels 350 may be included in the file 370. In response to the kernel 350 being too large, the topology/partitioning module 322 may split the kernel 350 into two or more segmented kernels 350.

The topology/partitioning module 322 may determine whether to include one or more storage elements to communicate data between the kernels 350. In response to a determination to include the storage element, the topology/partitioning module 322 may add the storage element to the proposed topology 354. In response to a determination not to include the storage element or a pipe, the topology/partitioning module 322 may reiterate the number of work items and/or the number of compute units.

The topology/partitioning module 322 may save or present the file 370. The file 370 may include an optimized kernel and a proposed topology file. The file 370 may include device array address indexing information utilized for modifications of a host processor code.

The partitioning of the source code 300 is described with respect to embodiment in which the source code 300 is formatted according to an OpenCL. In some embodiments, the source code 300 may be formatted in C or C++ and translated to OpenCL by the topology/partitioning module 322 or a third party translator. Additionally or alternatively, the C or C++ source code may be segmented and passed down to the FPGA devices 306/308 for HLS C/C++ or OpenCL FPGA flow. Additionally, one or more embodiments may be configured for execution and use of another parallel software language such as CUDA.

As mentioned above, to enable computing elements or kernels of the array 200 to be programmed with uniform address space of a global memory, the array interconnect 111 may be implemented. The array interconnect 111 may be configured with low latency of load and store accesses among the member devices 150 and to support multiple priorities for atomic accesses, burst accesses, streaming access and single or ordinary accesses (collectively, accesses). For example, some load and store accesses such as atomic access cannot be sub-divided and interleaved with other type of accesses (e.g., burst accesses, streaming access, and single). Others types of access may have low tolerance to latency or delay such as burst accesses or data streaming. Accordingly, the array interconnect 111 may be configured to appropriately control the accesses low latency and multiple priorities. Additionally, the array interconnect 111 may maintain load and store order and data synchronization and may not allow access or data loss. The array interconnect 111 may be configured with adaptive address resolution and routing and graceful congestion handling.

Figure 4:
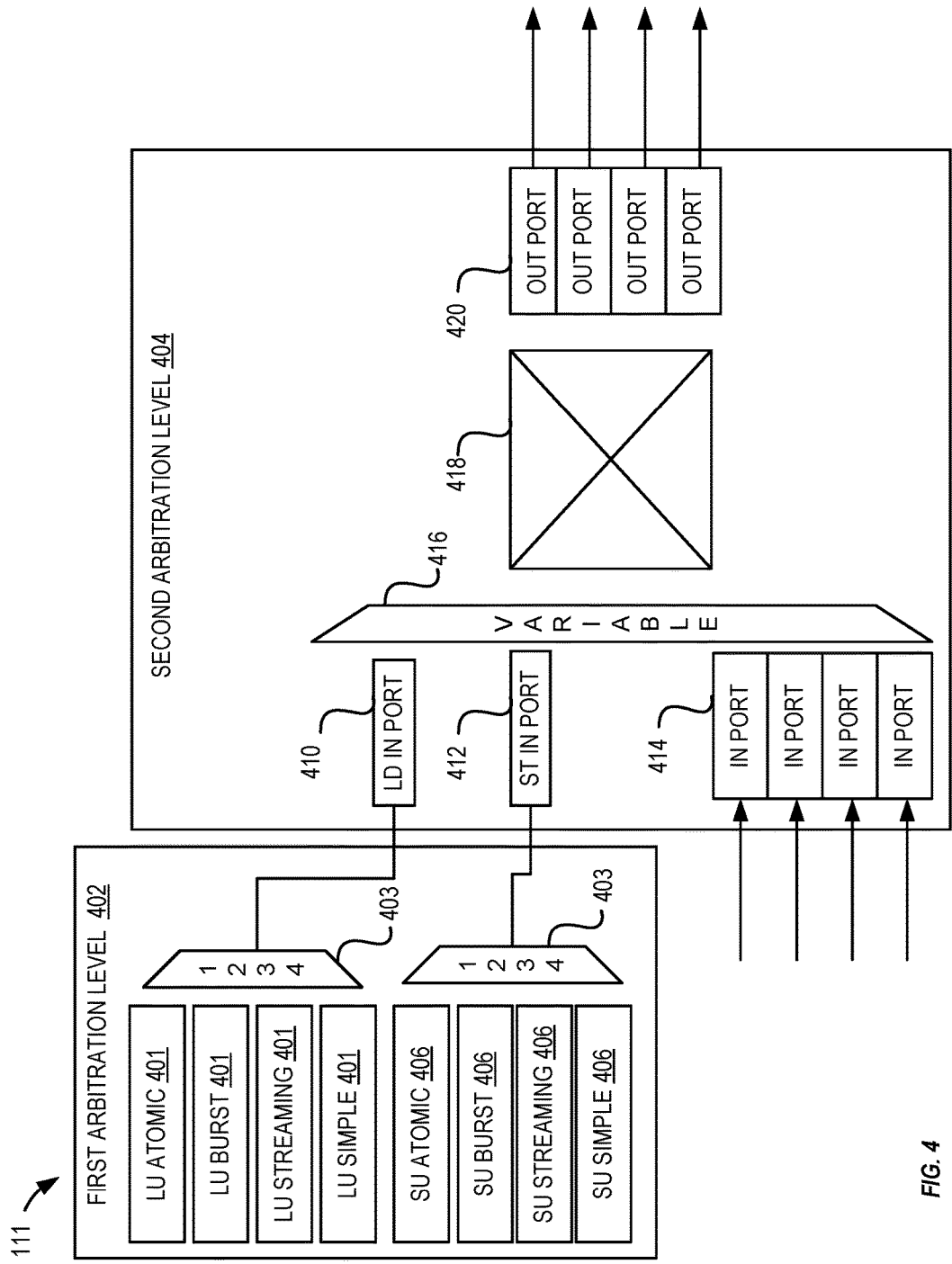
FIG. 4 illustrates an example array interconnect that may be implemented in the array of FIG. 2.

In general, a kernel may include requests to write (store) and/or read (load) data to and from local or global memory. Write requests and read requests may be handled by load and store units (LSU). The LSU may include load units 401 and store units 406. Each of the load units 401 and the store units 406 may include one or more access types. For example, in FIG. 4, the load units 401 and the store units 406 include atomic, burst, simple or single, and streaming.

Some implementations of LSUs, which may include implementations chosen by a device vendor, may rely on a commercial computer bus architecture. Some examples of the commercial computer bus architecture may include advanced microcontroller bus architecture (AMBA), AXI, or a proprietary Avalon architecture by Altera Corporation. The array interconnect 111 may interface with one or more of the commercial computer bus architectures. Additionally or alternatively, the commercial computer bus architectures may be isolated with a bus bridge, for instance.

The low latency may be controlled through selection of a granularity of the access. The granularity may be based directly on an amount of source data that an initiating LSU requires to send or receive across the array interconnect 111 to replicate the access by a remote LSU at a destination. The amount of source data is defined herein as a cell. By treating minimum load and store data as independent cells the array interconnect 111 may be scalable and efficient in terms of utilization of the FPGA resources.

The array interconnect 111 may support the following cell types: a store cell, a store burst, a store streaming cells, a load single initiator cell, a load single return data cell, a load burst, a load streaming cell initiator cell, a load return data cell, data cells, and an interconnect system cell. System cells may be utilized to exchange status and control information among the array interconnects as well as for access synchronization. The cells may bear payload. A non-payload bearing or idle cell may be transmitted during serial link idle times or between payload bearing cells. The non-payload bearing cells may be used to delineate cell boundaries, to maintain serial link integrity and to establish and to maintain alignment of the serial links. One or more cells may have port pair backpressure information such that local port congestion information may be distributed in the timeliest fashion globally among the member devices.

The cell size of load and store transactions may be different. A single load and store access may have a minimum cell size. The maximum cell size may be chosen to be the size of the largest single transaction. The maximum cell size may enable treatment of the burst access as just the burst of cells or streaming data as a stream of cells. The number of cells in the burst may be equal to a number of individual transactions of the burst. Additionally, the cell size may vary based on a particular implementation of the LSU and an associated bus architecture. The cell size may be selected for each implementation and the cell granularity may be maintained for each store and load access. Thus the cell size may be adjustable per each LSU implementation. Allowing adjustment of the size may reduce complexities and extra hardware and buffering in store and forward architectures and segmentation and reassembly functions that may lead to high latency.

The array interconnect 111 may be configured to prioritize atomicity of the accesses that cannot be interleaved with other accesses. Additionally, the array interconnect 111 may be configured to facilitate low latency for the accesses that have low latency tolerance. For example, the array interconnect 111 may include a fixed priority arbitration. The fixed priority arbitration may assign four priorities to LSU units 401 and 406 of based on type. Additionally, the array interconnect 111 may include a first arbitration level 402 and a second arbitration level 404.

In the first arbitration level 402, the load units 401 and the store units 406 of different access types may receive a priority assignment. The priority assignment may be based on the properties of the access type. For example, the priority assignment may be based on atomicity, divisibility, and tolerance to latency and delay. In the depicted embodiment, the LSUs including an atomic access (e.g., the LU atomic 401 and the SU atomic 406 in FIG. 4) receive a highest priority of 1, the LSUs including a burst access (e.g., the LU burst 401 and the SU burst 406 in FIG. 4) receive a priority of 2, the LSUs including a streaming access (e.g., the LU streaming 401 and the SU streaming 406 in FIG. 4) receive a priority of 3, and the LSUs including a simple access (e.g., the LU streaming 401 and the SU streaming 406 in FIG. 4) receive a lowest priority of 4.

The array interconnect 111 may include one or more arbiters 403. The arbiters 403 may be configured to arbitrate the load units 401 and the store units 406 based at least partially on the priority assignments. The accesses may be arbitrated by the arbiters 403 in parallel. By arbitrating the accesses in parallel, access initiators may not be starved and access time dependencies may not be introduced. Additionally, arbitrating the accesses in parallel may allow initiating load unit 401 to include a burst access (LU burst 401) and a store unit to include a burst access (SU burst 406) on every clock cycle.

After the LSUs are arbitrated, the access data associated with the LSUs becomes a cell. The priority information may be carried in the cell. Each of the cells are substantially equivalent to any other of the cell of the array interconnect 111. The cells may then enter the second arbitration level 404.

The second arbitration level 404 may include a local load in port 410 (in FIG. 4, "LD in Port 410"), a local store in port 412 (in FIG. 4, "ST in Port 412"), and a global in port 414. The local load in port 410 and the local store in port 412 may receive the cells from the arbiters 403. The global in port 414 may receive cells from other member devices in an array implementing the array interconnect 111.

Additionally, the second arbitration level 404 may include a second level arbiter 416, a switch 418, and an output port 420. In the array each FPGA may have shared resources, which may include the switch 418 and the output port 420. The output port 420 may pass cells to one or more other member devices of the array or another array interconnect that may be substantially similar to the array interconnect 111. In some embodiments, one second level arbiter 416 may be included for each output port 420. The number of input and output ports and arbiters may be dependent on a number of array dimensions. For example, a two-dimensional array may include an interconnect having four ports and a three-dimensional array may include an interconnect having six ports.

In a forward direction, one or more of the cells may arrive to one of the input ports 410, 412, or 414. To pass traffic through to the member device of an array and/or the array interconnect, the shared resources are arbitrated by the second level arbiters 416 that have variable priority assignments per each arriving cell. The cells carry priority information in its header upon which the arbitration of the second level arbiters 416 is based. Moreover, the cells may be similarly arbitrated at the one or more other array interconnects in the array. Thus, a priority of the data path through the array interconnect 111 and any other array interconnect in the array may be maintained. Additionally, the array interconnect 111 may enable scalability of the arrays. In some embodiments, buffering resources by the input port 414 and the switch 418 may be distributed equally among member devices of the array, which may enable each array interconnect 111 to use a smallest possible size of the FPGA resources determined by the number of LSU units 401 and 406, the input ports 414, and the output ports 420.

The array interconnect 111 may be expanded to arrays of larger topologies. For example, the array interconnect 111 may be expanded to support arrays of three dimensions and larger dimensions. Moreover, the interconnect topologies supported by the array interconnect 111 are not limited to the symmetrical arrays. The arrays can be clustered into a larger interconnect networks where each cluster can have larger dimensions array or dense mesh interconnect to facilitate local computations with fewer inter-cluster interconnect links. The inter-cluster interconnect links can encapsulate cells into higher level protocols such and OTN or Ethernet.

Figure 5:
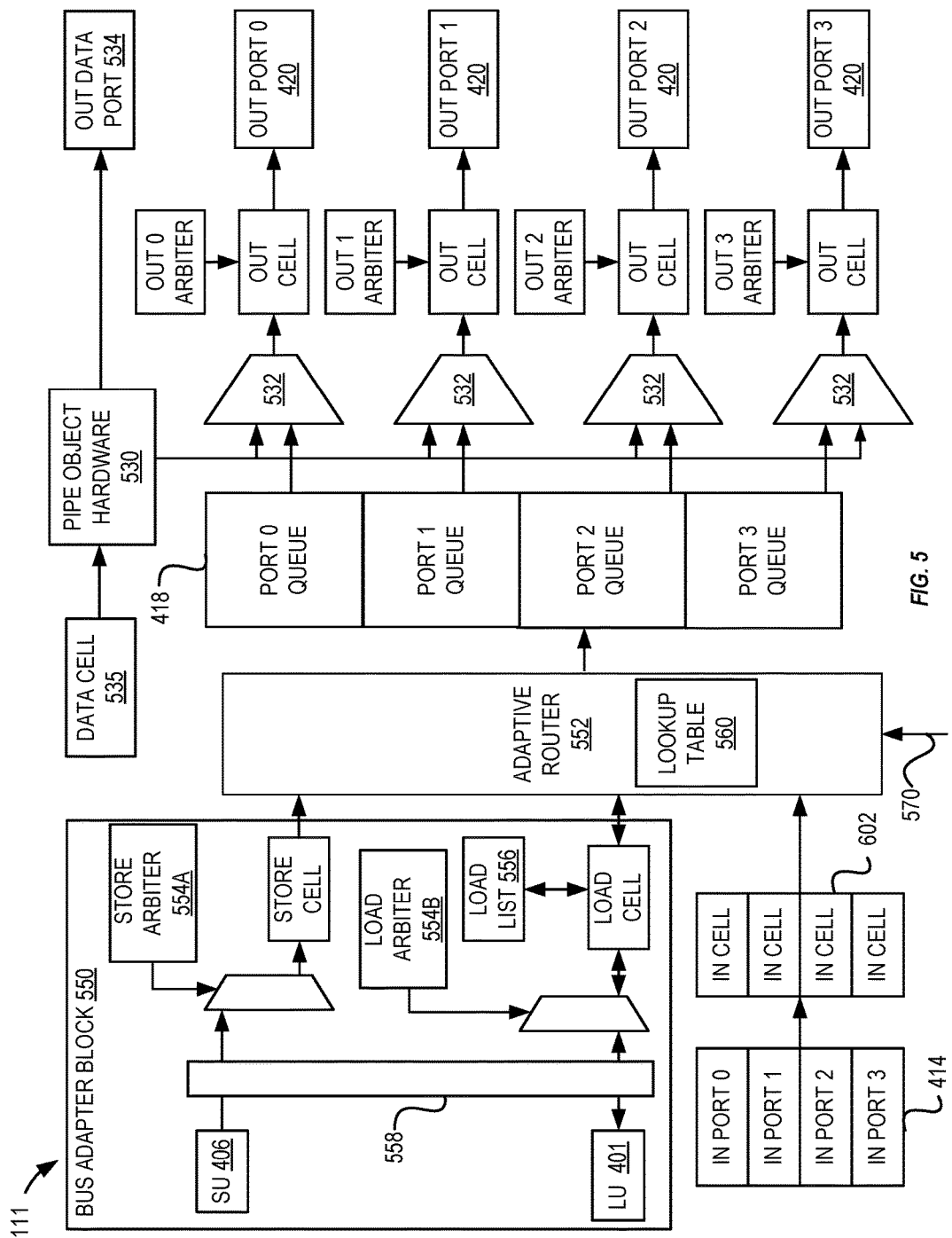
FIG. 5 illustrates a detailed depiction of the array interconnect of FIG. 4.

FIG. 5 includes a detailed view of the array interconnect 111. The array interconnect 111 in FIG. 5 is depicted in a forward data path. Additionally, the array interconnect 111 of FIG. 5 is representative of an implementation in a [4×4] array. FIG. 5 depicts an example of how decisions about destination of the cells may be performed to provide a uniform global memory address space.

The array interconnect 111 may include a bus adapter block 550. The bus adapter block 550 may represent logic involved in isolation of specifics of a LSU bus protocol from the rest of the array interconnect 111. The bus adaptor block 550 may include the store units 450, the load units 410, a load arbiter 554B, a store arbiter 554A, an address monitor and decode logic 558, and a load list 556.

The address monitor and decode logic 558 may be configured to determine whether the LSU access falls within the address range of the local FPGA global memory or a global memory of another member device of an array implementing the array interconnect 111. In some embodiments, only the sizes of the cells are affected by a particular LSU address and data bus sizing.

In circumstances in which the address range is within a global memory of another member device, the load and store accesses may be captured into optional store cell and load cell storage stages. After arbitration by the load arbiter 554B or the store arbiter 554A, the load and store accesses may be directed to the store and load input switch ports (e.g., the load in port 410 of FIG. 1 or the store in port 412). The load arbiter 554B and the store arbiter 554A may operate in parallel.

The store access may be a one-way transaction without a return data. The load access may be a bidirectional access split into a forward cell and a return cell. The forward load cells may be arbitrated similar to the store cell. However, to track the active and pending load accesses, the load list 556 may be maintained. One or more array interconnects 111 in one or more FPGA devices of the array may include a load list 556 to track active and pending load accesses. The load list 556 may be cleared upon arrival of the return of a load access cells.

The global memory address may be mapped into a path though the array interconnects 111. For example, an adaptive router 552 may map the path through the array interconnect 111. Additionally, the adaptive router 552 may direct an incoming cell (in FIG. 5, "In Cell") to one of the output ports 420.

The mapping may be accomplished via a lookup table 560. In the lookup table 560, numbers associated with the output ports 420 may be stored per range of the global address space. The lookup table 560 may be an efficient and a fast way to implement routing function with a minimum of FPGA hardware resources.

The adaptive router 552 may reduce local and global congested paths. For example, in a two-dimensional array with four adjacent nodes, there are 2 short and 2 long output paths, which may be chosen for each incoming cell. If one of the short paths is congested another short path may be chosen by the adaptive router 552. If both short paths are congested, then adaptive router 552 may decide between one of the long paths or postpone transmission by some number of interconnect cycles.

The interconnect cycle may be determined by the fastest rate of a serial link and the maximum parallel data path bus. For example the link 12.5 Gigabits per second (Gbps)/64-bits parallel bus may include an interconnect cycle that is 195.3125 megahertz (MHz). The interconnect cycle may be one of the input/output port hardware constraints of the topology/partitioning module 322 of FIG. 3.

The decision between one of the long paths and postponing the transmission may be based on the past history of the output port. For example, if the history for a particular number of past interconnect cycles indicate that there are no gaps or only a small number of gaps less than a configurable maximum congestion factor threshold (THR MAX), then the long path may be chosen. Additionally, a warning congestion counter may be incremented. However, if the past access history indicates that the congestion factor is less than minimum congestion factor threshold (THR MIN), then a decision may be to postpone transmission by one interconnect cycle. The shortest path choice may be made on a next interconnect cycle. The warning congestion counters as well as two congestion thresholds may be maintained per each of the output ports 420.

Histories of the output ports 420 incorporate global congestion history into the decision making at the array interconnect 111. In an array, the exchange patterns and global congestion patterns may stabilize over time, which may result in simpler computations. The THR MIN and THR MAX and the congestion counters may be provided for real-time control of the congestion patterns for more complex accelerated computations. The warning counters and congestions thresholds may be adapted to each accelerated application and unique cell exchange pattern therein. Therefore, the flexible and adaptive routing scheme enables maximum utilization of array interconnect 111 with minimum impact to computational performance of the entire array.

The adaptive router 552 will also determine if arriving cells are destined for the local FPGA device and it will direct these cells to the local LSU bus masters for replication of the accesses. Some additional details of this circumstance are provided with reference to FIG. 6.

The switch 418 may include n×2 buffers. The buffers may be configured to sustain accesses from all n input ports at every clock cycle. The buffers are not assigned per port. Instead, the buffers may be shared among n input ports and two store and load input ports.

In this architecture, there may be n+2 input ports and n output ports. Accordingly, congestions may be possible. A backpressure mechanism (not shown) may be included to throttle back load and store accesses. The backpressure mechanism may originate at each output port 420 and may propagate in the direction opposite to a direction of the cells. Together with backpressure and sequence numbers, input port storage and switch buffering (discussed elsewhere herein) may not allow data loss and may provide congestion handling. For example, because the input port accesses may have already incurred delay, the choice to throttle back store and load accesses may be driven by the goal of maintaining order and sequencing of the load and store accesses. Additionally, each cell may carry sequence numbers in data bits that are shared with burst count. The sequence numbers may be checked by local master, which replicates access. Additionally, missing cells may be fragged as errors.

The array interconnect 111 may include pipe objects hardware 530. The pipe objects hardware 530 may be configured to generate data cells 535. The data cells 535 may exchange information among the member devices and/or array interconnects included therein. The data cells 535 may be an input to the pipe objects hardware 530 that include a unidirectional transfer of the data cell 535 from a source FPGA device to a destination FPGA device. The data cells 535 may be communicated to the output ports 420 through the one or more multiplexers 532 or a data output port 534, which may be dedicated to the data cells 535. Whether the data cells 535 are communicated via the output ports 420 or the data output port 534 may be based on a data rate. For relatively low data rates, the output ports 420 may be used and for relatively high data rate the data output port 534 may be used.

Figure 6:
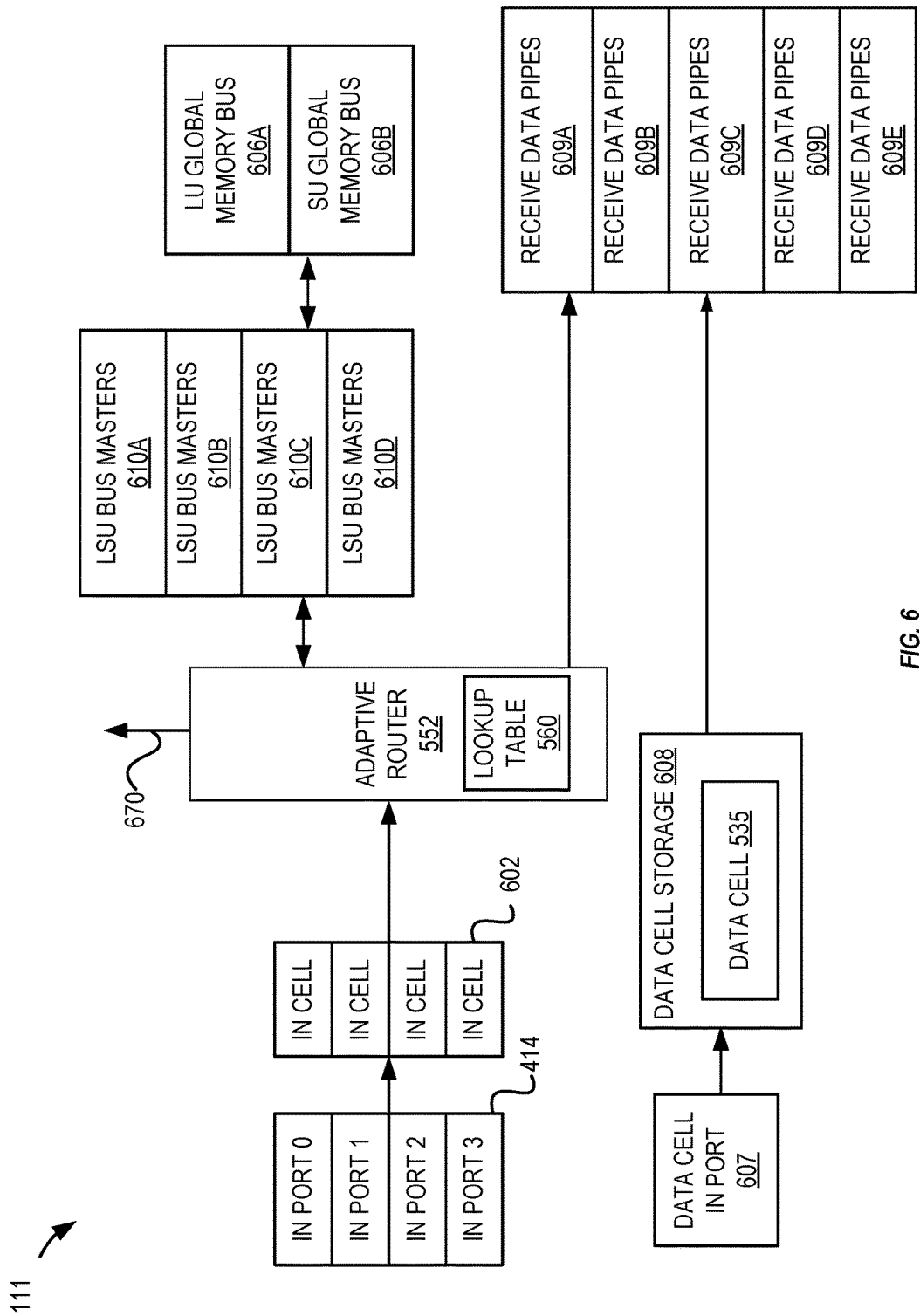
FIG. 6 illustrates another detailed depiction of the array interconnect of FIG. 4.

FIG. 6 includes another detailed view of the array interconnect 111. The array interconnect 111 in FIG. 6 is depicted in a return direction. One or more arriving cells 602 from the input ports 414 may be destined for an FPGA device implementing the array interconnect 111, referred to as the local FPGA device. Accordingly, the adaptor router 552 may receive and route the arriving cells 602 to one or more load and store unit bus masters 610A-610D (generally, LSU bus master 610 or LSU bus masters 610). The LSU bus masters 610 may be configured to finalize accesses on a load unit global bus and a store unit global bus 606A and 606B respectively.

A number of LSU bus masters 610 may be equivalent to a number of the in ports 414. The LSU bus masters 610 may be configured to operate in parallel such that the in cells 602 are not waiting for an available LSU bus master 610. Additionally, a number of LSU global memory buses 606 may be equivalent to the number of the in ports 414.

With combined reference to FIGS. 5 and 6, if one or more of the arriving cells 602 is a load cell with return data from remote load access, the arriving cell 602 is directed to the bus adapter bock 550 via arrow 670. These arriving cells 602 may clear an active entry in the load list 556. The LSU bus master 610 may also return load data to an initiating remote load unit. In this circumstance, the load data cell may be routed to the switch 418 and to one of the output ports 420 via the adaptive router 552 as shown by arrow 570 of FIG. 5. In case of the store access cells, the LSU bus masters 610 may perform a write access on one or more of the global memory buses 606. Additionally, in some embodiments, a first LSU global memory bus 606A may be for load units and a second global memory bus 606B may be for store units.

Referring back to FIG. 6, the data cells 535 may arrive from the in ports 414 (e.g., as an arriving cell 602) as well as from a dedicated input data port 607 (generally, input data port 607 or input data ports 607). The adaptive router 552 may direct the data cells 535 to a hardware implementing one or more receive data pipes 609A-609E (generally, receive data pipes 609). Additionally, the data cell in port 607 and/or a local storage 608 may direct the data cells 535 to one or more receive data pipes 609. A number of receive data pipes 609 may be equivalent to a number of receive data pipes is equivalent to the number of the in ports 414 and a number of dedicated data cell in ports 607.

Address bits of the data cell 535 may be used for a routing decision. A 64-bit address allows for $2^{64}=1.84\mathrm{e}19$ connections in an array implementing the array interconnect 111. Accordingly, in data port 607 may include the local storage 608 for full rate serial to parallel conversion.

FIGS. 7-10 illustrate example arrays 700, 800, 900, and 1000. Each of the arrays 700, 800, 900, and 1000 may include one or more of the features and components described with reference to FIGS. 1-6. For example, each of the arrays 700, 800, 900, and 1000 may be configured to execute parallel source code partitioned among the FPGA devices included therein. Additionally, each of the arrays 700, 800, 900, and 1000 may include the array interconnect 111. Each of the arrays 700, 800, 900, and 1000 are briefly described below.

Figure 7:
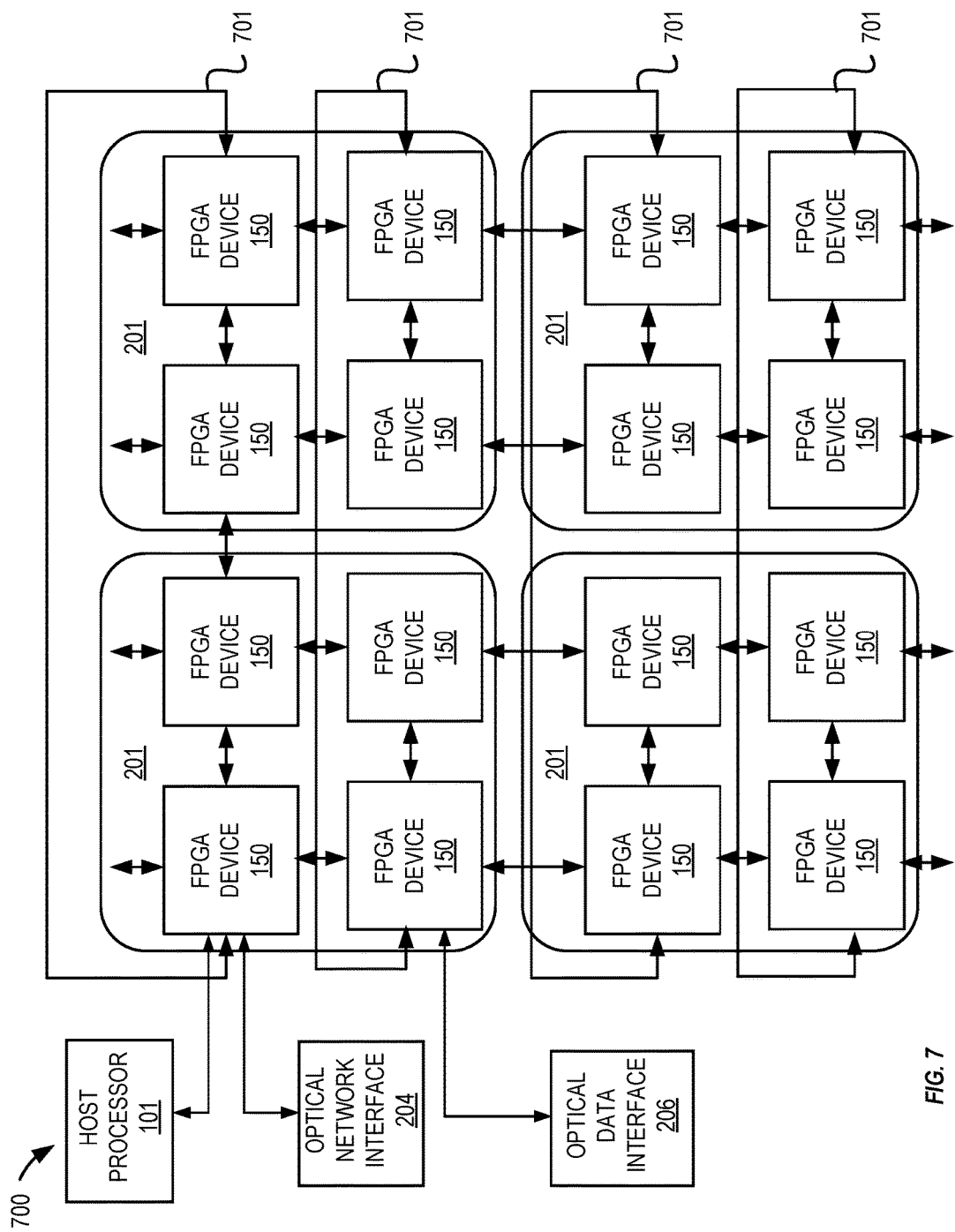
FIG. 7 illustrates a block diagram of an example array that includes one or more of the FPGA devices of FIG. 1.
Figure 8:
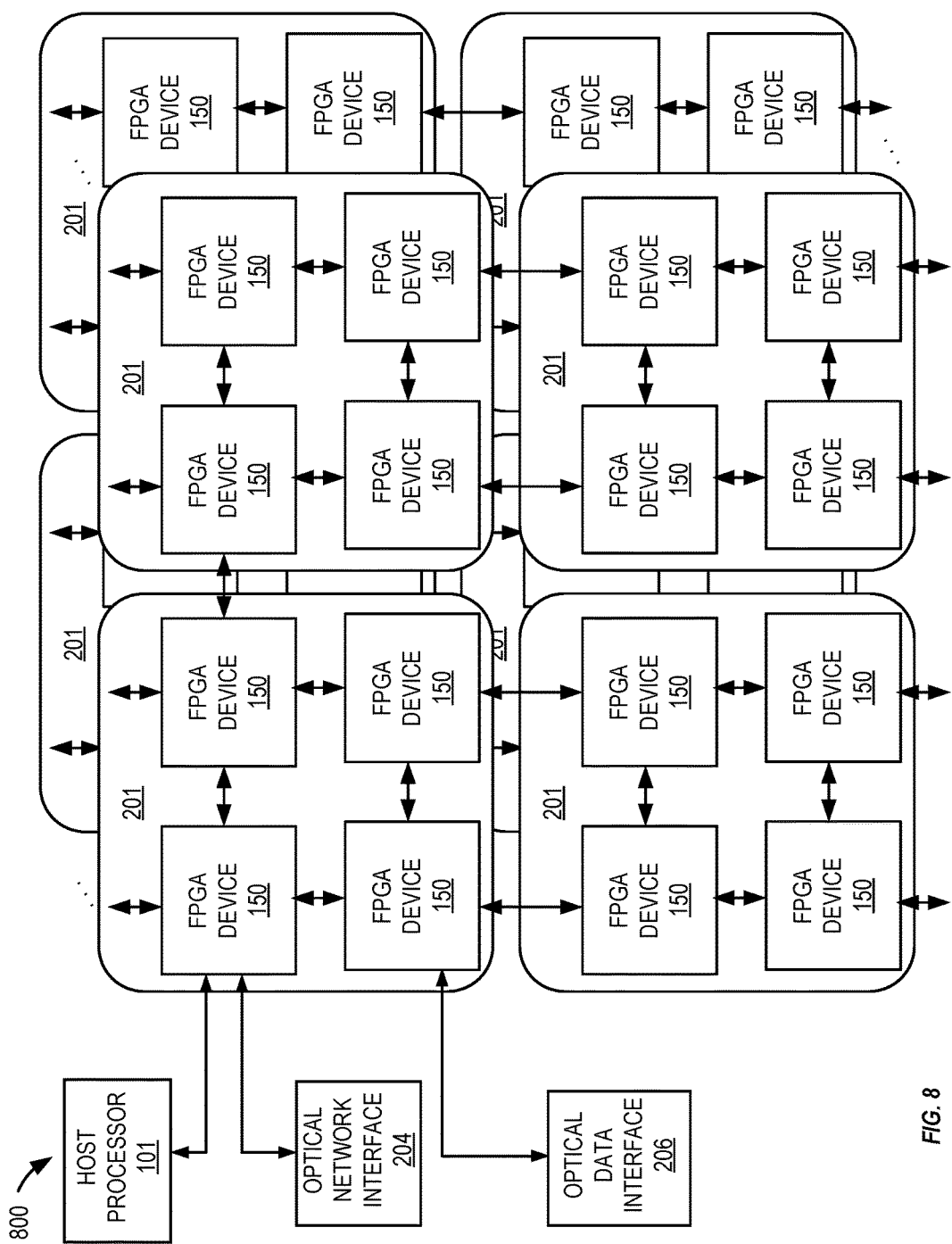
FIG. 8 illustrates a block diagram of an example array that includes one or more of the FPGA devices of FIG. 1.

FIG. 7 illustrates a block diagram of an example array 700. The array 700 a two dimensional torus array. The torus array may include a torus interconnect 701. The array 700 in some embodiments may include four global memory ports for each FPGA device 150. FIG. 8 illustrates a block diagram of another example array 800. The array 800 is a three-dimensional array. In FIG. 8, the ellipses indicate that multiple FPGA devices 150 and cards may be added. Some embodiments of the array 800 may include six ports for each of the FPGA devices 150. The array may be modified to a torus type through the addition of a torus interconnect as shown in FIG. 7. An array with higher dimensions may be built by adding ports.

Figure 9:
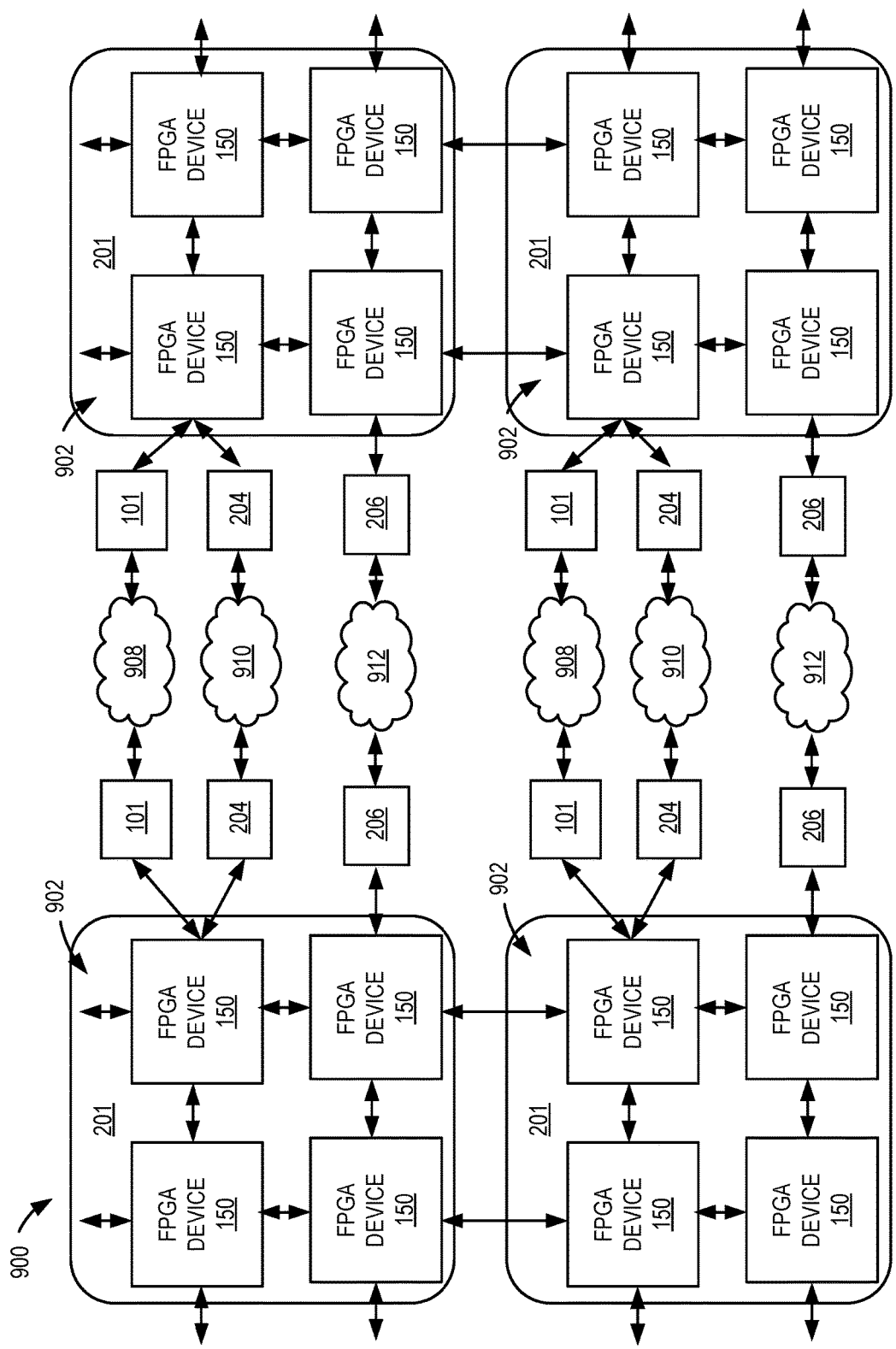
FIG. 9 illustrates a block diagram of another example array that includes one or more of the FPGA devices of FIG. 1.

FIG. 9 illustrates a block diagram of another example array 900. The array 900 includes a multiprocessing configuration with multiple host processors 101 configured as a cluster. In this configuration, multiple arrays 902 may execute accelerated computations according each host processor 101. The code may be executed asynchronously in each host processor 101 in the cluster and per each array 902. The array 900 may further include a host-to-host network 908. Some examples of the host-to-host network may include 1GE-10GE Ethernet. The array 900 may also include a connection to a transport network 910. For example, the connection may include an OTN at OTU2, OTU3 or OTU4 rates. The array 900 may also include a connection to a data network 912. The data network 912 may include Ethernet at 1GE, 10GE or 100GE rates. A number of additional FPGA data and transport network ports may be determined by a particular parallel task.

Figure 10:
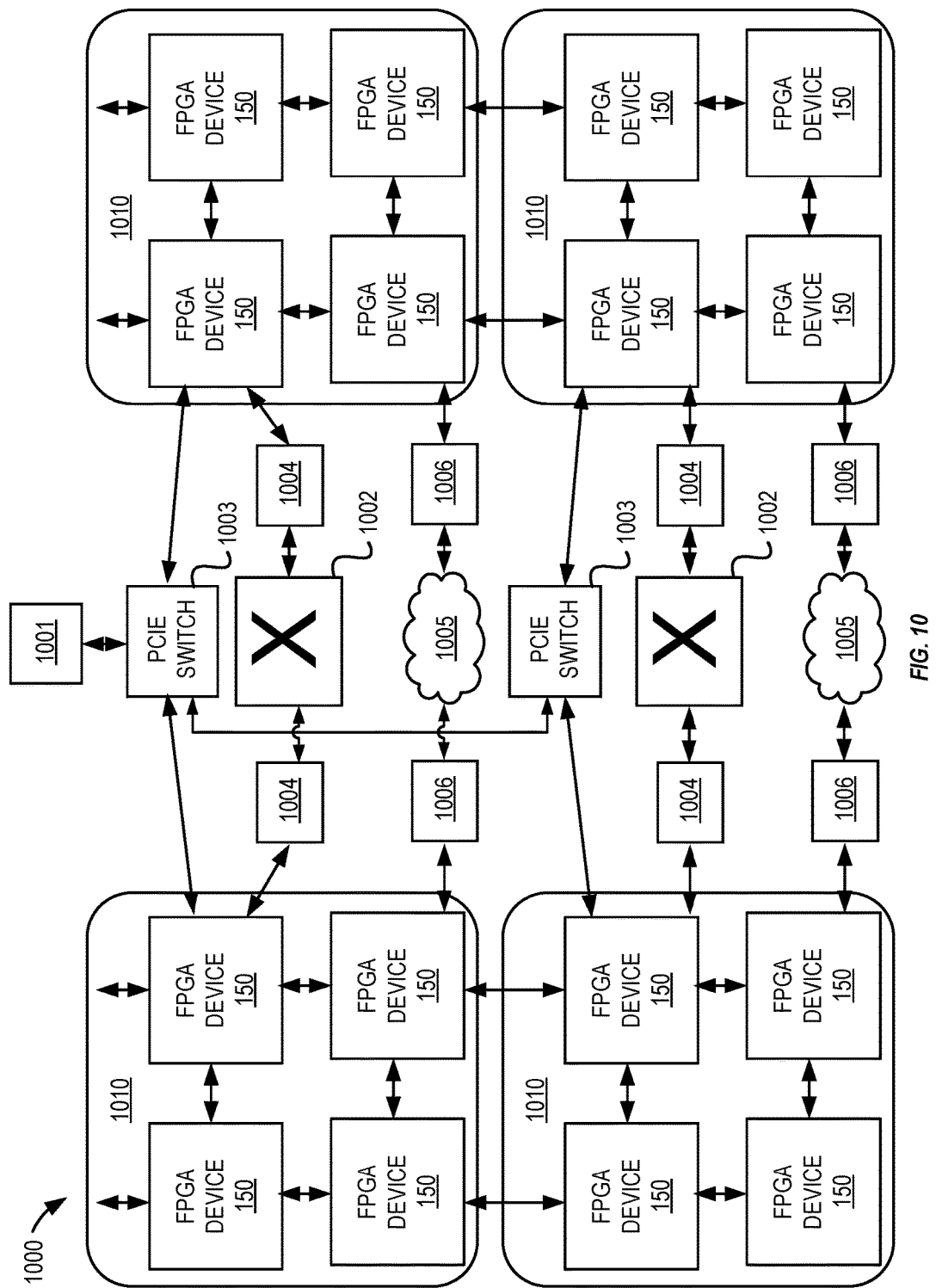
FIG. 10 illustrates a block diagram of another example array that includes one or more of the FPGA devices of FIG. 1.

FIG. 10 illustrates a block diagram of another example array 1000. The array 1000 is arranged as a switched network interconnect. The array 1000 may include a single host processor 1001 and multiple host interfaces 1003 that may include a switch feature. For example, in the depicted embodiment the host interfaces 1003 include a PCIe switch, which may be configured to selectively interface with the host processor 1001. In other embodiments, other types of host processor 1001 and interfaces 1002 may be implemented.

The array 1000 may also include multiple switches 1002. The switches 1002 may interconnect a transport or any other type of switched network 1005. The interconnected arrays 1010 may include one or more line cards each having one or more arrays of FPGA devices 150. The FPGA devices 150 may be arranged according to a functionality of forwarding plane.

In addition to an array interconnect (e.g., the array interconnect 111 described herein), some of the FPGA devices 150 may include a switch interface 1004, a framer 1006, or a traffic manager logic. The switch interface 1004, the framer 1006, or the traffic manager logic may be configured to extract the payload from a frame such as an OTN wrapper. The switch interface 1004, the framer 1006, or the traffic manager logic may reside outside of the FPGA devices 150 or inside FPGA devices 150. Thus, switching, framing and traffic management functions may be centralized or distributed.

In the example arrays 700, 800, 900, and 1000, the global memory access cells and data cells are transparently exchanged by entire array of the FPGA devices by encapsulating them in corresponding transport, data, and switched network protocols while maintaining a uniform global memory address space as well as facilitating the global data cell exchange via utilization of address bit fields as described above.

Figure 11A:
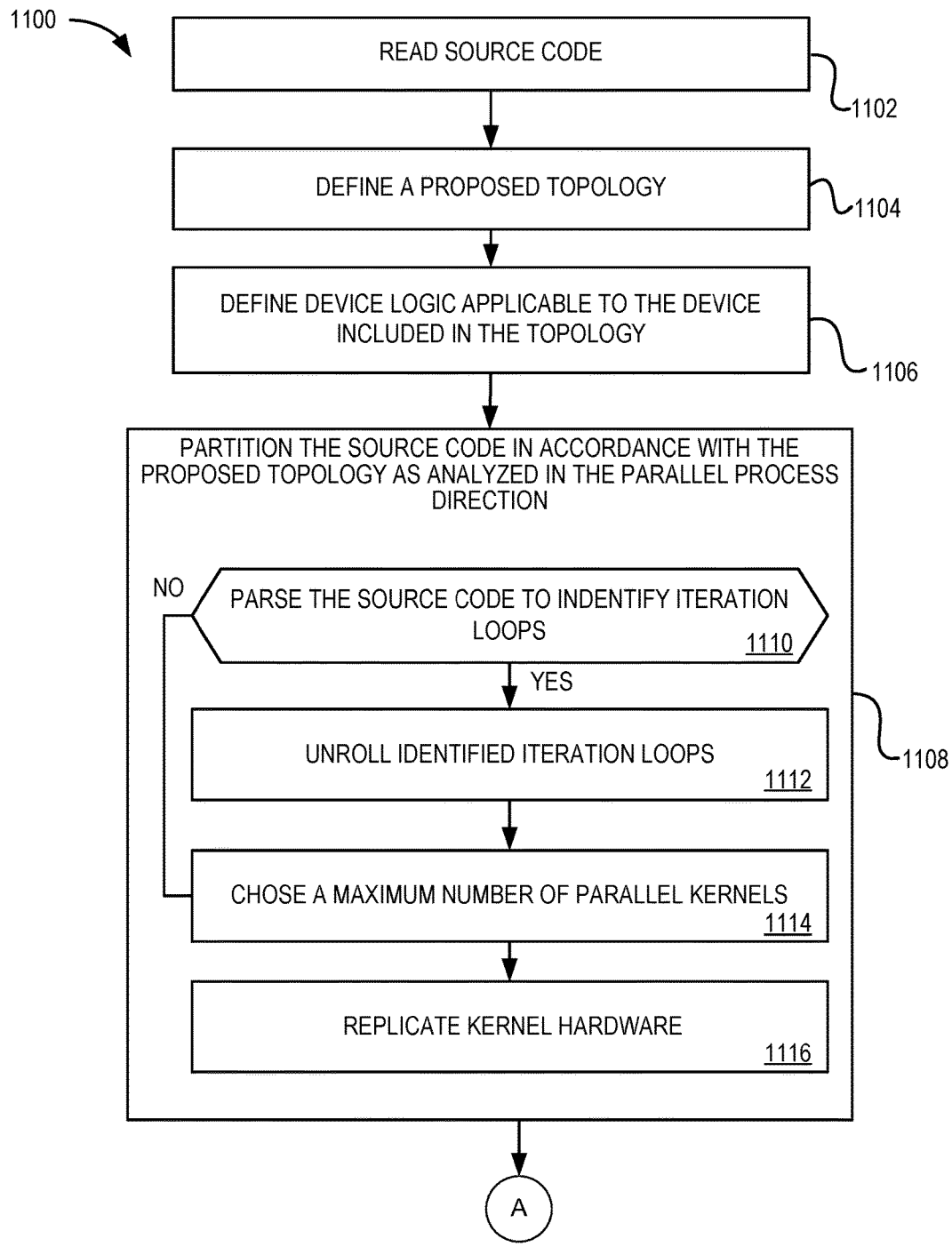
FIGS. 11A and 11B are a flow chart of an example method of the parallel code partitioning among the member devices of an array.
Figure 11B:
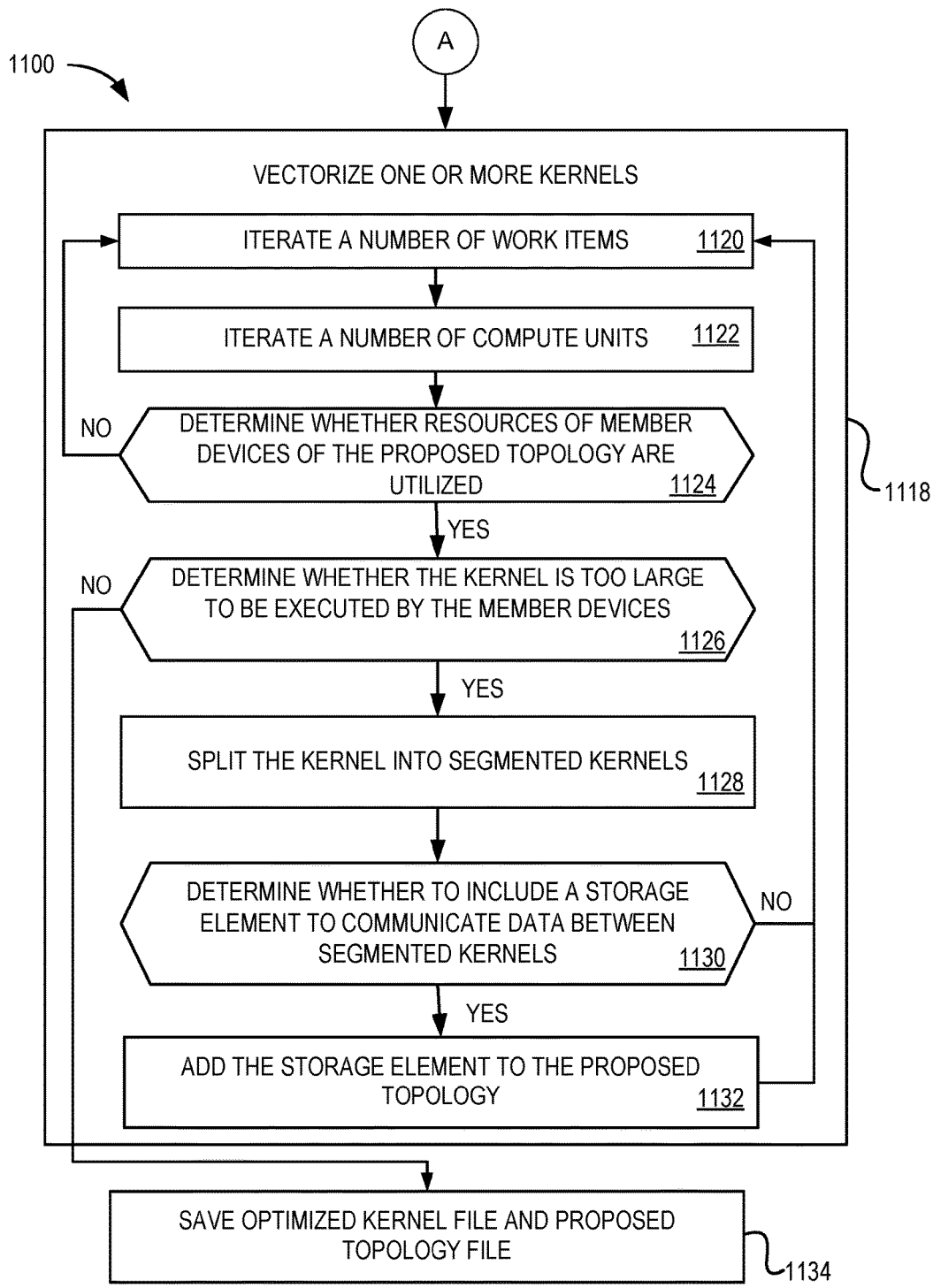

FIGS. 11A and 11B are a flow chart of an example method 1100 of the parallel code partitioning among the member devices of an array. The method 1100 may be programmably performed in some embodiments by the topology/partitioning module 322 described with reference to FIG. 3. In some embodiments, the topology/partitioning module 322 or the computing device 320 may include or may be communicatively coupled to a non-transitory computer-readable medium (e.g., the memory 326 of FIG. 3) having stored thereon programming code or instructions that are executable by a processor (such as the processor 328 of FIG. 3) to cause a computing device 320 and/or the topology/partitioning module 322 to perform the method 1100. Additionally or alternatively, the computing device 320 may include the processor 328 described above that is configured to execute computer instructions to cause the topology/partitioning module 322 or another computing device to perform the method 1100. Although illustrated as discrete blocks, various blocks may be divided into additional blocks, combined into fewer blocks, or eliminated, depending on the desired implementation.

With reference to FIG. 11A, the method 1100 may begin at block 1102. At block 1102, a source code may be read. For example, the source code may be read line-by-line. Additionally, a processing specification may be read. At block 1104, based on the read source code and/or the processing specification, a proposed topology may be defined. The proposed topology may include devices arranged in a dataflow direction in which data is processed in the array and one or more parallel process directions that may be orthogonal to the dataflow direction.

At block 1106, based on the proposed topology a device logic applicable to the device may be defined that is applicable to the device included in the proposed topology. For example, in some embodiments, the device logic may include a PCIe endpoint, OTN framer, traffic manager, UDP stack, TCP stack, packet forwarding protocol, and frame forwarding protocol. One or more example of the device logic may occupy resources of one or more of the devices included in the proposed topology. The device logic that occupies resources of one or more of the devices may be taken into consideration during one or more other steps of the method 1100.

With reference to FIG. 11B, at block 1108, the source code may be partitioned in accordance with the proposed topology analyzed in a parallel process direction. The parallel process direction may be orthogonal to a dataflow direction. Additionally, in some arrays there may be multiple parallel process directions. For example, three-dimensional arrays may include two parallel process directions.

In some embodiments, partitioning the source code in the first direction may include one or more of blocks 1110, 1112, 1114, and 1116. At block 1110, the source code may be parsed to identify iteration loops. In response to one or more iteration loops being present in the source code ("YES" at block 1110), the method 1100 may proceed to block 1112. At block 1112, the identified iteration loops may be unrolled. In some embodiments, the loops may be partially or fully unrolled based on user input sufficient to indicate a degree to which the loops are to be unrolled.

In response to there not being any iteration loops ("No" at block 1110), the method 1100 may proceed to block 1114. At block 1114, a maximum number of parallel kernels may be chosen. In some embodiments, the maximum number of parallel kernels may be based on a number of devices in the first direction of the proposed topology. Additionally, in these and other embodiments, the maximum number of parallel kernels may be increased by adding devices in the first direction to the proposed topology. The maximum number of parallel kernels may be limited by a size of address space of a memory expansion protocol implemented in the proposed topology.

At block 1116, kernel hardware may be replicated. In some embodiments, user input may be received that is sufficient to select to replicate kernel hardware. A selection to replicate kernel hardware may be based on a specific task specification or processing specification. For example, a task in the source code may involve multiple data network ports to be processed by an identical parallel code. Accordingly, replicated kernel hardware may be implemented to process the task.

At block 1118, one or more of the kernels may be vectorized. The kernels may be vectorized to optimize a device arrangement of the proposed topology in the dataflow direction. The device arrangement may be optimized based on a utilization of array member device resources of the proposed topology. In some embodiments, the vectorization of the kernels may include one or more of blocks 1120, 1122, 1124, 1126, 1128, 1130, and 1132.

At block 1120, a number of work items may be iterated. For instance, in embodiments implemented in the OpenCL, a number of the work items may be increased by iterating a number N in an example work item attribute:
_attribute_((num_simd_work_itmes(N))).
In the work item attribute, N may be equal to integer values 1, 2, 4, 8, and 16. If N increases from 1 to 4, the amount of work executed by the FPGA device quadruples. In some circumstances, increasing the work items may be an economic way in terms of device resources to execute addition portions of the source code in parallel.

At block 1122, a number of compute units may be iterated. For instance, in embodiments implemented in the OpenCL, a number of compute units may be increased by iterating a number M in an example compute unit attribute:
_attribute_((num_compute_units(M)))
The number M may take an integer value. Increasing the number of compute units increases a number of load and store units and consequently increases required device resources in comparison to a similar increase of work items which may result in an increase in a number of busses multiplexed by the load and store units.

At 1124, it may be determined whether resources of member devices of the proposed topology are utilized. For example, in embodiments in which the member devices are FPGA devices, it may be determined whether the FPGA logic fabric and dedicated resources such as registers, blocks of local memory, and DSP blocks are utilized. In some embodiments, the defined device logic may be taken into account in a determination made at block 1124. In response to the device resources not being fully utilized ("No" at block 1124), the method 1100 may proceed to block 1120. The method 1100 may then proceed to one or more of blocks 1120, 1122, 1124, 1126, 1128, 1130, 1132, and 1134.

In response to the device resources being fully utilized ("YES" at block 1124), the method 1100 may proceed to block 1126. At block 1126, it may be determined whether the kernel is too large to be executed by a member device. In response to member device being a sufficient size to process the kernel ("NO" at block 1126), the method 1100 may proceed to block 1134. At block 1134, an optimized kernel file and a proposed topology file may be saved. The proposed topology file may contain the device array address indexing information that may be utilized, for example, for modifications of a host processor code.

In response to the kernel being too large ("YES" at block 1126), the method 1100 may proceed to block 1128. For example, if the kernel being analyzed is long and involves complex computations that cannot be performed by a single member device, the kernel may be too large. At block 1128, the kernel may be split into segmented kernels. At block 1130, it may be determined whether to add a storage element to communicate data between the segmented kernels. In some embodiments, the storage element may include an OpenCL pipe and/or a FIFO. In response to a determination to add a storage element, the method 1100 may proceed to block 1132. At block 1132, the storage element may be added to the proposed topology. The method 1100 may proceed from block 1132 to block 1120. The method 1100 may then proceed to one or more of blocks 1120, 1122, 1124, 1126, 1128, 1130, 1132, and 1134. In response to a determination not to add the storage element, the method 1100 may proceed to block 1120. The method 1100 may then proceed to one or more of blocks 1120, 1122, 1124, 1126, 1128, 1130, 1132, and 1134.

In some embodiments, using the method 1100, each kernel and/or each segmented kernel may be optimized for maximum device utilization and consequently for a largest acceleration or speedup factor. A throughput factor and an acceleration factor of each kernel and/or each segmented kernel working together with the rest of kernels may be optimized for a same speed of real-time execution. Thus, the method 1100 may result in an optimum acceleration or speedup factor for a particular array topology and the number of devices in the array.

One skilled in the art may appreciate that, for this and other procedures and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the disclosed embodiments. For instance, when high level source code is not written in OpenCL, the method 1100 may include compiling another source code (e.g., C/C++ original code) into OpenCL code or kernels by an additional topology/partitioning module including third party topology/partitioning module. The OpenCL kernels may represent computationally intensive portions of the original source code. The remaining original source code may be executed on a host processor, for instance.

Additionally or alternatively, the method 1100 may include extracting computationally intensive portions of an original C/C++ code and create a hardware circuit by applying HLS design flow. A resulting hardware circuit may be replicated or instantiated multiple times along with an additional logic of load and store units. A number of replications may be equivalent to the number of compute units discussed above in the method 1100. An amount of multiplexing of load and store data buses may be equivalent to the number of work items in the method 1100.

Some portions of the method 1100 are described with reference embodiments in which the member devices of the arrays include FPGA devices. In some embodiments, the method 1100 may be applicable to any heterogeneous systems that may include GPUs, GPPs, DSPs, FPGA devices or any computation devices and their combinations including hybrid computing systems.

In some embodiments, if the source code includes computations without a dominant data direction as an alternative to the method 1100, the array may be treated as a computational resource pool. Accordingly, an array of FPGA devices may include as many of the kernels as possible. The array may operate essentially as one large FPGA device. In these embodiments, bandwidth of the array interconnect may be a limiting factor.

Figure 12A:
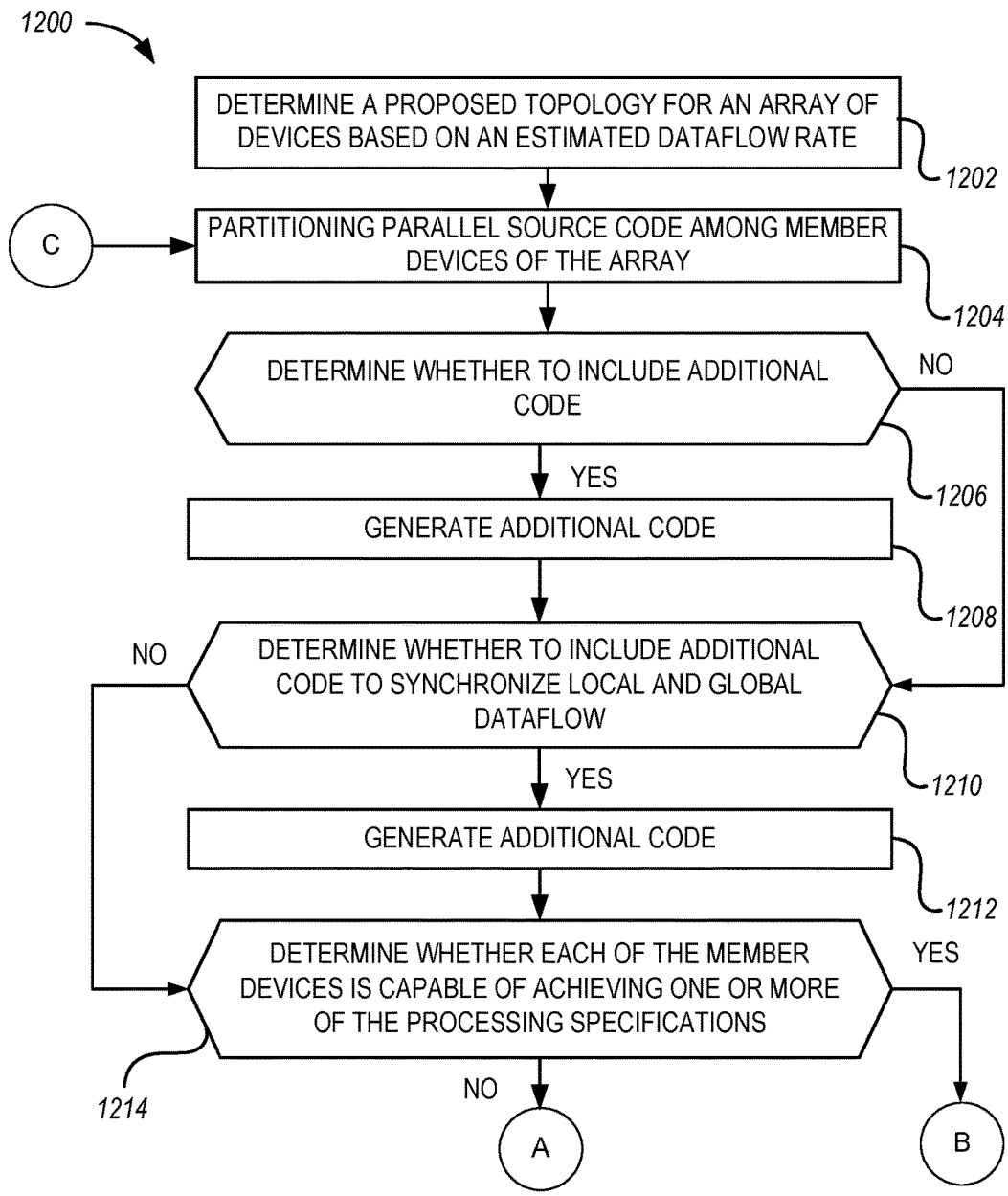
FIGS. 12A and 12B are a flow chart of an example method of array topology determination.
Figure 12B:
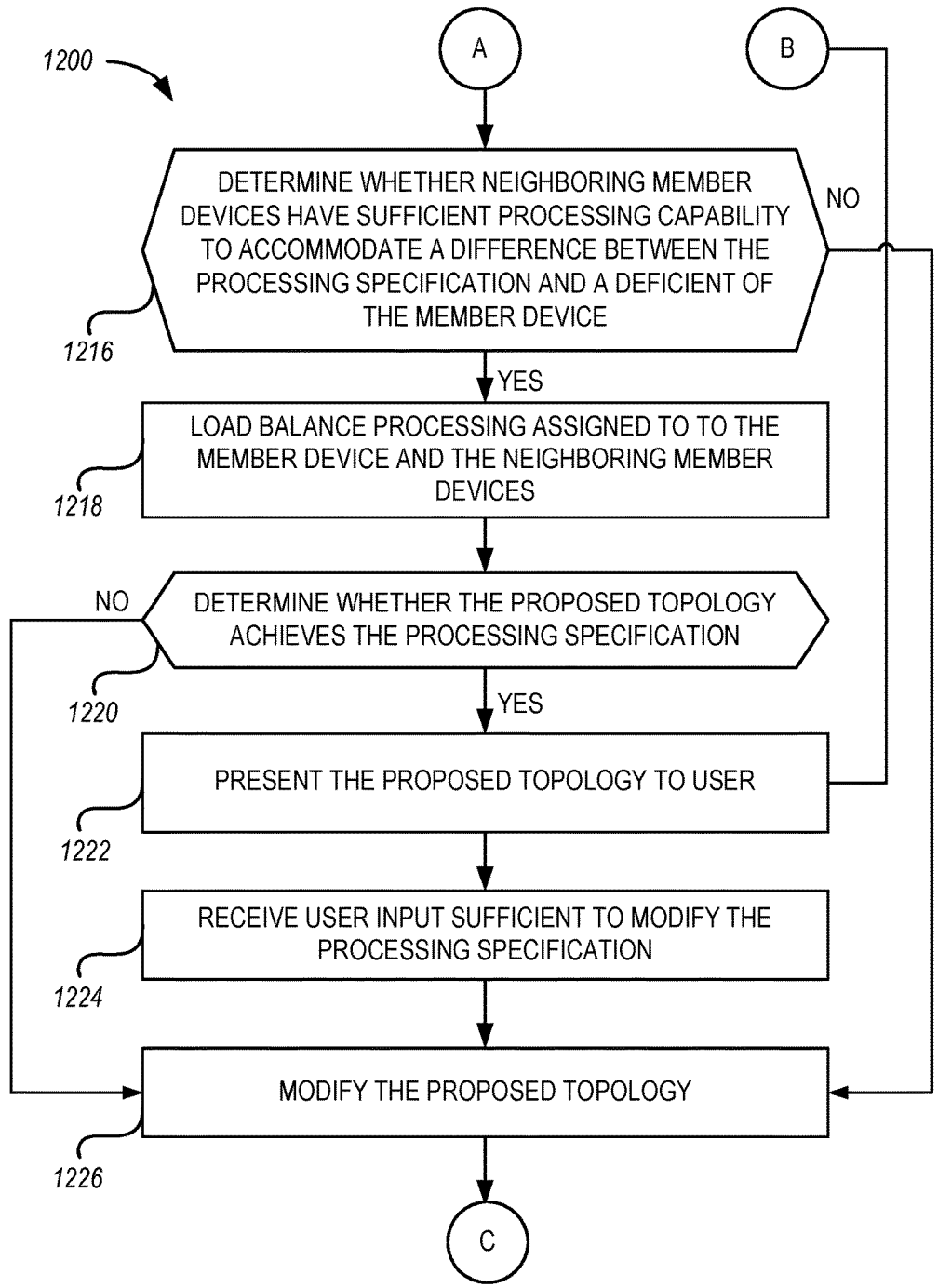

FIGS. 12A and 12B are a flow chart of an example method 1200 of array topology determination. The method 1200 may be programmably performed in some embodiments by the topology/partitioning module 322 described with reference to FIG. 3. In some embodiments, the topology/partitioning module 322 or the computing device 320 may include or may be communicatively coupled to a non-transitory computer-readable medium (e.g., the memory 326 of FIG. 3) having stored thereon programming code or instructions that are executable by a processor (such as the processor 328 of FIG. 3) to cause a computing device 320 and/or the topology/partitioning module 322 to perform the method 1200. Additionally or alternatively, the computing device 320 may include the processor 328 described above that is configured to execute computer instructions to cause the topology/partitioning module 322 or another computing device to perform the method 1200. Although illustrated as discrete blocks, various blocks may be divided into additional blocks, combined into fewer blocks, or eliminated, depending on the desired implementation.

The method 1200 may begin at block 1202. At block 1202, proposed topology for an array of devices may be determined. In some embodiments, the proposed topology may be based on an estimated dataflow rate of the array. The estimated dataflow rate may be based on a processing specification that may be input from a user. Additionally or alternatively, the estimated dataflow rate may be estimated by an inherent or operating input and output rate for a set of source code applications. For example, some source code applications such as medical CT image processing may include a specified data rate per second, which may not be deviated from. Other source code applications may not include a strict dataflow rate.

At block 1204, parallel source code may be partitioned among member devices of the array. The member devices may include FPGA devices. In some embodiments, an initial partitioning of the parallel source code among the member devices of the array may be according to an initial set of segmented kernels. The initial set of segmented kernels may be a best guess as to a partition of the parallel source code to the member devices based on computational resources of the member devices and an estimate of an involved number and type of computations from initial read or parse of the parallel source code.

At block 1206, it may be determined whether to include additional code. The additional code may be added to replicate or broadcast or to communicate input or intermediate data between the member devices and/or to multiplex or demultiplex the input or intermediate data. In response to a determination to include the additional code ("Yes" at block 1206), the method 1200 may proceed to block 1208. In response to a determination not to include the additional code ("No" at block 1206), the method 1200 may proceed to block 1210. At block 1208, additional code may be generated. For example, the additional code may include repeaters, broadcast logic, FIFOs, pipes, multiplexers, demultiplexers, or some combination thereof.

At block 1210, it may be determined whether to include additional code to synchronize local dataflow and global dataflow. In response to a determination to include the additional code to synchronize local dataflow and global dataflow ("Yes" at block 1210), the method 1200 may proceed to block 1212. In response to a determination not to include the additional code to synchronize local dataflow and global dataflow ("No" at block 1210), the method 1200 may proceed to block 1214.

At block 1212, additional code to synchronize local dataflow and global dataflow may be generated. For example, the additional code may include a master synchronization kernel, a slave synchronization kernel, multiplexers, demultiplexers, code to communicate there between, or some combination thereof.

At block 1214, it may be determined whether each of the member devices is capable of achieving a processing specification. In response to a determination that the member devices are capable of achieving the processing specification ("Yes" at block 1214), the method may proceed to block 1222. In response to a determination that one of the member devices is not capable of achieving the processing specification ("No" at block 1214), the method may proceed to block 1216.

At block 1216, it may be determined whether neighboring member devices have sufficient processing capability to accommodate a difference between the processing specification and a deficiency of the member device. In response to a determination that the neighboring member devices do not have sufficient processing capability ("No" at block 1216), the method 1200 may proceed to block 1226. In response to a determination that the neighboring member devices have sufficient processing capability ("Yes" at block 1216), the method 1200 may proceed to block 1218.

At block 1218, processing assigned to the member device and the neighboring member devices may be load balanced. At block 1220, it may be determined whether the proposed topology achieves the processing specification. In response to a determination that the member devices are capable of achieving the processing specification ("Yes" at block 1220), the method 1200 may proceed to block 1222. In response to a determination that the member devices are not capable of achieving the processing specification ("No" at block 1220), the method 1200 may proceed to block 1226.

At block 1224, user input sufficient to modify the processing specification may be received. For example, a user such as the user 380 may input a new processing specification, which may serve at least partially as grounds for a modification to the proposed topology or as a change to a partitioning of the parallel source code.

At block 1226, the proposed topology of the array may be modified. For example, a row, a column, another array, etc. may be added to the proposed topology. From block 1224, the method 1200 may proceed to block 1204 and one or more of blocks 1206, 1208, 1210, 1212, 1214, 1216, 1218, 1220, and 1222 may be performed.

One skilled in the art may appreciate that, for this and other procedures and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the disclosed embodiments.

Figure 13:
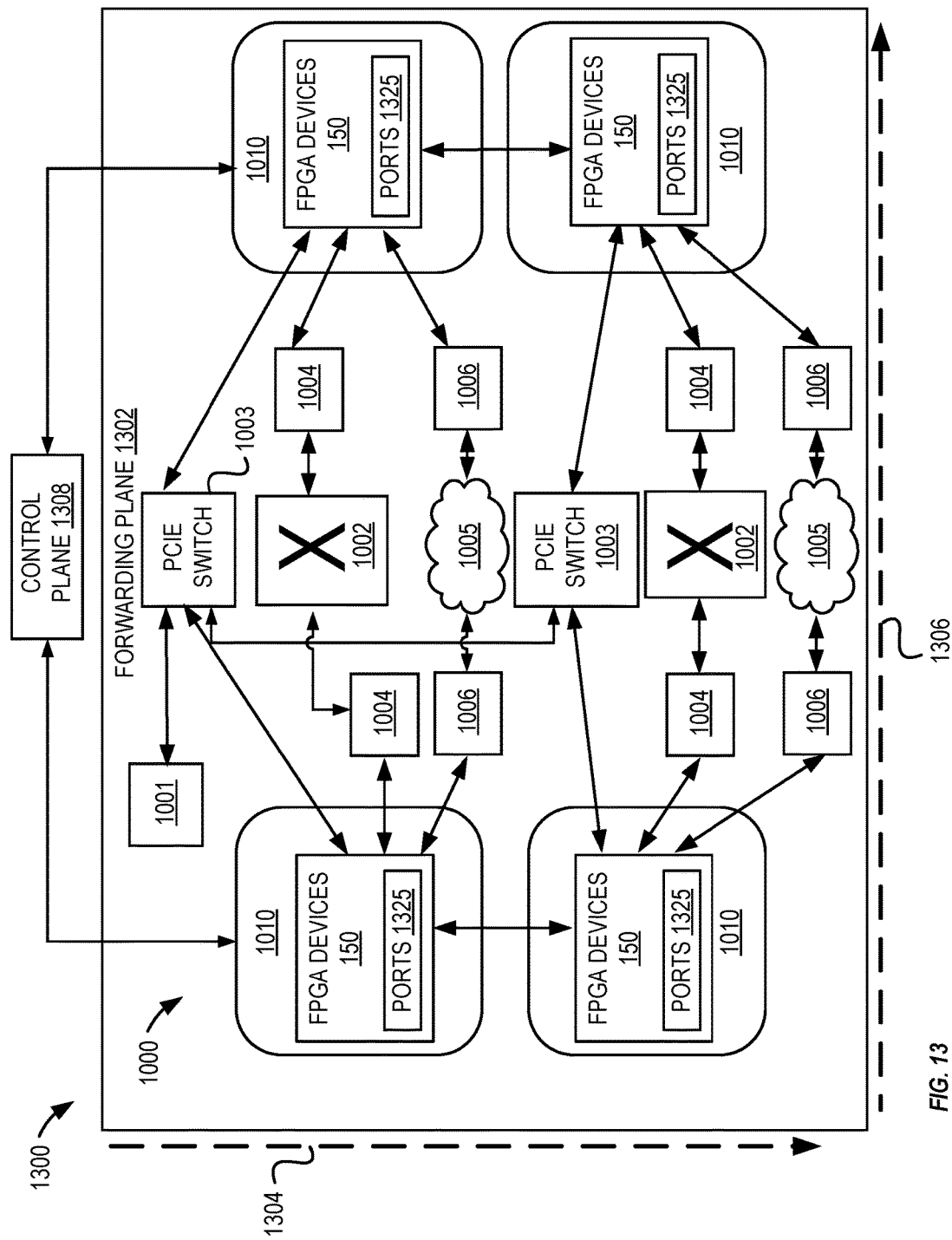
FIG. 13 illustrates the embodiment of the array of FIG. 10 arranged as a forwarding plane.

FIG. 13 illustrates the embodiment of the array 1000 arranged as a forwarding plane 1302. As described with reference to FIG. 10, the array 1000 of FIG. 13 includes interconnected arrays 1010 of FPGA devices 150. The array 1000 may include the host processor 1001, the host interfaces 1003, the switches 1002 that interconnect a transport with the network 1005, or some combination thereof. Some of the FPGA devices 150 may include the switch interface 1004, the framer 1006, or the traffic manager logic. Global memory access cells and data cells may be transparently exchanged by the entire array 1000 of the FPGA devices 150 by encapsulating them in corresponding transport, data, and switched network protocols while maintaining a uniform global memory address space as well as facilitating the global data cell exchange via utilization of address bit fields. While FIG. 13 depicts the array 1000 implemented as the forwarding plane 1302, other embodiments may include one or more of the arrays 200, 700, 800, or 900 implemented as a forwarding plane 1302.

Arrangement of the array 1000 as the forwarding plane 1302 may be accomplished by partitioning a networking application source code among the FPGA devices 150. The networking application source code may enable the array to execute one or more network processing functions. Some examples of the network processing functions may include in port bandwidth aggregation, per-out port bandwidth reservation and scheduling according to input and output rates of conventional client and network interfaces, and a priority-based arbitration with input and output port bandwidth reservations that establish basis for Quality of Service (QoS) that is maintained end-to-end of the FPGA array-based forwarding plane 1302.

The parallel portions and/or the sequential portions of the networking application source code may be partitioned among the FPGA devices 150. For example, the networking application source code may be partitioned among the FPGA devices 150 as described with reference to FIGS. 11A-12B.

The array 1000 may include two directions 1304 and 1306. The first direction 1304 may correspond to a number of network ports that may be included in the array 1000. For instance, as described above, the FPGA devices 150 may include FPGA data and transport network ports. Some portion of the FPGA data and transport network ports may include ingress ports and some portion of the FPGA data and transport network ports may include egress ports. The ingress ports and egress ports are represented in FIG. 13 by ports 1325. The ingress ports 1325 may be configured to receive traffic such as ingress network traffic. The egress ports 1325 may be configured to transmit traffic. As an amount of traffic received by the array 1000 increases, a number of ingress ports 1325 may increase. Accordingly, a number of interconnected arrays 1010 may increase in the first direction 1304 to accommodate the increase in ingress ports 1325. Some additional details of the ingress ports 1325 and egress ports 1325 are described elsewhere in this disclosure.

In the second direction 1306, the number and arrangement of the FPGA devices 150 may be configured according to a complexity of the networking application source code partitioned among the FPGA devices 150. For instance, in embodiments in which the networking application source code includes a simple protocol (e.g., WAN to LAN or a single client) the number of FPGA devices 150 may be small (e.g., 4-16 FPGA devices 150) and configuration of the FPGA devices 150 may be simple (e.g., a single switch interface 1004). In embodiments in which the networking application source code includes a complex protocol, the number of FPGA devices 150 may be large (e.g., 500 FGPA devices 150) and the configuration of the FPGA devices 150 may be complex (e.g., multiple switch interfaces 1004, multiple framers 1006, etc.).

The traffic received at the forwarding plane 1302 may be forwarded and otherwise processed according to the networking application source code partitioned among the FPGA devices 150. For example, in some embodiments, the FPGA devices 150 may be configured to execute segmentation, reassembly, and bandwidth aggregation of packets and/or frames included in the traffic. The segmentation, reassembly, and bandwidth aggregation may be performed using the data cells of one or more chosen maximum cell sizes as described with reference to FIGS. 4-6 above.

In addition, the maximum cell sizes of the cell may be adjusted and varied based on the networking application source code, functions performed by the networking application source code, traffic types, client preferences, ingress port 1325 on which the traffic is received, or some combination thereof. The maximum cell sizes allow flexible and smaller granularity of bandwidth of the forwarding plane 1302. For instance, small interconnect cell granularity enables flexible bandwidth assignment and support of large aggregate rates of emerging standards (e.g., at 10-100 Gbaud rates and above).

For example, with combined reference to FIGS. 1, 4-6, and 13, the array interconnect 111 may be configured to choose one or more maximum cell sizes of data cells that are configured to encapsulate PDUs of the traffic received by the ingress ports 1325 of the forwarding plane 1302. The chosen cell sizes may be based on a dominant traffic content of a particular type of the received traffic. For instance, traffic received at the forwarding plane 1302 may include between about 70% and about 90% video traffic. Accordingly, the array interconnect 111 may be configured to identify the video traffic as the dominant traffic type. The array interconnect 111 may then choose the maximum cell size to properly and efficiently forward the video traffic. After the maximum cell size is chosen, the array interconnect 111 may be configured to encapsulate remaining traffic content included in the traffic into the chosen maximum cell size. Additionally or alternatively, the array interconnect 111 may be configured to choose one of the maximum cell sizes based on a dominant traffic content of a particular type of the received traffic at a particular ingress port 1325 and/or a dominant traffic content of a reserved egress port 1325 that is associated with a particular client.

In the forwarding plane 1302, the array 1000 is capable of being re-programmed or dynamically provisioned. For example, under a first partitioning of the networking application source code, the array 1000 may be configured to forward the traffic according to a first protocol. Subsequently, e.g., following an update in the first protocol, the array may be re-programmed to accommodate the update in the first protocol. Likewise, following a change from the first protocol to a second protocol, the array may be re-programmed to accommodate the change to the second protocol.

The forwarding plane 1302 of FIG. 13 may be configured to interface with a control plane 1308. For example, the control plane 1308 may be configured to control or otherwise organize functions performed by the forwarding plane 1302. In some embodiments, the control plane 1308 may be disaggregated from the forwarding plane 1302 or from components included in some portion thereof. For example, the control plane 1308 may run on a host processor, a virtual processor, a data center server, or another suitable hardware system.

The forwarding plane 1302 may be configured to accept one or more commands and to send one or more responses to the control plane 1308. In some embodiments, a data memory buffer of the FPGA devices 150 may send and receive from the host processor 1001 via a PCIe interfaces, such as a PCIe switch 1003.

The forwarding plane 1302 and the control plane 1308 may be configured to implement one or more network protocols. For instance, the forwarding plane 1302 and the control plane 1308 may be configured to implement routing protocols such as RIP (Routing Information Protocol), OSPF (Open Shortest Path Forwarding), BGP (Border Gateway Protocol), Interior Gateway Routing Protocol (IGRP), Intermediate System-Intermediate System Routing Protocol (IS-IS), TCP/UDP, Open Systems Interconnection (OSI) stacks, OPENFLOW™, OPENSTACK®, other traditional routing protocols, and the like. Additionally or alternatively, the forwarding plane 1302 and the control plane 1308 may be configured to implement an IP/MAC/VLAN/MPLS/ACL filter, priority or statistical multiplexing, and flow tables.

In some embodiments, the ingress ports 1325 and/or the egress ports 1325 may be configured to perform some portion of the communication with the control plane 1308. For example, the ingress ports 1325 may be configured to receive in line commands, protocol signaling, and operations and maintenance (OAM) packets or frames that originate at a control plane 1308. Similarly, the egress ports 1325 may be configured to send out in line responses, protocol signaling, and OAM packets or frames to the control plane 1308.

Figure 14:
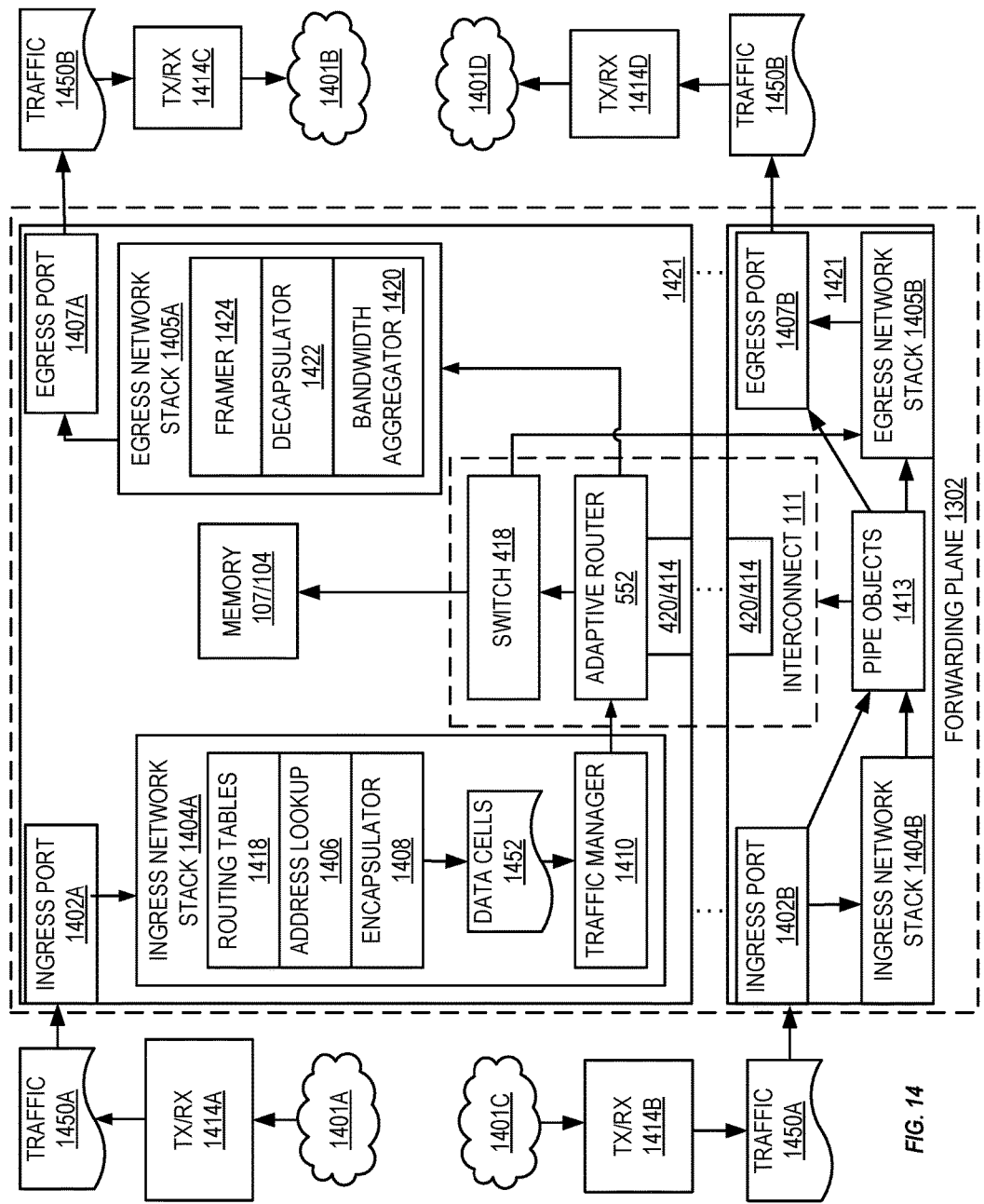
FIG. 14 illustrates an example embodiment of the forwarding plane of FIG. 13.

FIG. 14 illustrates an example embodiment of the forwarding plane 1302 of FIG. 13. The forwarding plane 1302 may be implemented in one or more FPGA devices 150 that may be configured in one or more of the arrays 200, 700, 800, 900, and 1000. The forwarding plane 1302 may include a scalable array of FPGA devices that are configured to execute a networking application source code that is partitioned among the FPGA devices as computing elements that are executed by the FPGA devices with a uniform global memory address space.

The forwarding plane 1302 may be implemented between one or more data networks 1401A-1401D (generally, data network 1401 or data networks 1401). For example, the data networks 1401 (e.g., 1401A and 1401B) may include a LAN and a WAN. In these and other embodiments, the forwarding plane 1302 or a component thereof may forward the traffic from the LAN to the WAN using the data cells of the chosen cell size. Additionally, the data networks 1401 may include a client network and a transport network. In these and other embodiments, the forwarding plane 1302 or a component thereof may be configured to forward the client network to the transport network using the data cells of the chosen cell size. In some embodiments, the data networks 1401 may include networks that operate at different bit rates (e.g., 10 G, 40 G, 100 G, and the like). In these and other embodiments, the forwarding plane 1302 may aggregate traffic 1450A and 1450B (generally, traffic 1450) from one of the data networks 1401 operating at a lower bit rate to another of the data networks 1401 operating at a higher bit rate.

The forwarding plane 1302 of FIG. 14 may be communicatively coupled to one or more receivers and/or transmitters 1414A-1414D (hereinafter, "TX/RX 1414"). The TX/RX 1414 may include any optical or electrical module or optical or electrical interface configured to communicate the traffic 1450 with the data networks 1401. In some embodiments, one or more of the TX/RX 1414 may be implemented in a transceiver. In some embodiments, one or more of the TX/RX 1414 may be implemented as a receiver or a transmitter.

In FIG. 14, a first and a third data networks 1401A and 1401C may communicate the traffic 1450A to a first TX/RX 1414A and a second TX/RX 1414B. The TX/RX 1414A and 1414B may communicate the traffic 1450A to ingress ports 1402A and 1402B (generally, ingress port 1402 or ports 1402). The ingress ports 1402 may include physical ports or logical ports.

The ingress ports 1402A and 1402B may communicate the ingress network traffic 1450A to an ingress network stack 1404A or 1404B (generally, ingress network stacks 1404 or stacks 1404). The ingress network stacks 1404 may then communicate data cells 1452 representative of the traffic 1450A to the interconnect 111. An example of the interconnect 111 is described with reference to FIGS. 4-6 and throughout this disclosure. The interconnect 111 may then forward the data cells 1452 to egress network stacks 1405A and 1405B (generally, egress network stacks 1405 or stacks 1405). The egress network stacks 1405 may communicate the data cells 1452 to egress ports 1407A and 1407B (generally, egress port 1407 or egress ports 1407). The egress ports 1407 may include physical ports or logical ports. The egress ports 1407 may then communicate traffic 1450B, which may be egress traffic, to TX/RXs 1414C and 1414D and to a second data network 1401B and a fourth data network 1401D.

The interconnect 111, which includes the switch 418 and the adaptive router 552 as described elsewhere in this disclosure, may be implemented across multiple FPGA devices in the forwarding plane 1302. For example, the interconnect 111 may implement the in ports 414 and out ports 420 described above to communicate between the FPGA devices. Accordingly, the adaptive router 552 may forward the data cells 1452 to the egress network stacks 1405A, which may be implemented in one of the FPGA devices that includes the ingress port 1402A. In addition, in circumstances in which one or more of the data cells 1452 are routed to one of one of the egress ports 1407 (e.g., 1407B) in another of the FPGA devices, the switch 418 may route the data cells 1452 to the egress network stacks 1405 (e.g., the egress network stack 1405B) and the egress port 1407 related to the egress network stack 1405 regardless of which of the FPGA devices these components are implemented within.

The ingress network stacks 1404 of FIG. 14 may be implemented as computing elements such as internetworking kernels. Additionally, the ingress network stacks 1404 may be implemented as fixed logic, which may be non-programmable. The ingress network stacks 1404 may include routing tables 1418, an address lookup 1406, an encapsulator 1408, and a traffic manager 1410. The routing tables 1418 may be accessed by the address lookup 1406 to determine a destination of a packet or a frame included in the ingress network traffic 1450A. The encapsulator 1408 may be configured to encapsulate PDUs of the ingress network traffic 1450A as the data cells 1452. The data cells 1452 may be forwarded to the traffic manager 1410.

The traffic manager 1410 may be configured to determine a routing priority for the data cells 1452. In some embodiments, the traffic manager 1410 may be configured to perform a statistical multiplexing or a round robin scheduling from which the routing priority is determined. In these and other embodiments, based on the statistical multiplexing or a round robin scheduling, the data cells 1452 may be routed through the adaptive router 552, which is described above with reference to FIGS. 4, 5, and 6. The adaptive router 552 may then forward the data cells 1452 to the switch 418 and the egress network stack 1405A.

In some embodiments, the traffic manager 1410 may determine routing priority based on a quality of service (QoS) agreement or another routing protocol. The QoS may be based on a per flow packet classification, per flow forwarding or queuing according to the protocol identifiers, a priority based arbitration, a guaranteed input and output port bandwidth reservations, or some combination thereof. A number of identifiers may be limited by the size of the internal and external memories (e.g., 104 and 107 of FIG. 1 and "memory 107/104" in FIG. 14) of the forwarding plane 1302. In these and other embodiments, based on the QoS, the data cells 1452 may be routed through the adaptive router 552, then to the switch 418, and the egress network stack 1405A.

In some embodiments, instead of the traffic manager 1410 receiving data cells 1452 from the encapsulator 1408, the traffic manager 1410 may route packets of the traffic 1450A (e.g., assign a QoS identifier or a routing priority indicator). The packets may then proceed to the encapsulator 1408. The encapsulator 1408 may then communicate the data cells 1452 to the adaptive router 552.

The egress network stacks 1405 of FIG. 14 may be implemented as computing elements such as internetworking kernels and may be implemented as fixed logic, which may be non-programmable. The egress network stacks 1405 may include a bandwidth aggregator 1420, a decapsulator 1422, and a framer 1424. The bandwidth aggregator 1420 may receive the data cells 1452. The bandwidth aggregator 1420 may be configured to hold the data cells 1452 for a particular period of time, which may control rates at which the data cells 1452 proceed through the egress network stack 1405.

Additionally or alternatively, the bandwidth aggregator 1420 may provide bandwidth aggregation, per egress port bandwidth reservation, and scheduling according to rates of the traffic 1450A. For example, the bandwidth aggregator 1420 may schedule the data cells 1452 from one or both of the ingress ports 1402 into the second data network 1401B based on the reserved bandwidth of a client. Additionally, the bandwidth aggregator 1420 may aggregate portions of the traffic 1450A from multiple clients onto one of the egress ports 1407 based on reserved bandwidth of the clients and/or physically available bandwidth of the egress ports 1407. For example, if a reserved bandwidth exceeds one port physical bandwidth (e.g., oversubscription), then any excess traffic may be dropped to reduce conflicts with other client traffic. Some additional example aggregations performed by the bandwidth aggregator may include: 10×1 GE aggregated into 10GE; 10×10 GE or 100×1 GE aggregated into 100 GE; 4×100 GE, 40×10 GE, or 400 1 GE aggregated into 400 GE and higher aggregate baud rate Ethernet data network. A similar aggregation and payload switching scheme can be implemented at the OTN baud rates hierarchy for transport network as well as any network.

The decapsulator 1422 may receive the data cells 1452 and may remove the PDUs from the data cells 1452. The decapsulator 1422 may forward the PDUs to the framer 1424. The framer 1424 may include an OTU framer or another framer that structures or configures the PDUs for communication on the second data network 1401B and/or the fourth data network 1401D. The framer may structure the PDUs according to any protocol in which the traffic 1450B is formatted in the data networks 1401.

In some embodiments, the memory 107/104 may be implemented in the forwarding plane 1302. The memory 107/104 may provide one or more data memory buffers. The data memory buffers may be configured to buffer for portions of the traffic 1450A. For example, the memory 107/104 may be configured to buffer packets or frames of the traffic 1450A.

Pipe objects 1413 may be implemented in the forwarding plane 1302. The pipe objects 1413 may interface directly into the interconnect 111 and between two or more computing elements (in FIG. 14, the ingress network stack 1404B and the egress network stack 1405B). The pipe objects 1413 may be configured to multiplex/demultiplex portions of the traffic 1450A. For instances, the pipe objects 1413 may be configured to receive portions of the traffic 1450A at one or more of the ingress ports 1402. The pipe objects 1413 may multiplex the received portion of the traffic 1450A and forward it to the interconnect 111. Additionally or alternatively, the pipe objects 1413 may be configured to forward portions of the data cells 1452 and/or the traffic 1450A to the egress network stack 1405B or the egress port 1407B.

In FIG. 14, boxes 1421 represent an example minimum set of computing elements or kernels for implementation of a networking application in the forwarding plane 1302. The minimum set (hereinafter, referenced with 1421) include a collection of internetworking computing elements that occupy one or more FPGA devices and that may be scaled to create larger networking components. By scaling the minimum set 1421, the forwarding plane 1302 may be configured as a distributed architecture or a simple architecture including a single minimum set 1421. The type of architecture may be based on the networking application source code and processing specifications.

For example, using the minimum set 1421, a line card and a network element may be produced. Like the forwarding plane 1302, the line card and/or the network element may be fully programmable and include an array of the FPGA devices as described above. The line card and the network element may function as an internetworking function between different encapsulation and framing protocols, to transport and route the PDUs, to encapsulate a client Ethernet frame into an OTUx frame with multiple client frames at one or more rates, etc.

Figure 15A:
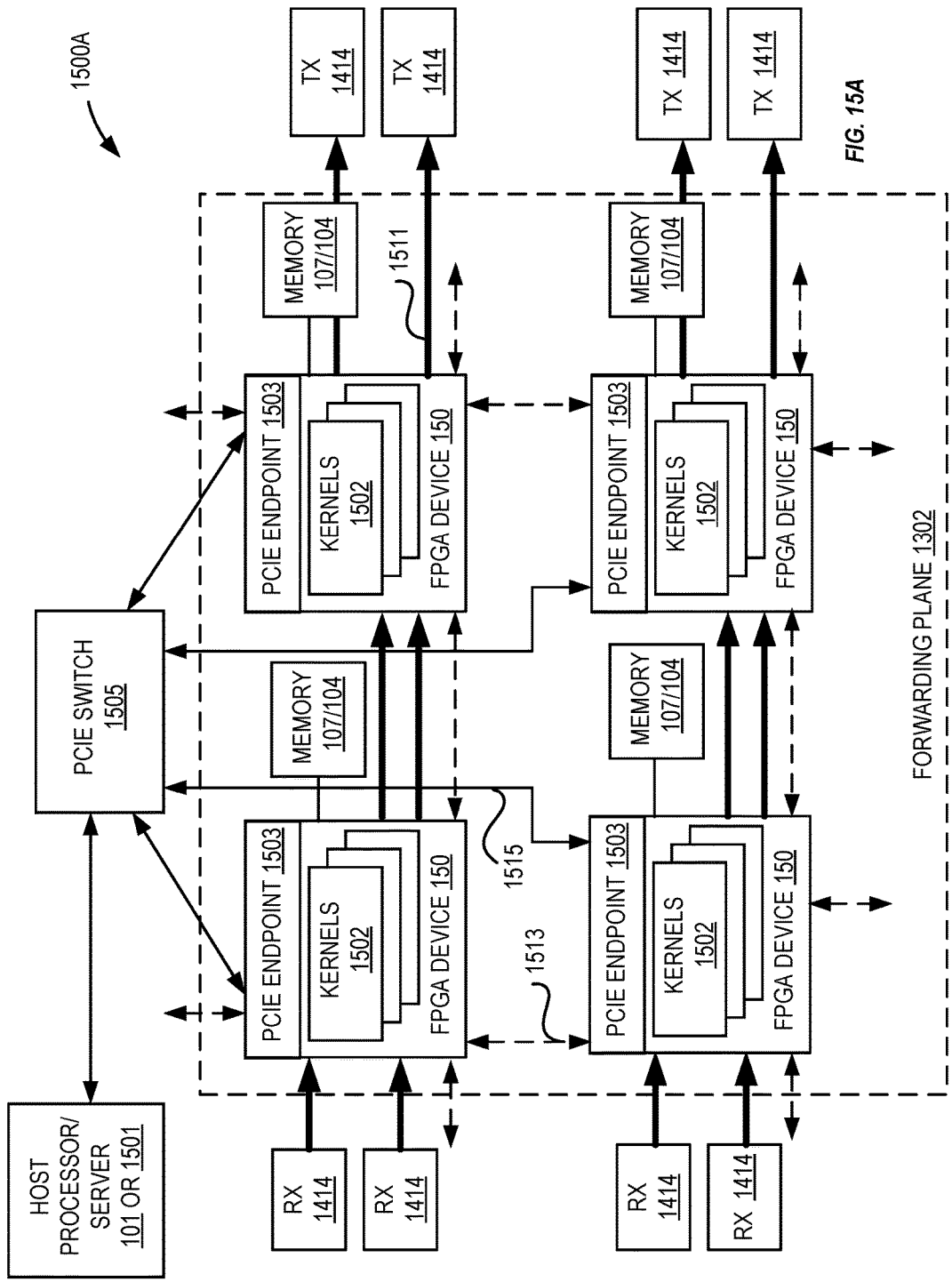
FIG. 15A represents example forwarding process that may be implemented the forwarding plane of FIG. 13.
Figure 15B:
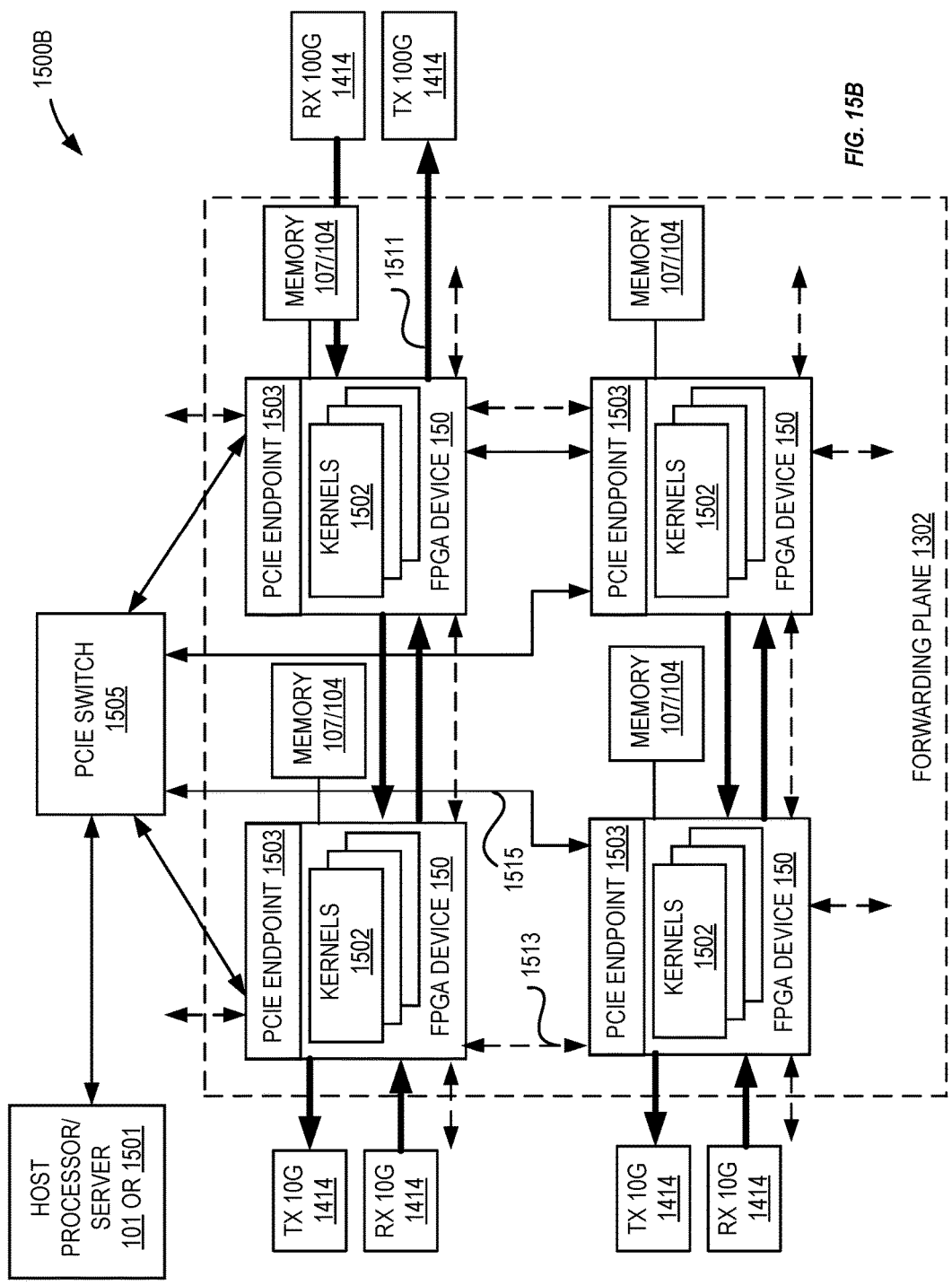
FIG. 15B represent another example forwarding process that may be implemented the forwarding plane of FIG. 13.

FIGS. 15A and 15B represent example forwarding processes 1500A and 1500B that may be implemented in an example embodiment of the forwarding plane 1302 described elsewhere in this disclosure. In the forwarding plane 1302 of FIGS. 15A and 15B, individual FPGA devices 150 are depicted. The FPGA devices 150 include kernels 1502 that may include one or more of the computing elements that are implemented as an ingress network stack, an egress network stack, an ingress port, an egress port, pipe objects, or portions of the interconnect such as the ingress network stack 1404, the egress network stack 1405, the ingress port 1402, the egress port 1407, the pipe objects 1413, or portions of the interconnect 111 described elsewhere in this disclosure.

In addition, a PCIe switch 1505 may be communicatively connected to the host processor 101 and/or a server 1501. The PCIe switch 1505 may communicate with PCIe endpoints 1503 that may be included in the FPGA devices 150. In FIGS. 15A and 15B, each of the FPGA devices 150 includes one of the PCIe endpoints 1503. In some embodiments, one or more of the FPGA devices 150 may include the PCIe endpoints 1503. In addition, in some embodiments, the FPGA devices 150 may include another suitable control plane interface that may communicate directly with the host processor 101 and/or a server 150.

The forwarding plane 1302 may include multiple interconnects 1511, 1513, and 1515. In FIGS. 15A and 15B, small cell interconnects 1513 are represented by dashed arrows, one of which is labelled 1513. Data interconnects 1511 are represented by heavy weight arrows, one of which is labelled 1511. PCIe links 1515 are represented by light weight arrows, one of which is labelled 1515.

In the embodiments depicted in FIGS. 15A and 15B, the PCIe links 1515 may be included in a control plane (e.g., the control plane 1308 of FIG. 13). In other embodiments one or more of the PCIe links 1515 may be included in the forwarding plane 1302.

In FIG. 15A, the data interconnects 1511 represent a forwarding from ingress ports to egress ports. In particular, the TX/RX 1414 on a left portion of FIG. 15A (labeled "RX") may be receivers and the TX/RX 1414 on the right portion of FIG. 15A (labeled "TX") may be transmitters. Thus, traffic may be forwarded from the TX/RX 1414 on the left portion to the TX/RX 1414 on the right portion.

Although not explicitly illustrated, the data interconnects 1511 may be configured to forward data from the TX/RX 1414 on the right portion of FIG. 15A to the TX/RX 1414 on the left portion of FIG. 15A. For instance, the TX/RX 1414 may include transceivers (e.g., transmitter components and receiver components) and the kernels 1502 in the FPGA devices 150 may be configured as egress ports and ingress ports that may enable the communication from the from the TX/RX 1414 on the right portion of FIG. 15A to the TX/RX 1414 on the left portion of FIG. 15A and vice versa.

In FIG. 15B, the data interconnects 1511 represent bidirectional forwarding from 2 10 G ingress ports to one 100G egress port. In particular, the TX/RX 1414 on a left portion of FIG. 15B may be 10 G receivers and 10 G transmitters (labeled "RX 10 G" and "TX 10 G" respectively) the TX/RX 1414 on the right portion of FIG. 15B may be 100 G receivers and 100 G transmitters (labeled "RX 100 G" and "TX 100 G" respectively). Thus, traffic may be received from RX 100 G 1414 and communicated to one or more 10 G TX 1414. Similarly, traffic may be received at the 10 G RX 1414 and aggregated and forwarded to the TX 100 G 1414 transmitters.

Figure 16:
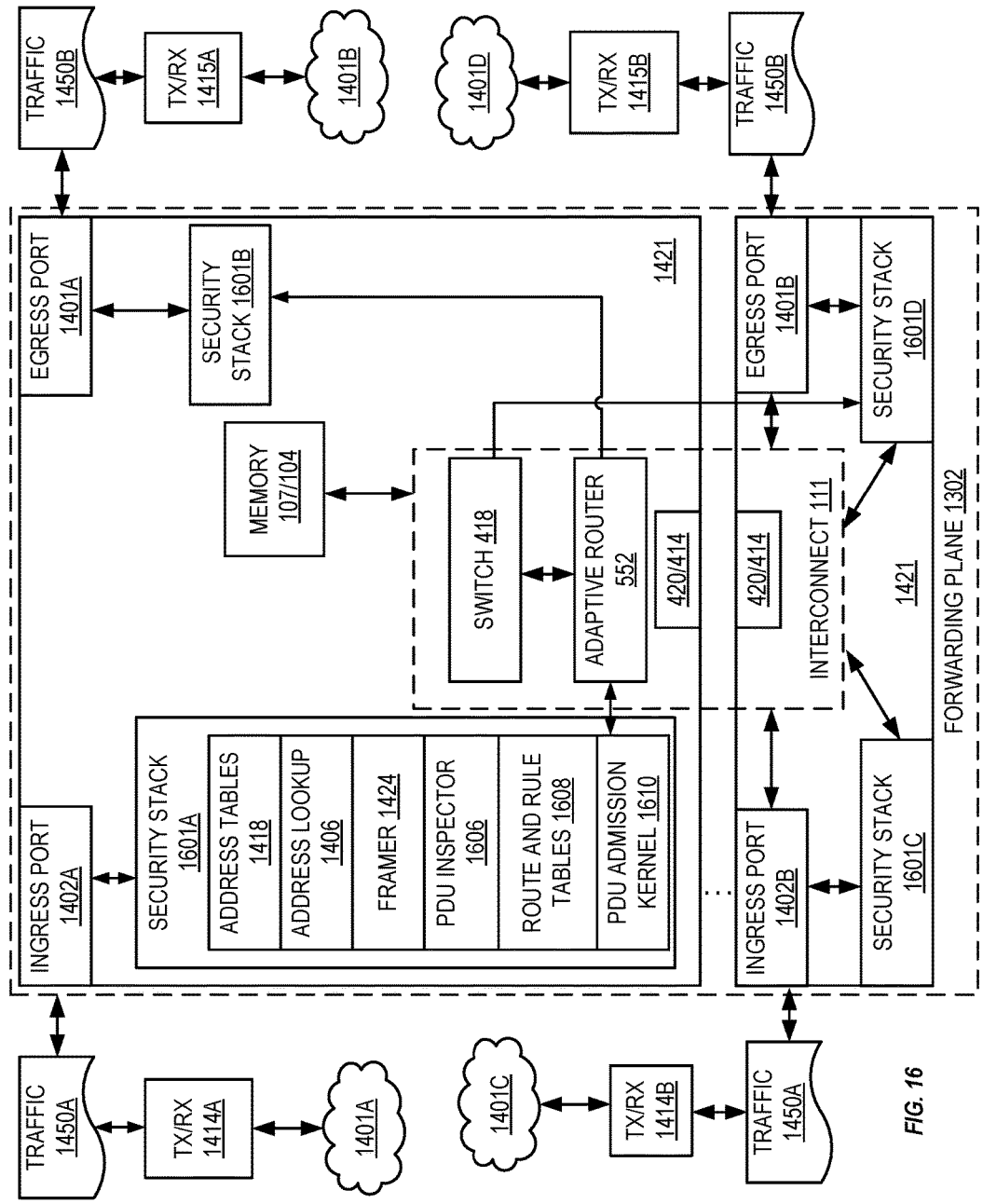
FIG. 16 illustrates another example embodiment of the forwarding plane of FIG. 13.

FIG. 16 illustrates an example embodiment of the forwarding plane 1302 of FIG. 13. The forwarding plane 1302 may be implemented in one or more FPGA devices 150 that may be configured in one or more of the arrays 200, 700, 800, 900, and 1000. The forwarding plane 1302 may be implemented between one or more data networks 1401. The forwarding plane 1302 includes the interconnect 111, the in ports 414, the out ports 420, the adaptive router 552, the switch 418, and the memory 107/104.

In the embodiment of FIG. 16, the forwarding plane 1302 or components thereof may be configured to provide network security. In particular, the forwarding plane 1302 may include multiple ingress ports 1402 and egress ports 1401 that are configured to receive traffic 1450A and/or 1450B. The forwarding plane 1302 may include security stacks 1601A-1601D (generally, security stack 1601 or security stacks 1601). The security stacks 1601 may be configured to perform traffic inspection and alarm processes in parallel to received traffic 1450. The forwarding plane 1302 may execute the inspection at a full line rate speed. For example, the forwarding plane 1302 may be implemented between a WAN and a LAN. By performing the inspection at full line rate speed, the inspection does not impede the WAN and LAN traffic.

The inspection may include performance of a search of each packet or frame included in the traffic 1450 in parallel by the security stacks 1601. The search may be performed to identify frames or packets that include malicious data such as contaminated data, data that includes a threat (e.g., a virus, malware, worms, spyware, spamware, adware, a Trojan horse), or some combination thereof. In response to a packet or a frame including malicious data, the packet or the frame may be dropped prior to being forwarded through the forwarding plane 1302.

Dropping the packet or the frame prior to being forwarded through the forwarding plane 1302 may offer multiple benefits over a firewall. For example, in a system implementing a firewall, an attacking packet has already reached a server hardware by the time it is identified as an attacking packet. In contrast, in the forwarding plane 1302, an attacking packet may be dropped such that it does not reach a server or a datacenter, which may reduce damage and may localize spread of the attack. Additionally, in systems implementing a firewall, the firewall may act as a point of congestion. Accordingly, an example benefit over the firewall is the inspection performed by the forwarding plane 1302 is performed in parallel by the security stacks 1601. Thus, the inspection may be performed at a line rate of the traffic 1450A/1450B.

In addition, the security stacks 1601 may be configured to share information pertaining to the malicious data. For instance, in the embodiment of FIG. 16, the information pertaining to the malicious data may be communicated to one or more of the ingress ports 1402 and the egress ports 1401 via the interconnect 111. Thus, an attack detected at one of the ingress ports 1402 may result in an alarm at one or more of the other ingress and egress ports 1402 and 1401. In some embodiments, the information shared among the ingress and egress ports 1402 and 1401 may include an attack pattern, an offending source address, a type of attack, and the like.

In addition, the memory 107/104 may be configured to maintain a list of attack patterns. In some embodiments, in the list of attack patterns, there may be a particular number (e.g., 10, 100, etc.), most recent, most harmful, etc. attack patterns. The particular number may be based on capacity of the memory 107/104.

The forwarding plane 1302 of FIG. 16 includes the security stacks 1601. The security stacks 1601 of FIG. 16 may include computing elements such as kernels. The security stacks 1601 may include the routing tables 1418, the address lookup 1406, and the framer 1424 of FIG. 14. In addition, the security stacks 1601 may include a PDU inspector 1606, a route and rule table 1608, and a PDU admission kernel 1610.

In some embodiments, the traffic 1450A received by the ingress port 1402A may route a portion of the traffic 1450A to the security stack 1601A and to the PDU inspector 1606 included therein. The PDU inspector 1606 may be configured to search the packets and the frames included in the received traffic 1450A/1450B. The searches of the packets and the frames may be based on rules. The rules may indicate particular sequences or patterns in the traffic 1450A/1450B that are indicative of malicious data. The rules may be included in the route and rule table 1608. The PDU inspector 1606 may access the rules from the route and rule table 1608. In some embodiments, the rules may be provided by a client.

In response to the search resulting in normal data, PDUs included in the traffic 1450A/1450B may be forwarded as described with reference to FIGS. 14-15B. For instance, the PDUs may be encapsulated in data cells of a chosen cell size to one or more of the egress ports 1401. In some embodiments, in response to the search resulting in normal data, PDUs may be communicated to the PDU admission kernel 1610 which may route the PDU through the forwarding plane 1302 via the framer 1424.

In response to the search resulting in an identification of malicious data, the PDU inspector 1606 may communicate an alarm signal and information indicative of the malicious data. For example, the alarm and the information may be communicated to the interconnect 111. The interconnect 111 may replicate and broadcast the alarm and the information to the other ingress ports 1402, the egress ports 1401, other PDU inspector computing elements 1606, the memory 107/104, other security computing elements, or some combination thereof.

The memory 107/104 may be configured to store information similar to the route and rules table 1608. The memory 107/104 may be updated and configured to learn and adapt based on identified malicious data in the traffic 1450A/1450B.

In addition, the memory 107/104 may include one or more packet or frame buffers. When a packet or a frame is identified to include the malicious data, it may be forwarded to the packet or frame buffers instead of being forwarded through the forwarding plane 1302. The packet or frame buffers may allow the malicious data to be stored or to be written over or to be dropped the packet or the frame from the traffic 1450A.

In the embodiment of FIG. 16, the security stacks 1601 may be implemented just following the ports 1402 and 1401. For example, a second security stack 1601B may be implemented between the egress port 1401A and the interconnect 111. The second security stack 1601B may be configured to inspect traffic 1450B received at the egress port 1401A which may be originating from secure network domain by an internal attacker.

Figure 18:
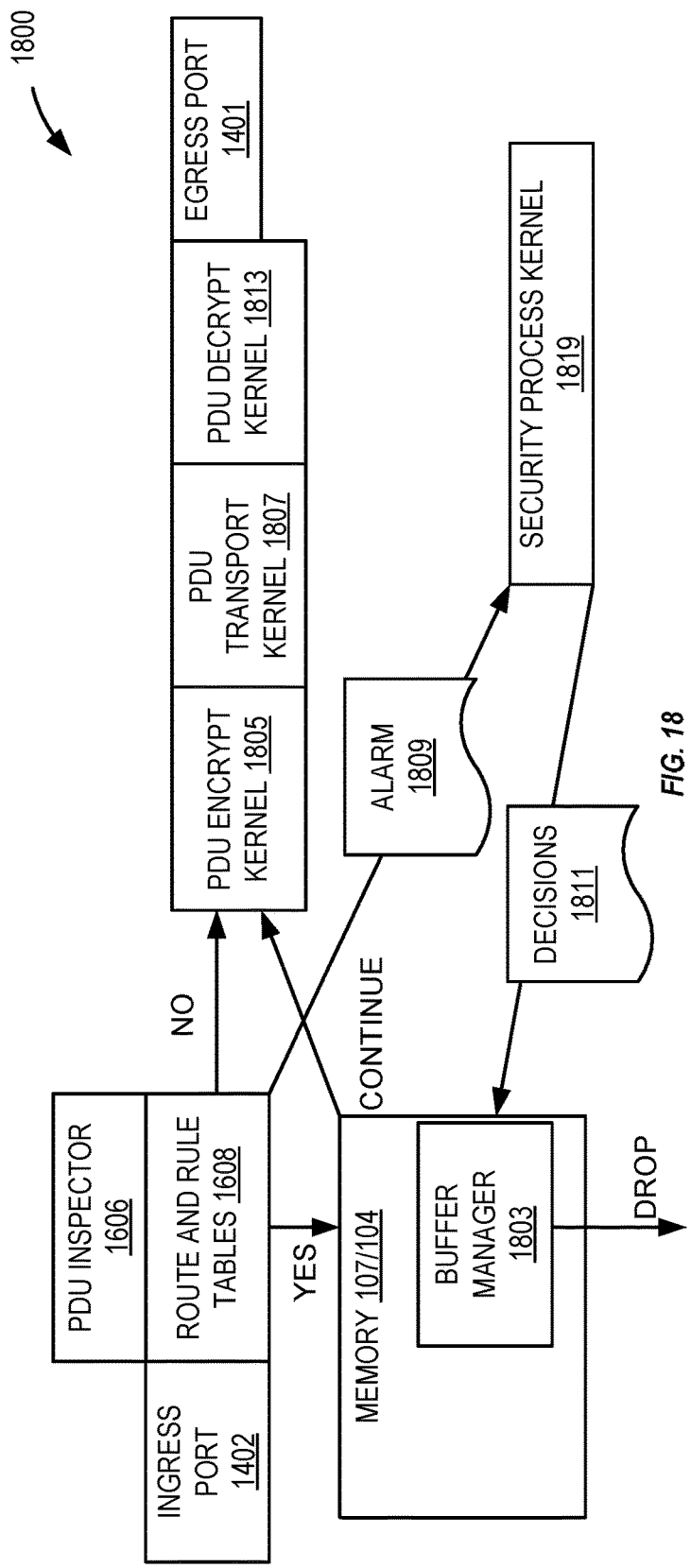
FIG. 18 illustrates an example inspection process that may be implemented in the forwarding plane of FIG. 16.

FIG. 18 illustrates an example inspection process 1800 that may be implemented in the forwarding plane 1302 of FIG. 16. In FIG. 18, the ingress port 1402, the egress port 1401, the memory 107/104, the PDU inspector 1606, and the route and rule tables 1608 may perform the inspection process 1800. In addition, the embodiment of FIG. 18 may include a buffer manager 1803, a PDU encrypt kernel 1805, a PDU transport kernel 1807, a PDU decrypt kernel 1813, and a security process 1819. The inspection process 1800 is depicted in an ingress direction (e.g., from the ingress port 1402 to the egress port 1401).

In the inspection process 1800, each packet or frame may be inspected by the PDU inspector 1606 and the route and rule tables 1608. In response to the packet or frame including malicious data ("YES" in FIG. 18), the PDU inspector 1606 may communicate an alarm 1809 to the security process 1819. The PDU inspector 1606 may forward the packet or frame including the malicious data to the buffer manager 1803. In response to the packet or frame not including the malicious data ("NO" in FIG. 18), the PDU inspector 1606 may communicate the packet or frame to the PDU encrypt kernel 1805.

The security process 1819 may determine whether the packet or frame including malicious data includes an actual threat. The security process 1819 may communicate a decision 1811 to the memory 107/104 and the buffer manager 1803. Based on the decision 1811, the buffer manager 1803 may drop the packet or frame or communicate the frame or the packet to the PDU encrypt kernel 1805. In particular, if the decision 1811 confirms the presence of the malicious data, the packet or frame is dropped ("DROP" in FIG. 18). If the decision 1811 indicates an absence of the malicious data, the packet or frame may be forwarded to the PDU encrypt kernel 1805 ("CONTINUE" in FIG. 18).

The security process 1819 may reside on a host processor (e.g., the host processor 101 described above) running a control plane or may be running on one or more of the FPGA devices of a forwarding plane implementing the inspection process 1800.

The PDU encrypt kernel 1805 may encrypt the packet or frame or PDUs included therein. The PDU encrypt kernel 1805 may communicate the encrypted portions and non-encrypted portions to the PDU transport kernel 1807. The PDU transport kernel 1807 may then communicate the encrypted portions and non-encrypted portions to the egress port 1401 as described elsewhere in this disclosure. The PDU decrypt kernel 1813 may be configured to decrypt traffic received at the egress port 1401 or some portion thereof.

Figure 17:
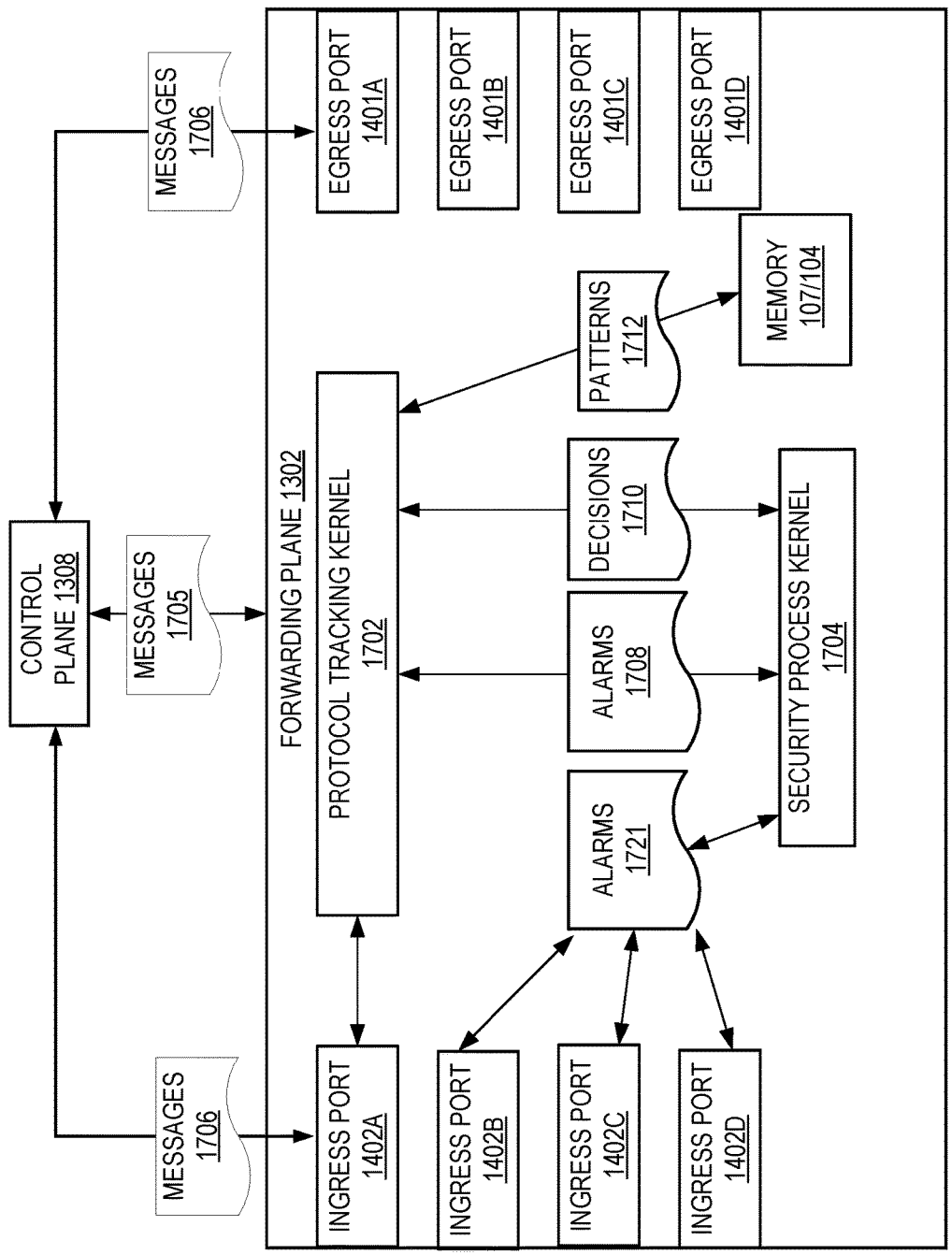
FIG. 17 illustrates another example embodiment of the forwarding plane of FIG. 13.

FIG. 17 illustrates an example embodiment of the forwarding plane 1302 including control plane network security. In FIG. 17, the forwarding plane 1302 is depicted with the control plane 1308. The control plane 1308 may communicate messages 1705 and 1706 to the ingress ports 1402 and egress ports 1401. Additionally or alternatively, the messages 1705 and 1706 may be communicated directly to kernels of the forwarding plane 1302 via a PCIe interface as discussed elsewhere in this disclosure. For example, the messages 1705 and 1706 may include in line or direct commands, protocol signaling, and operations and maintenance (OAM) packets or frames that originate at a control plane 1308. The control plane network security may be based on tracking and searching the messages 1705 and 1706 for suspicious patterns.

The forwarding plane 1302 of FIG. 17 may include computing elements such as kernels that implement control plane network security. For example, the forwarding plane 1302 includes one or more protocol tracking kernels 1702, the memory 107/104, and one or more security process kernels 1704. The protocol tracking kernels 1702 and the protocol process kernel 1704 that search the messages 1705 and 1706 for suspicious patterns.

For example, the messages 1705 and 1706 follow a particular pattern within a predictable time or within some time bounds. A process of receiving and transmitting the messages 1705 and 1706 can be described by a state diagram with some time limits on state transitions. The protocol tracking kernels 1702 may be configured to monitor the protocol state, transitions thereof, and the control messages 1705 and 1706 of a protocol implemented in the forwarding plane 1302. For example, the protocol tracking kernels 1702 determine an expected time window within which a set or series of the messages 1705 and 1706 are expected to proceed. In embodiments implementing multiple protocol tracking kernels 1702, the multiple protocol tracking kernels 1702 may operate in parallel, and may monitor multiple independent state diagrams (e.g., based on a source address of a set of the messages 1705 and 1706). Thus, multiple protocols may be simultaneously tracked without impeding traffic though the forwarding plane 1302 at line rate.

Suspicious data may be detected by unusual requests that deviate from the normal or allowed state transition diagram or the messages 1705 and 1706 outside of the expected state pattern or time window. In response to the protocol tracking kernels 1702 identifying a suspicious behavior, the protocol tracking kernel 1702 may communicate an alarm 1708 to the security process kernels 1704. The security process kernel 1704 may make a determination as to whether the suspicious behavior is an actual threat. For example, the security process kernels 1704 may access operating conditions of the forwarding plane 1302. Based on the operating conditions, the security process kernels 1704 may determine whether the failure to communicate one of the messages 1705 and 1706 is because an overall traffic load, processing issue, etc.

When the suspicious behavior is an actual threat, the security process kernels 1704 may communicate a decision 1710 to the protocol tracking kernel 1702. The decision 1710 may then change a state of the forwarding plane 1302. For example, the protocol tracking kernels 1702 and/or the security process kernels 1704 may block traffic that resembles the attack pattern from an originating sender and from one or more other sources that resemble the attack pattern. The security process kernels 1704 may also record the attack pattern. For example, the patterns 1712 that have been identified as a threat and/or information indicative thereof may be communicated to the memory 107/104.

In addition, the security process kernels 1704 may communicate alarms 1721 to the other ingress ports 1402B-1402D. Although not shown in FIG. 17, the alarm 1721 may also be communicated to the egress ports 1401 and/or the control plane 1308. There may be no actual traffic is sent to the control plane 1308 to eliminate possibility of a sophisticated attack mimicking as another attack pattern.

The forwarding plane 1302 based on the FPGA array (e.g., 200, 700, 800, 900, 1000 described in this disclosure) may provide sufficient computational power to run multiple instances of the protocol tracking kernel 1702 and a protocol process kernel 1704. The multiple protocol tracking kernel 1702 and a protocol process kernel 1704 may be configured to identify known protocol intrusion patterns in parallel rather than using a sequential program running on a host processor or server. The parallel approach reduces a time involved in identification proportional to a number of parallel instances running on the FPGA array. Additionally, implementation by the FPGA array may provide a global perspective or a global view on a larger portion or an entire network which is not available in a single instance of a Firewall per each server.

In some embodiments, the control plane 1308 may be implemented in an SDN controller. Security of the SDN controller and the control plane 1308 may limit adoption of the SDN certain fields such as government networks, financial networks, and healthcare networks that are sensitive to data security and privacy.

Figure 19:
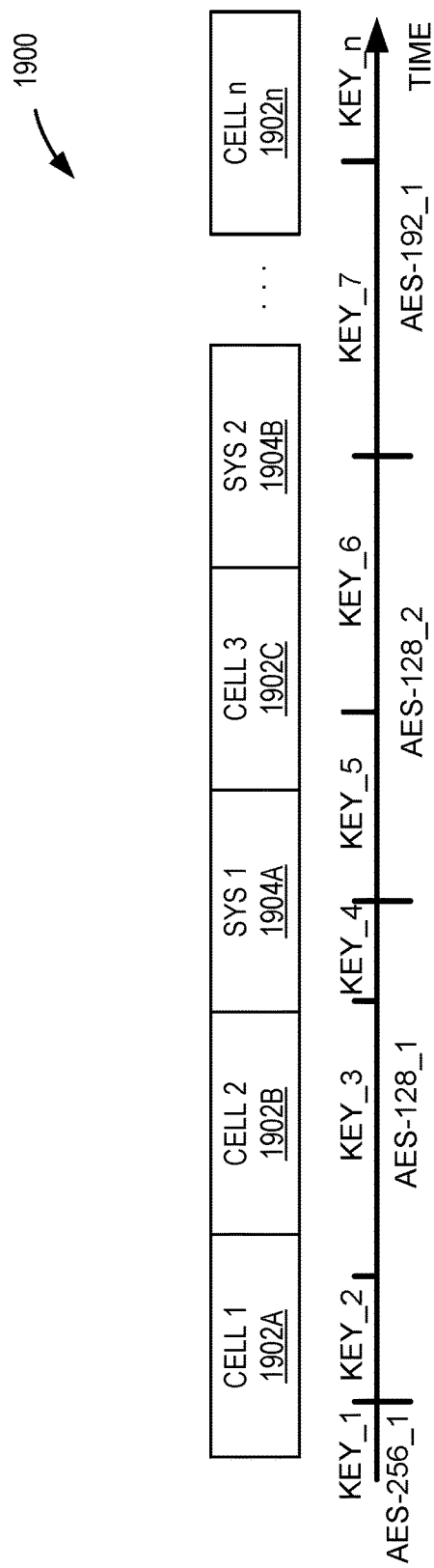
FIG. 19 illustrates example physical layer security that may be implemented in an FPGA array or the forwarding planes of FIG. 13.

FIG. 19 illustrates example physical layer security 1900 that may be implemented in the FPGA array (e.g., 200, 700, 800, 900, and 1000 described in this disclosure) and/or one or more of the forwarding planes 1302 described in this disclosure. The physical layer security 1900 prevents decoding electrical and optical signals of the interconnect 111 of FIGS. 4-6 and portions of a network spanned by the interconnect 111 in the event of physical intrusion into equipment.

In the example depicted in FIG. 19, data at the physical layer may be encapsulated and transmitted as data cells 1902A-1902n (generally, data cell 1902 or cells 1902) across the interconnect 111. The data cells 1902 may be encrypted by one of the techniques from the Advanced Encrypted Standards (AES) list. Some additional details of the AES list may be found at http://csrc.nist.gov/groups/STM/cavp/documents/aes/aesval.html which is incorporated herein by reference in its entirety. The physical layer security 1900 includes hiding a transmission technique of the data cells 1902 behind a dynamic AES encryption and dynamic keys.

In particular, in the physical layer security 1900 the transmission technique may include choosing the set of keys and change of the encryption algorithm dynamically over the interconnect port subset (spatial division) and over time (time division). In addition the transmission technique also includes varying a size of data cells 1902. The security keys may not be available to originator or addressee of the traffic.

Figure 20:
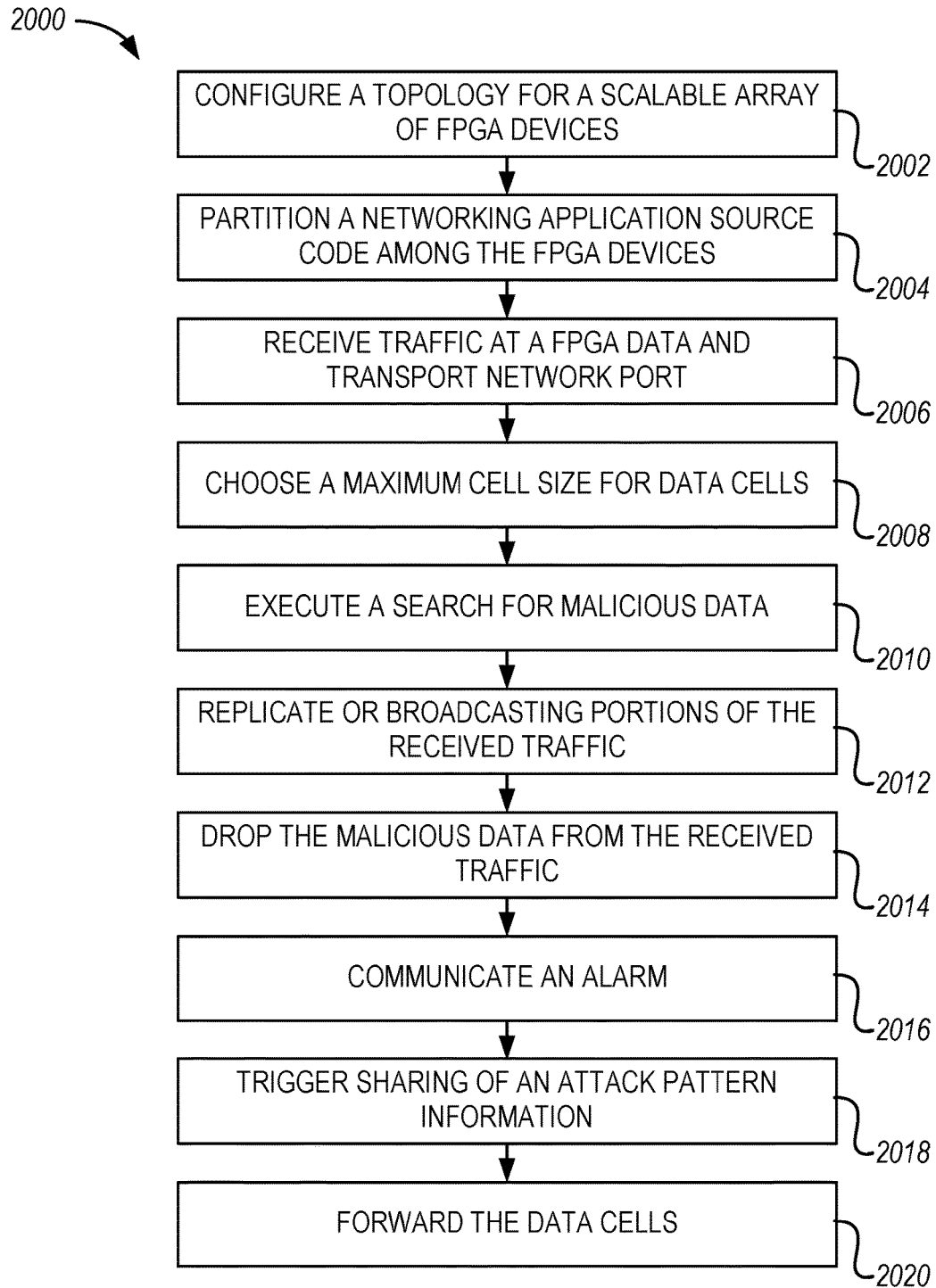
FIG. 20 is a flow chart of an example method of executing a networking application in a forwarding plane.

FIG. 20 is a flow chart of an example method 2000 of executing a networking application in a forwarding plane. The method 2000 may be at least partially programmably performed in some embodiments by the topology/partitioning module 322 described with reference to FIG. 3. In some embodiments, the topology/partitioning module 322 or the computing device 320 may include or may be communicatively coupled to a non-transitory computer-readable medium (e.g., the memory 326 of FIG. 3) having stored thereon programming code or instructions that are executable by a processor (such as the processor 328 of FIG. 3) to cause a computing device 320 and/or the topology/partitioning module 322 to perform at least a portion of the method 2000. Additionally or alternatively, the computing device 320 may include the processor 328 described above that is configured to execute computer instructions to cause the topology/partitioning module 322 or another computing device to perform the method 2000. Although illustrated as discrete blocks, various blocks may be divided into additional blocks, combined into fewer blocks, or eliminated, depending on the desired implementation.

The method 2000 may begin at block 2002 in which a topology for a scalable array of FPGA devices is configured. The topology may be based on an estimated dataflow rate and a determination of whether each of the FPGA devices is capable of achieving a processing specification. The processing specification may include a number of packets per second arriving at a network node, a number of packets leaving a network node, an instantaneous bit-rate of the ingress network traffic, a traffic content, an implemented protocol, or some combination thereof.

At block 2004, the networking application source code may be partitioned among the FPGA devices of the topology for the array. The networking application source code may be partitioned based on data rates of the computing elements of the networking application source code, computational performance of the FPGA devices, and input/output (I/O) bandwidth of the FPGA devices. At block 2006, traffic may be received at a first of one or more FPGA data and transport network ports of the scalable array from a first data network.

At block 2008, a maximum cell size may be chosen for data cells that encapsulate payload data units (PDUs) of the traffic. In some embodiments, the cell size may be chosen based on a dominant traffic content of a particular type of the ingress network traffic received at the array, a dominant traffic content of a particular type of the ingress network traffic received at a particular port of the global in ports, a dominant traffic content of one or more global in ports reserved by a particular client, or some combination thereof. In these and other embodiments, method 2000 may further comprise adjusting remaining traffic content other than the dominant traffic content included in the ingress network traffic to use the chosen cell size.

At block 2010, a search may be executed, in parallel, for malicious data. The search may be executed of the received traffic at the full line rate speed. At block 2012, portions of the received traffic may be replicated and/or broadcast to multiple parallel PDU inspector computing elements. At block 2014, the malicious data may be dropped from the received traffic. At block 2016, an alarm may be communicated to other PDU inspector computing elements and to a disaggregated network control plane. At block 2018, sharing of an attack pattern information may be triggered with the other PDU inspector computing elements.

At block 2020, the data cells may be forwarded. For example, the data cells may be at least partially forwarded through an array interconnect implemented in scalable array to another of the FPGA data and transport network ports and to a second data network.

In some embodiments, in line or direct commands, protocol signaling, and operations and maintenance (OAM) cells, may be received that originate at a disaggregated network control plane without a host processor. Additionally, in these embodiments, in line or direct commands, protocol signaling, and OAM cells may be sent out to the disaggregated network control plane without a host processor.

Figure 21:
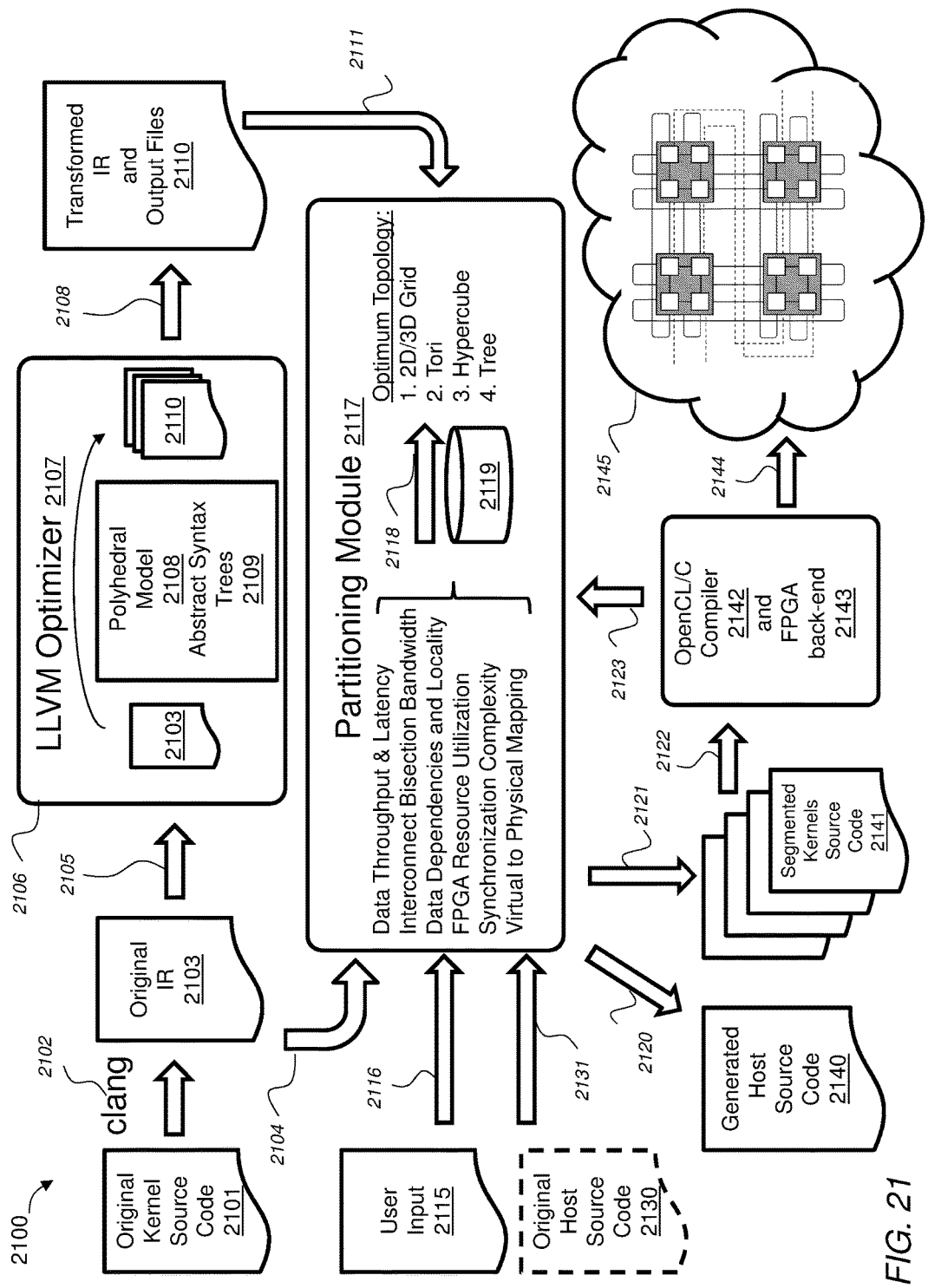
FIG. 21 is a block diagram of an example partitioning module with an example input and output files and indirect compilation and optimization.

FIG. 21 depicts an example process 2100 similar to the method 2000. The process 2100 may be at least partially programmably performed by the topology/partitioning module 322 described with reference to FIG. 3 or another suitable system or module. In some embodiments the topology/partitioning module 322 may produce an optimum physical or virtual topology or may map parallel or serial application or parallel or serial kernels onto fixed topology by processing the original source code 2101 of parallel kernels and optional host source code 2130.

User input 2115 may be collected by the partitioning module 2117 by presenting a user with the sequence of User Interface (UI) screens to determine processing specification 310 on FIG. 3. User input may determine critical processing specification parameters such as required latency, required throughput, required input data rate, required answer rate, or requirement of a particular input or output protocol for data, etc. However, if the user is not present or user chooses not to define programming specification partitioning module may automatically perform the best-effort partitioning on the default topology.

In some embodiments, the partitioning module 2117 may utilize open source tools such as LLVM compiler infrastructure. Some details of the LLVM compiler infrastructure are available at www.llvm.org. The LLVM compiler infrastructure may be implemented for indirect compilation and optimization, some details of which are described elsewhere herein. LLVM is a modular chain of software compilation, optimization and linking which utilizes target-independent codes called Intermediate Representation (IR) during the steps of software compilation. The IR code may be produced by a front-end compiler, followed by optimization by a llvm-opt or an external optimizer before finally lowering IR to the specific machine codes for linking and assembling by llvm-link, llvm-llc, or an external linker. In case of FPGAs, this last step may generate logic description of the parallel application in Hardware Description Languages (HDL) such as Verilog, System Verilog. VHDL, etc. The generated HDL may be then synthesized, mapped into FPGA logic, placed, and routed.

Partitioning module may not directly produce executable code or lowered HDL code for FPGAs. Instead, a partitioning module may invoke individual steps of the LLVM compilation or individual passes of each step of compilation to make decisions about transforming original source code into one or more segmented kernels per each FPGA. These code and data partitioning decisions may enable the entire array of FPGA devices to execute original application or kernel code with performance gains proportional to the number of FPGA devices in the array.

The OpenCL/C/C++, etc. FPGA compilers may not presently accept an IR or give user the choice of IR as the source code. Because of this limitation partitioner module may have to perform indirect compilation. However, when FPGA compilers start accepting IR as the source the partitioner module may submit original IR, modified IR, transformed IR, optimized IR, or a combination thereof for lowering to FPGA HDL codes directly.

By utilizing IR for indirect and direct compilation, much greater flexibility in choosing the programming languages or customer's legacy source codes, e.g. FORTRAN, or other languages may be achieved by the partitioner module. Additionally, greater flexibility in choosing optimization tools that support code optimization techniques may be gained.

Invoking LLVM compilation 2102 and optimization 2107 may allow partitioning module 2117 to obtain information about source code data flow and control flow, variables and buffers, memory accesses to private, local and global memories, data dependences, blocks of parallelizable code and schedule of execution. Additionally, LLVM optimizer 2107 may have extra passes performed by the external tools that may restructure parallel code and potentially may reduce execution time or reduce the number of memory accesses or reduce FPGA resource utilization or any combination thereof versus original user code. Invoking these optimization passes and external tools may produce code that may meet processing specification and fit into array of FPGAs with the least number of FPGAs. Otherwise, such optimum solution may not be possible due to limitations of conventional FPGA OpenCL and HLS compilers that are capable to compile and optimize code only for a single FPGA.

In some embodiments, open source software based on polyhedral model or some portions thereof may be used to perform one or more steps of the LLVM optimizer. For instance, if open source tool operates on a polyhedral model 2108 and may analyze data dependencies, transform loops with data dependencies per several loop optimization techniques, analyze memory accesses, and analyze program control flow based on abstract syntax trees (AST) 2109, and integer maps.

The results of open source polyhedral model optimization, or equivalent closed or open source tool, analysis may be presented to the partitioner module in the form of transformed IR code and other output files 2110. Partitioner module may invoke some of open source polyhedral model optimization passes to attempt distinct code optimization techniques. Partitioner module may examine the original IR 2103 and transformer IR codes 2110 and make decisions about transforming the source code for individual FPGA devices of the array in order to meet processing specification and obtain optimum topology of the array.

For example, examination of a number of required memory accesses, their locality and sequences in the original and optimized IR codes may allow a partitioner module to make determination whether code demand for memory bandwidth may exceed capabilities offered by single or multiple FPGAs. For example, in some FPGA computing, multiple kernel execution pipelines result from SIMD or work items and multiple instances of such kernel pipelines result from multiple compute units. If each kernel has multiple accesses to local or global memories, these accesses may saturate available memory bus, memory controller or memory chip bandwidth resulting is decrease in performance or so called stalls.

Depending on the ratio of demanded stall free bandwidth to the available memory bus bandwidth, it may be beneficial to spread or partition application into larger number of FPGAs in order to achieve higher performance, even at the expense of underutilization of the other FPGA resources. Some of the modern parallel applications have indicated an average of 5:1 ratio of demanded versus available memory bandwidth for single FPGA implementations. Due to the memory bandwidth demand, partitioner module may choose to split the iteration space of work items or work groups or compute units or combination thereof into more FPGAs each with additional external off-chip memory and additional on-chip local memory resources. Consequently, a partitioner module may analyze and sub-divide original data buffers into input memory buffers or intermediate result buffers or final result buffers or combination thereof among multiple FPGAs of chosen partitioning solution. The partitioner module may add new intermediate result buffers and pipe objects or split original intermediate result buffers into multiple buffers according to the process described on with reference to FIG. 3.

The partitioner module may split and add global memory buffers transparently such that an address of the individual global off-chip and on-chip memory buffers may be derived from the index or one or more dimensions of NDRange. A default method of address derivation or translation provided by the FPGA vendor or a custom address translation method may be chosen for memory buffers. The address translation may be hidden from the user or offered to be fully controlled by the user as one of the options in UI or a command line.

In some embodiments, in response to splitting parallel or serial kernels, the partitioner module may create one or more shared virtual or physical memory buffers with global addressed address offset explicitly calculated by pointer arithmetic. The partitioner module's main goal may be to meet the processing specification or achieve the highest performance for the best-effort partitioning regardless of the size of the memories, their address offsets or underutilization of other resources of FPGA.

The partitioner module may present to the user one or more reasons for such choice or quantify the performance gained by particular partitioning solution or an option to override high performance requirement priority relative to available memory bandwidth and size. Alternatively, user may be asked to reduce the number of memory accesses or to reduce the size of the memory buffers in the original source code.

In some embodiments, sub-ranges of the iteration indices may be translated into NDRange sub-ranges, into number of work items, work group sizes, number of compute units, some combination thereof, or the OpenCL or equivalent iteration sub-spaces of another parallel language. Additionally, invoking open source polyhedral model optimization tool or an equivalent closed or open source tool, the analysis of the program or kernel control flow and branches based on AST or other graphs may identify blocks of code that may have to be executed in certain sequence. Thus, by the partitioning module may derive scheduling of these blocks that govern execution of the entire application by the array of the FPGA devices.

In some embodiments, a derived execution schedule may result in automatically generated synchronization kernels (e.g., 372A and 372B of FIG. 3) that may implement master-slave or user provided synchronization schemes appropriate for the application running on the array of FPGA devices. The derived execution schedule may be translated into standard OpenCL contexts, queues, events, or wait lists and corresponding host or kernel control flow code using standard API.

An analysis similar to open source polyhedral model optimization may be performed by other open source and/or closed source tools. Such partitioning of the control and data flow may be performed not only for the host and computing devices of OpenCL platform model but for a standalone array of the FPGA devices without host for applications executing both control and dataflow portions of the code by the FPGA devices. Moreover, the method 2000 and process 2100 may be applicable to partitioning of the parallel codes for other than FPGA devices such as CPUs, hybrid CPU-FPGA devices, GPUs, and application specific integrated circuits (ASICs) capable of parallel code execution.

In some embodiments, the partitioning module may read (represented in FIG. 21 by 2131) the original host source code 2130 as a baseline for determining control and dataflow of the entire application. Typically OpenCL host code may be structured and has predetermined sequences of application programming interface (API) calls. This structure of the API calls may be utilized for automatic generation of the host code.

After making decision on partitioning of the segmented kernels and dividing iteration space into sub-ranges, the partitioning module may generate new or modified host code while presenting the host with larger NDRange corresponding to the total available resources of some or all FPGAs in the array as one bigger FPGA. In some embodiments additional (API) extensions may be necessary to distribute synchronization messages such as barriers and fences among FPGA devices of the array and gather completion status and events. The memory management API may be modified or extended to support chosen transparent or custom global address translation from host address space into address space of the individual kernels or FPGAs including modifications for shared virtual or physical memory.

Synchronization mechanism and multiple master-slave kernels may involve an additional API interface or a shim software isolation layer to reduce the extent of modifications to OpenCL synchronization API or to avoid OpenCL API modifications visible to the user. Alternatively, user may be offered an option to insert custom synchronization mechanism into the code such as mutexes in global shared memory accessed across global interconnect by one or multiple kernels. In some embodiments, additional hardware logic residing on FPGAs or additional programmable logic or external chip, e.g. PCIe switch, or combination thereof may be utilized to group interrupts generated by the individual FPGA upon completion of the kernel execution and present a single interrupt to the host. Similarly the kernel API for launching kernel execution may have to be modified to broadcast or multicast kernel initialization, configuration and start messages and to gather up confirmation responses, status and events.

To clarify further, operation of the partitioning module 2117 may start from reading the original source code 2101 and parsing and compiling it at the step 2102 by CLANG or other parser or compiler that produces original IR code 2103. The original IR 2103 may be comprised of one or more text or binary files describing operation of original parallel kernel code or code of the entire application. Thus, complete functionality of the application code contained in the original IR may be parsed as one or more text or binary files and may be read into 2104 the partitioner module database 2119 as a baseline. Then the IR 2103 may be passed at the step 2105 to LLVM optimizer 2107 such as opt or another combination of the open and closed source tools or fully closed source proprietary tools.

Subsequently, results of one or more iterations performed by the partitioning module may be written into the database and compared to the baseline and chosen as the best solution. The additional iterations of partitioning module may take into account multiple topologies such as 2D or 3D grid, tori, hypercubes, trees, etc. Meeting or exceeding processing specification and achieving the highest performance for the best effort partitioning of the entire array of FPGA devices may have higher priority over optimizing the performance and utilization of the individual FPGA devices of the array.

In some embodiments, the physical and complexity limitations may have to be considered such as interconnect bisection, utilization of the dedicated or shared interconnect for data, data locality and dependencies, available FPGA resources, complexity of the synchronization, complexity of virtual to physical topology mapping. Combining these criteria and parameters and deriving solution for the maximum or best performance or meeting latency and data throughput of the processing specification may present high value for the users of the partitioner module as well as cloud application developers by isolating them from lower level specifics of hardware and presenting the array of FPGA devices as a software defined computing resource or a FPGA-as-a-service.

In some embodiments, CLANG may parse and compile OpenCL source into the original IR as the following command line: clang -S -emit-llvm -x cl kernel1.cl -o kernel.ll.

In some embodiments, IR files obtained 2111 during dependency analysis, parallelization or vectorization steps may contain enough information for partitioning module to make partitioning decision 2118 and choose topology, generate physical to virtual topology mapping files or routing tables or produce 2121 transformed and segmented kernels 2141 for individual FPGAs of the array. Finally, segmented kernels 2141 may be forwarded to standard OpenCL or HLS compilation by specific FPGA vendor compiler 2142 followed by FPGA back-end synthesis, place and route 2143. If the FPGA backend tools produce significantly different from estimated FPGA utilization results potentially resulting in no fit error, the partitioner module may be informed to re-run or choose different partitioning topology or produce different transformed or segmented kernels or combination thereof.

Results of the partitioner decisions may be presented to the user as UI screens with expected FPGA utilization, latency and throughput that quantify solution and chosen topology. For example charts, topology block diagrams or other visual aid may be utilized. These charts and diagrams may verify that processing specification was correctly entered by the user, correctly interpreted by the partitioner module and the results are acceptable. The verification or confirmation by the user step may be performed before committing chosen solution for FPGA synthesis, place and route, which may take a significant time (e.g. hours or even days) for multiple FPGAs. The final results of each FPGA resource utilization after executing back-end compilations may be reported to the user in a form of the text report or an additional UI screen.

In some embodiments, the performance of the partitioned code and operation of the interconnect may be verified and monitored by instrumenting logic of configurable performance counters and accessing these counters during actual execution of the application or parallel and serial kernels. The counters may increment for example on active memory bus cycles, active cells, idle cells, system cells, synchronization events or bus cycles, etc. This performance monitoring information about executing application or kernels together with other crucial hardware parameters such as monitoring interconnect bit error level or monitoring of power supplies may be reported to a remote application across Internet via a Web Server. The performance monitor may sample analog and digital data or counters at the configurable time intervals. Additionally, standard OpenCL profiling API and facilities may be utilized.

In some embodiments, lower level generated logic partitioning and incremental synthesis techniques may be applied to significantly reduce the time of backend compilation. Additionally, choosing the same type of FPGA for every member or nearly every member of the array and applying logical to physical mapping of the segmented kernels may further alleviate complexity of software code partitioning by mapping fixed physical connections of the array of FPGA devices into multiple different virtual topologies. An interconnect (e.g., the interconnect 111 described herein) may implement adaptive routing lookup tables (e.g., tables 560 described herein) that may provide physical to virtual topology mapping. In some embodiments, an ASIC capable of configuring interconnect port connections (e.g. a crossbar ASIC or a commercial third party switching device) may be deployed to aid in physical to virtual topology mapping especially for larger scale deployments of the array of FPGA devices.

In some embodiments, the partitioning module 2117 may execute automatically or offer options to the user to attempt specific code optimization techniques by presenting a sequence of UI screens and expected results based on a particular optimization technique. For example, a tiling pass may be offered to the user or automatically executed. The resulting output IR file with tiling optimization may be inspected by partitioner module and results may be conveyed to the user as measurable improvement or degradation in performance, throughput, latency, etc. relative to the original code. In some embodiments, Additional techniques and passes of open source polyhedral model optimization tool or other open or closed source tools may be invoked.

However, an end goal of the partitioner module may not be just finer polyhedral optimizations of the parallel code for individual FPGAs, but a combination of several factors at the application level or a system level. These factors may include efficient and localized memory accesses, optimum co-location of the input data, intermediate and final results for every FPGA or nearly every FPGA in the array, minimizing data movement across interconnect resulting in minimum latency and subsequently faster execution by the optimum number of FPGAs with optimum virtual or physical topologies. This global resource optimization offered by the partitioning module may present significant value to the cloud computing providers that may utilize FPGA hardware and software with maximum efficiency while billing maximum number of clients at fixed hourly rates.

In some embodiments, these additional optimization steps in combination with scalable interconnect may be the only way to satisfy processing specification by the minimum number of FPGAs in the array. A unique and potentially unavailable before solution to the processing specification required by particular product may be presented. For example, a real-time image processing system that fits into a restricted by size and weight physical enclosure, such as space satellite camera, may become feasible due to effective code partitioning. Thus, significant direct (e.g. FPGA and hardware infrastructure) and indirect costs (e.g. expertise and development time of scalable FPGA computing solution) savings are expected to benefit the users of the partitioner module.

Figure 22:
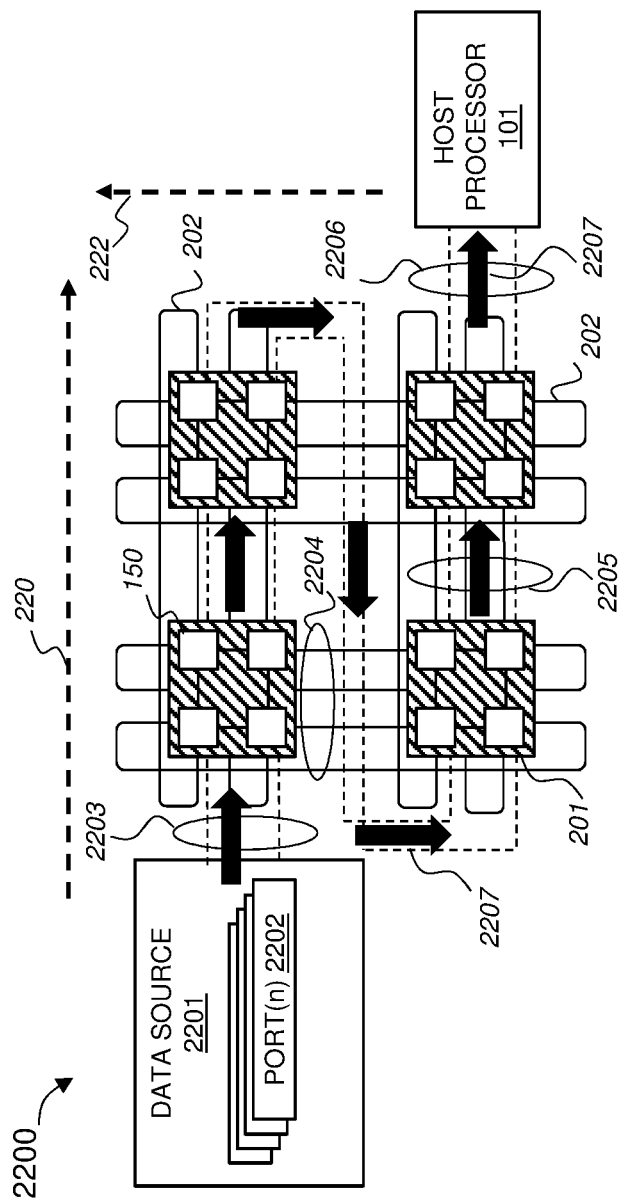
FIG. 22 is an example 16 FPGA nodes with two dimensional tori shared interconnect and 2 by 8 FPGAs dedicated data interconnect.

To illustrate system level decisions made by partitioning module FIG. 22 shows one of the possible physical topologies, 2D tori interconnect 202. Tori are popular topologies due to reduced number of hops among the nodes. In this example of 16 nodes the maximum number of hops is 2 in each torus and 3 hops across 2 tori dimensions.

In some embodiments, the requirement to process input raw data or data encapsulated by the required communication protocol from source 2201 that may have one or more ports 2202 may result in replicating, broadcasting, or multiplexing the input aggregate data stream into one, two or more FPGAs 150 at the inputs 2203. Such replication, broadcasting, or multiplexing may be performed in the direction of the Y axis 222. While in some embodiments, serial processing resulting in serial or complex kernels may involve several FPGAs to be connected in the direction of the predominant dataflow, shown by black thick arrows, or X axis 220. Additionally, the decision to connect multiple FPGAs may be made partially or exclusively due to the limited memory size or memory bandwidth available to individual FPGAs 150 as described above. In order to connect up to 8 FPGAs 150, a dedicated data interconnect, shown as dashed lines, may be configured by copper or fiber cables or external ASIC device. The results of parallel computations by 2×8 FPGAs array may be available to the host processor 101 via dedicated data interconnect or encapsulated into required communication protocol or via traditional computer bus such as PCIe bus.

Other system level criteria may include available bisection bandwidth of shared interconnect, shown as solid lines, bandwidth 2205 between two FPGAs 150 in direction 220 or similar shared interconnect bandwidth of two FPGAs 2204. These limitations may be due to 4 FPGAs 150 residing on a single physical card 201 which has limited number of physical connectors in X and Y directions. Another criteria may be physical bandwidth available for intermediate results via dedicated interconnect, shown as dashed lines, at 2205 and final results at 2207.

More detailed decision making by partitioning module can be illustrated by the following example. This example does not include fixed amount of FPGA resources required to implement interconnect itself and other fixed interfaces to the memory and to the host. Thus, in this example 100% of FPGA resource refers to the remaining free resources of the FPGA after implementing fixed interfaces and logic.

After analysis of the data dependencies and parallel optimizations a data independent kernel may require 10% of combinational logic, 5% of flip-flops, 30% of local memory and 10% percent of the DSP resources of the FPGA. Such kernel may be referred as minimally data independent kernel or a minimum kernel for short. This kernel may have a loop with two integer indexes i=0, 1 . . . 5 and j=0, 1 . . . 10 resulting in 5 by 10 iteration space.

Using OpenCL language user may create parallel execution of the kernels by increasing number of work items by an attribute _attribute_((num_simd_work_items(N))), where N represents a number that may take values 1, 2, 4, 8, or 16 or increasing number of compute units by applying attribute: _attribute_((num_compute_units(M))), where M is a positive integer. By iterating only work items the solution with 2 work items may underutilize FPGA resources, while solution with 4 work items may exceed local memory available in FPGA by 20% for local and private kernel variables. However, solution with 3 compute units may offer optimum utilization of the FPGA resources for this minimum kernel. For some applications without additional requirements partitioner module may choose 3 compute units as the final solution. However, if additional processing specification requirements are present then this straightforward solution may not be adequate and additional steps may have to be taken by the partitioner module.

If for example, there is an additional requirement to process 100 Gbps of real-time data stream (e.g. traffic of the 100 Gb network). If also each minimum kernel can process only 12.5 Gbps of the traffic, then at least 8 minimum kernels may be required to process real-time data at the rate of 100 Gbps. To satisfy this requirement at the application level minimum kernel solution may have to be expanded into 3 or more FPGAs. Such sub-optimum solution may have 2 FPGAs with 3 compute units and 1 FPGA with 2 compute units. However, partitioner module may adjust the indices ranges to i=0, 1 . . . 5 and j=0, 1 . . . 30 and modify kernels to run on 2 FPGAs each executing one half of the index range of j or one half of NDRange. First FPGA may execute j=0, 1 . . . 15 and second FPGA may execute j=16, 17 . . . 30. Implementing three compute units usually utilizes more memory for bus multiplexing and buffering than for a single kernel. Thus, implementing single kernel with ½ of the iteration space versus three compute units of a minimum kernel may result in reduced memory utilization enough to fit optimally the whole application into 2 FPGAs. Alternatively, partitioning module may attempt some of the polyhedral optimizations and tiling techniques with the aim of reducing utilization of the local memory. It is understood that the sub-ranging technique described herein can be applied to one, two or three dimensions of the OpenCL or even higher number of dimensions of a different parallel computing language.

If index sub-ranging and code optimization techniques described above do not yield optimum fit into 2 FPGAs, the partitioner module may attempt to analyze the memory access granularity even further with the aim of converting some of the small and shallow memories from block RAM into a combinational LUT memory or even into flip-flops. If only sub-optimum solution is still found the user may be prompted to split larger memory buffers into shallower buffers that may be potentially converted into memory of combinational LUTs or flip-flops. Possible changes to the coding style of the kernel that may achieve these goals may be suggested to the user. Newly changed source code may be iterated once more through partitioner module processing passes that may yield additional possibilities to improve the performance before delivering optimum final solution.

Figure 23:
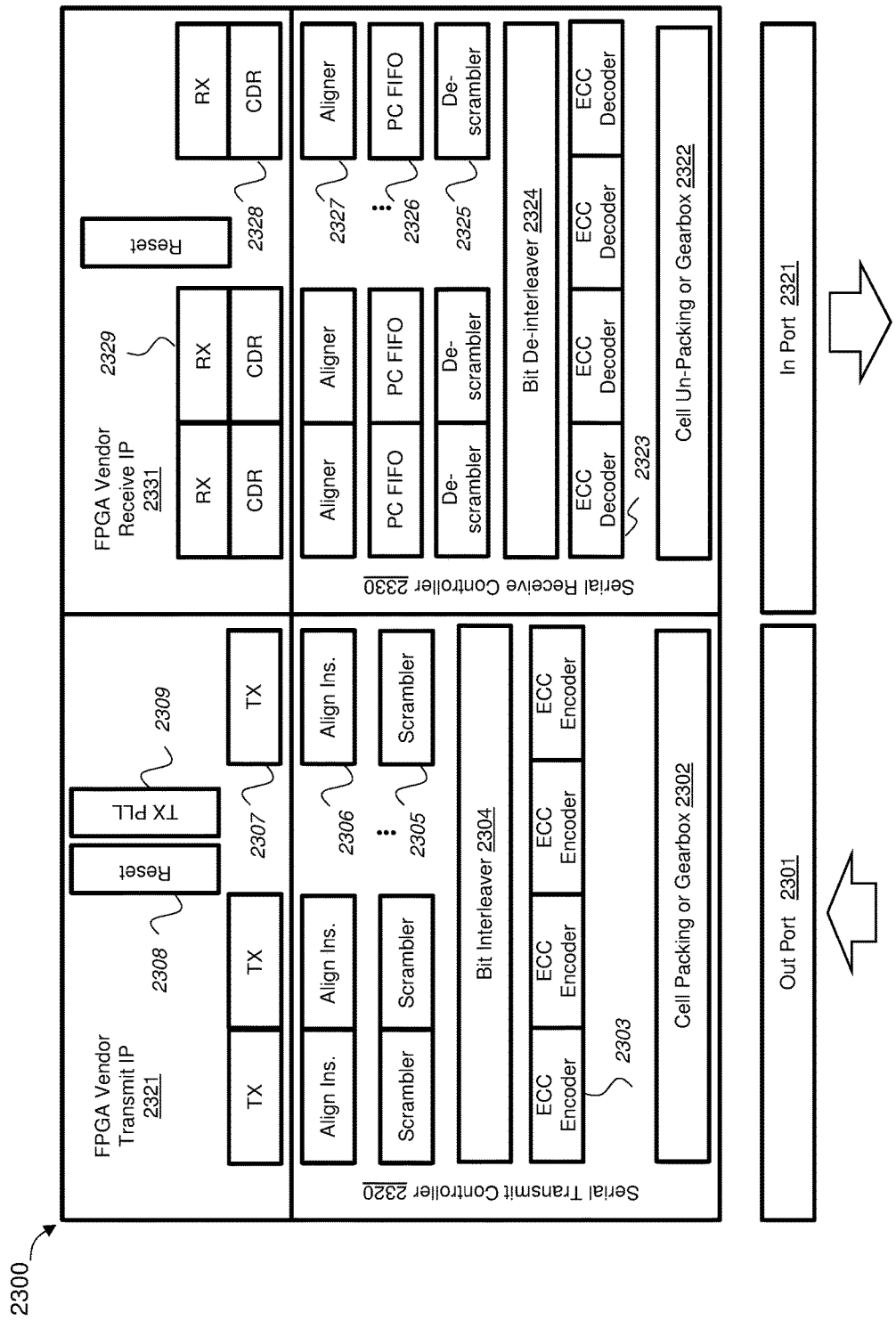
FIG. 23 is a block diagram of an example of the FPGA serial link interconnect with cell delineation, bit interleaving, synchronous scrambling and error correction.

FIG. 23 shows a block diagram of an array interconnect 2300. The array interconnect 2300 may be an example embodiment of the array interconnect 111 described elsewhere in this disclosure that that may include serial link 112 logic with specific features that make parallel computations by the array of FPGA devices error free or substantially error free. Because high-speed serial links of the FPGA device have finite Bit Error Rate (BER), an error correction may be required.

Serial link BER may be in the range from $10^{-12}$ to $10^{-6}$ depending on the insertion losses and interference in the transmission media and variations in voltage and temperature of the FPGA device. BER rates above $10^{-6}$ generally are considered as unreliable. For the case of BER $10^{-12}$ when the data bus size or cell width approximately $\sim 10^3$ bits, the interconnect error rate (IER) can be estimated as described in the following paragraphs.

The 16 FPGA cluster (e.g., shown in FIG. 22) may include 64 active ports and each port may have 4 serial lanes in each direction. Error rate per cell is may be calculated as:

$$10^{-12} \cdot 64 \cdot 4 \cdot 2 \cdot 10^3 = 5.12 \cdot 10^{-7}.$$

This is approximately 5 errors for every 10 million cells or ~640 megabytes of data transferred by interconnect in the cluster. When conditions of the transmission channel and links are less than ideal, e.g., $10^{-9}$ per serial link on average, the IER may grow up to 8 errors per every megabyte transferred by the interconnect of the 16 FPGA cluster. Moreover, the large scale deployment of larger clusters of hundreds of FPGA devices may suffer from even higher interference and higher level of errors proportional to the number of active interconnect serial links. Similar estimations can be applied to the data cells which may be larger than several thousand bits. Accordingly, clusters of FPGA devices that employ interconnect based on serial links may have high level of errors that may require powerful error correction in their system design.

There are two traditional approaches to the error correction. A Forward Error Correction (FEC) approach, which may require relatively large data blocks or frames to be effective. Thus, the FEC may incur latency of whole frame at every hop, which may not be desirable for interconnect designed for small size cells and single memory accesses.

Another traditional approach is generation of a cyclic redundancy check (CRC) at every transfer and subsequent retransmission of transfers due to detected errors. This approach has some drawbacks such as: a) inherent nondeterminism of the data access patterns during retransmission, b) significant bandwidth consumed by retransmissions at the high level of errors that may decrease overall throughput below one required by processing specification. c) increase in complexity of the logic and extra buffering for retransmission functionality. The complexity of the CRC may be substantial, especially if features such as non-interleaving of large write and read busts are required and entire burst may have to be invalidated and retransmitted from a large buffer. Non-interleaving of the write bursts is indeed the requirement of AXI-4 and Avalon busses utilized by OpenCL computing by FPGA devices.

The embodiment of FIG. 23 may include low latency, powerful error correction mechanism, which may be implemented as follows. At every bus cycle (or kernel clock cycle) the entire data bus may be encapsulated into a cell that is sent to an out port 2301. Each serial link may have a fixed serial to parallel bus ratio, e.g. 64:1. This ratio may be driven by existing serial protocols or due to specific phase locked loop (PLL) 2309 or clock and data recovery (CDR) 2328 implementations by the FPGA vendor serializer (SER) or transmit IP 2321 or de-serializer (DES) receive IP 2331. Circuitry of TX/RX SERDES, or sometimes called high-speed transceiver logic or native or direct Physical Medium Attachment (PMA), may be fixed by every FPGA vendor which may result in unavoidable interconnect latencies.

Although an exhaustive list of the serial link error sources may not exist for every possible embodiment, major sources of errors may still be considered. For electrical medium (e.g. copper cable) electrical noise, dc level imbalance, interference and errors in sampling of bit time or data and clock jitter are usually considered as major sources. For optical medium (e.g. fiber) optical attenuation and other effects due to signal propagation over fiber, and noise sources due to physics of the electrical-to-optical and back from optical-to-electrical conversions may be considered. Some of the errors may not be random and they may be traced to variations or transients of the power supply or a power supply feed through into analog high-speed circuitry and PLLs which may result in bursts of errors. In order to build robust FPGA computing system and serial link based interconnect a powerful error correction mechanism that is able to detect and correct random and non-random sources of error may have to be deployed.

In some embodiments, such error correction functionality may be implemented based on Bose, Chaudhuri, and Hocquenghem (BCH) codes. As discussed above just correcting random errors may not be adequate for the array of FPGA devices deployed in the large scale clusters. By interleaving parallel bus bits into several lanes of the interconnect port the error correcting power may be further increased in proportion to the number of parallel error decoders. For example, when 4 bits are interleaved into 4 lanes the burst of 4 errors can be detected and corrected by 4 error decoders operating in parallel while each decoder capable of correcting only one bit error on its own. In some embodiments, the number of parallel error correcting encoders and decoders can be increased or decreased regardless of the number of serial lanes.

According to Finite (Galois) Field theory, the BCH code for 63 bits of transmitted message has 57 bits of information and 6 bits of parity. This BCH code is sometimes called BCH (63,57,3), which may be able to detect and correct a single bit error in a 63-bit message. In systems in which more powerful BCH code is required, for example BCH code that is able to correct 2 or 3 bit errors in 63 bit message, the parity may increase to 12 or 18 bits leaving only 51 or 45 bits for information respectively. In some embodiments, FPGA serial link based interconnect the BCH coded message of different error correcting power, or message based on a different error correction technique may be combined with different number of links per each port in order to provide robust and error free operation of the array of the FPGA devices as a parallel computing system without drawbacks of conventional techniques.

A synchronous scrambler 2305 and de-scrambler 2325 may be implemented primarily to maintain electrical dc balance of each serial lane. Synchronous scramblers may be utilized by standard protocols, such as Interlaken, have advantage over self-synchronizing scramblers of not requiring additional time to synchronize. Interconnect 111 may utilize an idle cell that is transmitted in the absence of the other cells or between the other cells which carries a synchronous scrambler initial state. Thus, the interconnect 111 provides a solution for low latency messages, such as a cells encapsulating individual memory accesses, that combines powerful error correction, scrambling and cell delineation.

Existing protocols such as Ethernet, OTN, Interlaken, etc. involve additional layers of framing and extra protocol overhead, such as Media Access Control (MAC) address overhead, that may significantly increase latency of the memory and data transfers across interconnect. Overhead may include additional FPGA logic and other FPGA resources that otherwise may have been utilized for parallel computations and therefore may limit computing performance gains of scalable FPGA computing solution.

In some embodiments the idle cell may also carry the backpressure information in reverse direction from the receiving port to the transmitting port. This feedback backpressure information may be used to throttle back transmission of the cells across a particular pair of interconnect ports and to indicate local congestion. This congestion information may be utilized by the adaptive router to either wait one or more bus cycles or chose longer path instead of the congested shorter path.

In some embodiments, for example 64:1 FPGA SERDES parallel to serial ratio, the extra bit left after subtracting 63-bit BCH (63,57,3) coded message may be utilized to discriminate between idle cell and the other interconnect cells. In this particular embodiment, an economical way of delineating cells may be achieved. It may be understood however, that utilizing SERDES parallel to serial ratio different from 64:1 and utilizing binary BCH codes that originate in coded message size given by $2^n-1$, where n is an integer 0, 1 . . . n, data widths may leave additional bits of the parallel bus unused.

Furthermore, the cell bus sizes originate in the native bus (e.g. Avalon, AXI, APB, AHB, etc.) utilized by the particular variant of FPGA computing. Thus, some inefficiencies of bit mapping of native cell bus sizes into a group of serial lanes with fixed SERDES parallel to serial ratios may be present.

In some embodiments, at RX block 2329, the data transferred across each serial links may experience unique delays or as serial data arriving at the different phases. The receiver may contain phase compensating (PC) FIFO that aligns the data to the same clock phase of the kernel parallel bus. If these unique delays exceed one serial bit period, sometimes called unit interval (UI), then the parallel data may be shifted right or left by the integer number of bits that are equal to relative serial phase delay in units of UI.

This shift in data may be removed by aligning arriving data to the predetermined or agreed upon alignment pattern. A digital circuit called aligner 2327 may be implemented to shift the data. The velocity V of the electrical signal may be defined according to an expression:

$$C/(\mu_r \cdot e_r)^{1/2}.$$

In the expression, C represents the speed of light in vacuum ($3 \cdot 10^8$ m/s), $\mu_r$ represents the relative permeability (1.0 for non-magnetic medium), and $e_r$ represents the relative permittivity (~2.25 for solid polyethylene). The resulting propagation delay of 1 meter of the coaxial cable with polyethylene fill is t=1 m/V=$5 \cdot 10^{-9}$ seconds. In some embodiments interconnect may use groups or bundles of coaxial cables with slightly different lengths. Additional relative differences in delays may be due to slightly different printed circuit board routing between FPGA inputs and outputs and interconnect connectors. These basic delay calculation may estimate how much difference in PCB trace length plus cable length, for example, 5 bits at 12.5 Gbps (UI equal to $80 \cdot 10^{-12}$ seconds) may compensate. The 5 bits of alignment message can compensate for +/−2.5·UI=+/−200 ps. This range may be equivalent to the length variation of +/−4 cm. In some embodiments, the relative length difference compensated by 5 bits of alignment message may be adequate.

As described above, the information message for BCH (63,57,3) code is 57 bits, which leaves 64-57-1 bit of backpressure=5 bits. Because the alignment message is transmitted as raw binary, it may not benefit from the error correction. Thus, reducing a length of the alignment message further may create sensitivity to bit errors resulting in false alignment errors. The remaining 57 information bits may be allocated for synchronous scrambler initialization data. Since scrambling may be performed per lane each scrambler may have different initialization data in order to reduce the simultaneous switching noise.

Due to bit errors in received alignment pattern, a hysteresis may be employed. Hysteresis may involve repeating a search for alignment pattern one or more times before declaring correct alignment per each link. The port operating across several links may be declared as ready when some or all links are aligned. One of more errors in alignment pattern or the other idle cell bits may cause to declare misalignment of the individual link and require re-alignment of the failed link or re-initialization of the entire port. During alignment or re-alignment the feedback backpressure mechanism may prevent active data transmission across the failed direction of the port. In some embodiments, alignment mechanism may include specific reset sequence of the TX or RX FPGA SERDES IP and PC FIFOs as determined by the FPGA vendor.

The align insert block "Align Ins." 2306 may insert idle cell that may be comprised of the alignment pattern that has sufficient number of bits and/or idle cell indicator bit, backpressure bit, and per lane scrambler initialization data. The idle cell bit may be merged with alignment pattern to increase the length of the alignment pattern.

Because the idle cell bits or alignment pattern, idle delineation, backpressure bits may be sent and received on a per lane basis as unencoded raw binary and multiple lanes may be bundled together, the duplicate idle cell bits may be used for protection against bit errors such as triple or more levels majority vote. Similarly, data cell indicator bits may be protected by triple or more levels majority vote from bit errors. Alternatively, scrambler initial state may be protected by the BCH error correction and majority vote logic may protect the rest of the idle cell bits.

In some embodiments, the processing specification may include an implemented protocol. In these and other embodiments, the method 2000 may include receiving user input sufficient to modify the implemented protocol. In response to the user input, the method 2000 may include modifying the topology of the scalable array and re-partitioning the networking application source code among FPGA devices of an array formed according to the modified topology.

Figure 24:
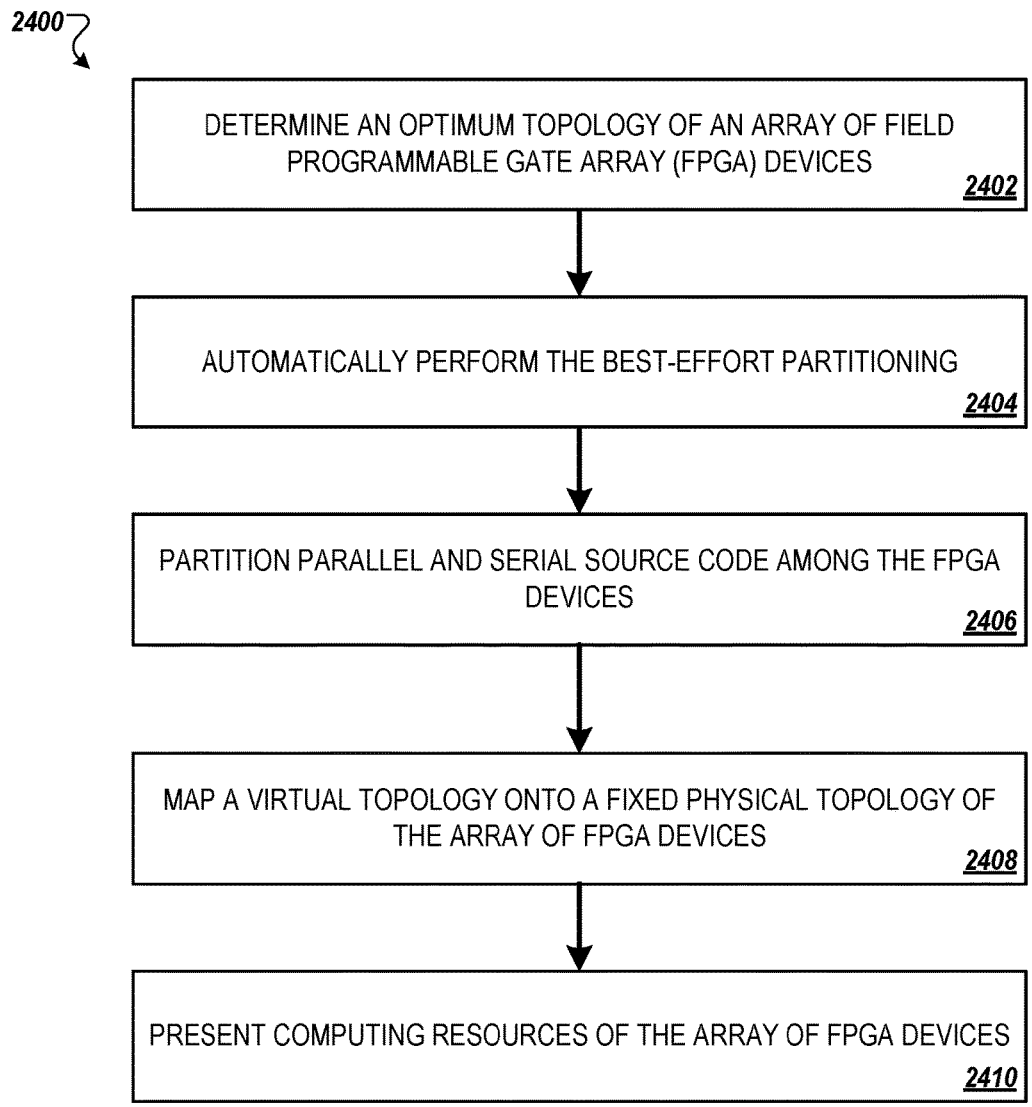
FIG. 24 is a flow chart of an example method of array source code partitioning and topology determination, all arranged in accordance with at least one embodiment described herein.

FIG. 24 is a flow chart of an example method 2400 of array source code partitioning and topology determination. The method 2400 may be at least partially programmably performed in some embodiments by the topology/partitioning module 322 described with reference to FIG. 3. In some embodiments, the topology/partitioning module 322 or the computing device 320 may include or may be communicatively coupled to a non-transitory computer-readable medium (e.g., the memory 326 of FIG. 3) having stored thereon programming code or instructions that are executable by a processor (such as the processor 328 of FIG. 3) to cause a computing device 320 and/or the topology/partitioning module 322 to perform at least a portion of the method 2400. Additionally or alternatively, the computing device 320 may include the processor 328 described above that is configured to execute computer instructions to cause the topology/partitioning module 322 or another computing device to perform the method 2400. Although illustrated as discrete blocks, various blocks may be divided into additional blocks, combined into fewer blocks, or eliminated, depending on the desired implementation. The method may begin at block 2402 in which an optimum topology of an array of FPGA devices is determined. The optimum topology may be based on a processing specification. At block 2404, a best-effort partitioning may be performed. For instance, the best-effort partitioning may be automatically performed on a default topology of the array of FPGA devices. At block 2406, parallel and serial source code may be partitioned among the FPGA devices mapped into optimum topology or the default topology. At block 2408, a virtual topology may be mapped onto a fixed physical topology of the array of FPGA devices. At block 2410, computing resources of the array of FPGA devices may be presented to a host or to an entire application as a larger FPGA or as software-defined computing resources.

The method 2400 may further include gathering control and data flow information. In some embodiments, the control and data flow information is gathered from an original source code of the application, an original host code, an original kernel code, or a combination thereof. The gathering the control and data flow information may read single source code or multiple source codes. Additionally, the generating modified source code may include operations such as performing direct or indirect code compilation and optimization by the LLVM or another modular compiler or optimizer tools or closed source tool or combination thereof, directly submitting partitioned IR or transformed IR or optimized IR or combination thereof to commercial FPFA compiler for lowering to the HDL FPGA code, extracting control and data flow from intermediate representation (IR) or equivalent codes such as text or binary files, extracting control flow information from schedule files or graphs and generating control flow and scheduling of the entire application, host code or parallel kernels or serial kernels for the array of the FPGA devices with host or without host computer, and generating synchronization kernels or another control mechanism for local or global dataflow of the array of the FPGA devices.

Additionally or alternatively, the method 2400 may include estimating required local, global or shared memory bandwidth, size, and addressing from IR code or equivalent code. In some embodiments, the estimating may include splitting parallel kernel iteration space until kernel memory bandwidth does not exceed available bandwidth for each FPGA of the array, in response to splitting iteration space and sub-dividing original memory buffers, co-locating resulting buffers at internal on-chip or external off-chip memory of the FPGA executing sub-range of the iteration space, in response to co-locating global memory buffers, modifying address ranges of the input buffers or intermediate results buffers, final result buffers, or a combination thereof of FPGA node transparently to the user, and in response to splitting parallel or serial kernels, creating shared virtual or physical memory buffers.

Additionally or alternatively, the method 2400 may include modifying sub-ranges of the iteration space, original source code loops, or a combination thereof. In some embodiments, the modifying includes estimating and maximizing utilization of the FPGA resources while complying with processing specification or performing the best effort on default topology of the array of FPGA devices, executing loop optimization passes followed by automatic or interactive inspection of original and optimized resulting IR or equivalent codes, making partitioning decisions based on the optimized IR whether to apply iteration space sub-ranges, modify loop indices, or a combination thereof for the source code indirectly or submitting optimized IR directly to FPGA back-end compilers, applying loop optimizations to original source code; and inspecting results of the final FPGA back-end compilation.

Additionally or alternatively, the method 2400 may include creating a database of the parameters of the processing specification and specific limitations and deriving the optimum partitioning solution. In some embodiments, the creating the database includes iterating over several virtual topologies supported by default physical topology and performing virtual to physical and logical to physical mapping of the interconnect ports and individual FPGA of the array, comparing iteratively or automatically or interactively under user control or combination thereof the transformed IR code and expected FPGA utilization to the baseline database or the best current solution and deriving decision on optimum partitioning solution on optimum topology, providing user options to override the automatic partitioning decision and choose one of the supported virtual or physical topologies, reporting results of the back-end FPGA compilation back to the partitioner and to the user UI and in case of a failure to implement one or more FPGAs or a failure to meet processing specification iterating additional partitioning solutions, confirming that partitioning of modified source code does meet processing specification or achieves expected best effort performance via remote performance monitoring; and isolating end user from specific parameters and limitations of the FPGA hardware and interconnect and making lower level partitioning decision such that the entire array of the FPGAs is presented to the user as a software defined computing or networking resource or FPGA-as-a-service.

Additionally or alternatively, the method 2400 may include presenting to the user charts and diagrams to quantify chosen partitioning decision or to confirm correctness of the processing specification or presenting final results of the FPGA back-end compilations or live performance monitoring results. In some embodiments, the presenting includes estimating expected performance gains from the original IR and transformed IR code for individual FPGA devices and entire array of the FPGA devices, comparing expected performance with actual results via performance monitoring and reporting the results back to user, reporting live performance monitoring results and operating parameters sampled at configurable time intervals via Web server over Internet.

In an example embodiment, a source-to-source code partitioning for the array of FPGA devices presents the computing resources of multiple FPGA devices to the user as one larger FPGA or a software definable computing resource. Partitioner is capable to choose one of the supported physical topologies and to map optimum virtual topology and logical to physical topology of the cluster of FPGA devices. Partitioner relies on distributed cell switching and scalable parallel and serial link interconnect. While utilizing minimum of FPGA resources interconnect provides fully configurable adaptive routing and powerful error correction for robust system operation. Cell sizes are optimized and for memory bus sizes and access patterns of the OpenCL and may be easily adjusted for the other parallel platforms. Interconnect includes shared data and memory ports and dedicated data ports tailored for dataflow computing without hindrances mentioned herein. The partitioner module performs compilations and optimizations of the source code and transforms source code for individual FPGAs to attain the optimum performance by the array of the FPGA devices. Lower interconnect latency and higher performance of parallel applications executed on scalable array of FPGA devices may enable software definable real-time parallel computing and fully software definable networking control and data planes.

The embodiments described herein may include the use of a special purpose or general-purpose computer including various computer hardware or software modules, as discussed in greater detail below.

Embodiments described herein may be implemented using computer-readable media for carrying or having computer-executable instructions or data structures stored thereon. Such computer-readable media may be any available media that may be accessed by a general purpose or special purpose computer. By way of example, and not limitation, such computer-readable media may comprise tangible computer-readable storage media including RAM, ROM, EEPROM, CD-ROM or other optical disk storage, magnetic disk storage or other magnetic storage devices, or any other storage medium which may be used to carry or store desired program code in the form of computer-executable instructions or data structures and which may be accessed by a general purpose or special purpose computer. Combinations of the above may also be included within the scope of computer-readable media.

Computer-executable instructions comprise, for example, instructions and data which cause a general purpose computer, special purpose computer, or special purpose processing device to perform a certain function or group of functions. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used herein, the term "module" or "component" may refer to software objects or routines that execute on the computing system. The different components, modules, engines, and services described herein may be implemented as objects or processes that execute on the computing system (e.g., as separate threads). While the system and methods described herein are preferably implemented in software, implementations in hardware or a combination of software and hardware are also possible and contemplated. In this description, a "computing entity" may be any computing system as previously defined herein, or any module or combination of modulates running on a computing system.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present inventions have been described in detail, it should be understood that the various changes, substitutions, and alterations may be made hereto without departing from the spirit and scope of the invention.

What is claimed is:

1. A method of array source code partitioning and topology determination for an array of field programmable gate array devices (FPGA devices), the method comprising:
   receiving one or more client-specified processing specifications related to a source code;
   determining whether the processing specifications are applicable to partitioning of the source code to the array of FPGA devices;
   responsive to the processing specifications being applicable:
      determining an optimum topology of the array of the FPGA devices based on the one or more processing specifications, wherein the optimum topology includes:
         one or more changes in physical connections among two or more of the FPGA devices, or
         one or more changes in an internal FPGA interconnect logic or interconnect port logic without changes to wiring of the FPGA devices; and
      mapping a virtual topology onto a fixed physical topology of the array of FPGA devices based on the optimum topology; and
      partitioning parallel portions of the source code and serial portions of the source code among the FPGA devices mapped onto the optimum topology; and
   responsive to the processing specifications being inapplicable:
      performing a best-effort partitioning on a default topology of the array of FPGA devices and mapping;
      mapping a virtual topology onto a fixed physical topology of the array of FPGA devices based on the default topology; and
      partitioning parallel portions of the source code and serial portions of the source code among the FPGA devices mapped onto the default topology; and
   presenting computing resources representative of the mapped virtual topology for deployment as an application, the deployment providing a cumulative performance gain that is proportional to a number of the FPGA devices in the array.

2. The method of claim 1, further comprising gathering control and data flow information, wherein the control and data flow information is gathered from an original source code of the application, an original host code, an original kernel code, or a combination thereof and the generating modified source code includes operations comprising:
   performing direct or indirect code compilation and optimization by a LLVM or another modular compiler or optimizer tools or closed source tool or combination thereof;
   directly submitting partitioned IR or transformed IR or optimized IR or combination thereof to commercial FPGA compiler for lowering to a HDL FPGA code;
   extracting control and data flow from intermediate representation (IR) or equivalent codes such as text or binary files;
   extracting control flow information from schedule files or graphs and generating control flow and scheduling of the entire application, host code, or parallel kernels or serial kernels for the array of the FPGA devices with host or without host computer;
   using index loop optimization schedule information as an input for a scheduling process, wherein the scheduling process defines a global schedule having a generation event and a wait list and modifies host and FPGA device code control and data flow; and
   generating synchronization kernels or another control mechanism for local or global dataflow of the array of the FPGA devices.

3. The method of claim 2, wherein the gathering control and data flow information includes reading single source code or multiple source codes.

4. The method of claim 1, further comprising estimating required local, global memory bandwidth, shared memory bandwidth, size, and addressing from IR code or equivalent code, wherein the estimating includes:
   splitting parallel kernel iteration space until kernel memory bandwidth does not exceed available bandwidth for each FPGA of the array;
   in response to splitting iteration space and sub-dividing original memory buffers, co-locating resulting buffers at internal on-chip or external off-chip memory of the FPGA executing sub-range of the iteration space;
   in response to co-locating global memory buffers, modifying address ranges of the input buffers or intermediate results buffers, final result buffers, or a combination thereof of FPGA node transparently to a user;
   in response to splitting parallel or serial kernels assigning uniform or non-uniform global address space to buffers; and
   in response to splitting parallel or serial kernels, creating shared virtual or physical memory buffers.

5. The method of claim 1, further comprising modifying sub-ranges of a iteration space, original source code loops, or a combination thereof, the modifying including:
   estimating and maximizing utilization of FPGA resources while complying with processing specification or performing the best effort on default topology of the array of FPGA devices;
   executing loop optimization passes followed by automatic or interactive inspection of original and optimized resulting IR or equivalent codes;
   making partitioning decisions whether to apply iteration space sub-ranges, modify loop indices, or a combination thereof for the source code indirectly or submitting optimized IR directly to FPGA back-end compilers, wherein the making the partitioning decisions is based on one or more or a combination of the optimized IR, the original source code, information contained in binary files, and information contained in text files;
   applying loop optimizations and schedule to the original source code; and
   inspecting results of a final FPGA back-end compilation.

6. The method of claim 5, wherein the modifying further includes:

applying loop optimization passes for the index space of individual tiles of a single FPGA device to gain local to this particular FPGA device processing gains;

applying loop optimization passes for the index space of the entire array of FPGA devices to obtain additional opportunities for reducing number of memory accesses, increase in data and buffer reuse, and to gain processing performance improvement for the entire array globally;

obtaining schedule information of the memory accesses and execution from optimization passes;

applying the schedule information to schedules; and presenting loop scheduling information to process as an input.

7. The method of claim 1, further comprising creating a database of parameters of the processing specification and specific limitations and deriving the optimum partitioning solution, wherein the creating the database includes:

iterating over several virtual topologies supported by default physical topology and performing virtual to physical and logical to physical mapping of interconnect ports and individual FPGA of the array;

comparing iteratively or automatically or interactively under user control or combination thereof transformed IR code and expected FPGA utilization to the baseline database or a best current solution and deriving decision on optimum partitioning solution on optimum topology;

providing user options to override an automatic partitioning decision and choose one of the supported virtual or physical topologies;

reporting results of a back-end FPGA compilation back to a partitioner and to the user UI and in case of a failure to implement one or more FPGAs or a failure to meet processing specification iterating additional partitioning solutions;

confirming that partitioning of modified source code does meet processing specification or achieve expected best effort performance via remote performance monitoring; and isolating end user from specific parameters and limitations of FPGA hardware and interconnect and making lower level partitioning decision such that an entire array of the FPGAs is presented to the user as a software defined computing or networking resource or FPGA-as-a-service.

8. The method of claim 1, further comprising presenting to the user charts and diagrams to quantify chosen partitioning decision or to confirm correctness of the processing specification or presenting final results of the FPGA back-end compilations or live performance monitoring results, wherein the presenting includes:

estimating expected performance gains from the original IR and transformed IR code for individual FPGA devices and entire array of the FPGA devices;

comparing expected performance with actual results via performance monitoring and reporting the results back to user; and reporting live performance monitoring results and operating parameters sampled at configurable time intervals via Web server over Internet.

9. The method of claim 1, wherein the one or more processing specifications include:

a number of packets per second arriving at a network node;

a number of frames per second arriving at the network node;

a number of packets leaving the network node;

a number of frames leaving the network node;

a number of concurrently active parallel data storage interfaces;

an instantaneous bit-rate of a storage data stream;

an aggregate amount of data per second at an input to the FPGA devices;

an aggregate amount of data per second at an output to the FPGA devices;

a derived answer speed;

a specification for a software application parallel iterations per second;

a specification for a software application serial iterations per second;

an answer rate per second;

a derived answer speed;

an input latency;

an output latency;

an input to output answer latency;

an input data rate;

a number of packets per second arriving at a network port;

a number of frames per second arriving at a network port;

an aggregate amount of data bits per second at an input to all ports on the FPGA devices;

an output data rate;

a number of packets leaving a network port;

a number of frames leaving a network port;

an aggregate amount of data per second at an output of all ports on the FPGA devices;

a number of concurrently active in parallel data storage;

a number of network interfaces for each of the FPGA devices;

an aggregate number of concurrently active in parallel data storage for the FPGA devices;

an aggregate number of network interfaces for the FPGA devices;

a number and the size of an input buffer from a host;

a number and the size of an output buffers to a host;

a number and a data bus width of streaming data interfaces between the FPGA devices;

a number and a data bus width of streaming data interfaces from a host;

a number and a data bus width of streaming data interfaces to a host;

a schedule of execution and memory accesses provided by the client; or a schedule of execution and memory accesses derived from the parallel portions and the serial portions of the source code.

10. The method of claim 1, wherein the determining the optimum topology includes virtualizing locations of two or more of the FPGA devices with respect to the optimum topology by:

reassigning an identifier of one or more of the FPGA devices; or reassigning an address window range of one or more of the FPGA devices according to the optimum topology.

11. The method of claim 1, wherein the optimum topology is based on a latency specification and includes co-locating at least two of the FPGA devices with a reassigned address identifier near one another.

12. The method of claim 1, wherein:

the processing specifications include at least one priority parameter including a input bandwidth, an output bandwidth, a speed up factor, a protocol, a hardware interface, or a parallel iteration per second;

the method further comprises performing a priority partitioning based on the at least one priority parameter, the priority partitioning includes:
  prioritizing the input bandwidth or to the output bandwidth when the input bandwidth or the output bandwidth exceeds an available input bandwidth of one or more of the FPGA devices;
  prioritizing the parallel iterations per second or a speed up factor; or
  prioritizing the protocol or a hardware interface to reduce FPGA resources available for the application; and
the mapping the virtual topology onto the fixed physical topology is also based on the priority partitioning.

* * * * *